(12) United States Patent
Mikasa

(10) Patent No.: US 8,716,774 B2
(45) Date of Patent: May 6, 2014

(54) SEMICONDUCTOR DEVICE HAVING A BURIED GATE TYPE MOS TRANSISTOR AND METHOD OF MANUFACTURING SAME

(76) Inventor: Noriaki Mikasa, Tokyo (JP)

(*) Notice: Subject to any disclaimer, the term of this patent is extended or adjusted under 35 U.S.C. 154(b) by 0 days.

(21) Appl. No.: 13/479,810

(22) Filed: May 24, 2012

(65) Prior Publication Data

US 2012/0299073 A1 Nov. 29, 2012

(30) Foreign Application Priority Data

May 27, 2011 (JP) ................................. 2011-119360

(51) Int. Cl.
- *H01L 27/108* (2006.01)
- *H01L 29/76* (2006.01)
- *H01L 29/94* (2006.01)
- *H01L 31/119* (2006.01)

(52) U.S. Cl.
USPC ................... 257/296; 257/331; 257/E27.017; 257/E29.262

(58) Field of Classification Search
USPC ................... 257/296, 331, E27.017, E29.262
See application file for complete search history.

(56) References Cited

U.S. PATENT DOCUMENTS

| | | | | |
|---|---|---|---|---|
| 5,371,024 A * | 12/1994 | Hieda et al. | ................... | 438/291 |
| 7,767,531 B2 * | 8/2010 | Shin et al. | ................... | 438/279 |
| 8,395,198 B2 * | 3/2013 | Uchiyama | ................... | 257/296 |
| 2001/0003367 A1 * | 6/2001 | Hshieh et al. | ................... | 257/330 |
| 2005/0167741 A1 * | 8/2005 | Divakaruni et al. | ........... | 257/328 |
| 2005/0173744 A1 * | 8/2005 | Kim et al. | ................... | 257/296 |
| 2005/0196947 A1 * | 9/2005 | Seo et al. | ................... | 438/589 |
| 2006/0049445 A1 * | 3/2006 | Lee et al. | ................... | 257/296 |
| 2007/0241380 A1 * | 10/2007 | Hasunuma | ................... | 257/296 |
| 2009/0114967 A1 * | 5/2009 | Lee et al. | ................... | 257/296 |
| 2011/0033994 A1 * | 2/2011 | Fujimoto et al. | ............. | 438/268 |
| 2011/0049599 A1 * | 3/2011 | Taketani | ................... | 257/302 |
| 2011/0057239 A1 * | 3/2011 | Arao | ................... | 257/296 |

FOREIGN PATENT DOCUMENTS

| | | |
|---|---|---|
| JP | 2006-339476 A | 12/2006 |
| JP | 2007-081095 A | 3/2007 |
| KR | 10-0691018 B1 | 3/2007 |
| KR | 10-2010-0134230 A | 12/2010 |

\* cited by examiner

*Primary Examiner* — David S Blum
(74) *Attorney, Agent, or Firm* — Sughrue Mion, PLLC

(57) ABSTRACT

A semiconductor device includes a semiconductor substrate having a first gate groove having first and second sides opposite to each other; a first diffusion region underneath the first gate groove; a second diffusion region in the semiconductor substrate, the second diffusion region covering an upper portion of the first side of the first gate groove; and a third diffusion region in the semiconductor substrate. The third diffusion region covers the second side of the first gate groove. The third diffusion region is coupled to the first diffusion region. The third diffusion region has a bottom which is deeper than a bottom of the first gate groove. The bottom of the third diffusion region is different in level from the bottom of the first diffusion region.

20 Claims, 41 Drawing Sheets

SEMICONDUCTOR DEVICE HAVING A BURIED GATE TYPE MOS TRANSISTOR AND METHOD OF MANUFACTURING SAME

BACKGROUND OF THE INVENTION

1. Field of the Invention

The present invention generally relates to a semiconductor device and a method of forming the same.

Priority is claimed on Japanese Patent Application No. 2011-119360, filed May 27, 2011, the content of which is incorporated herein by reference.

2. Description of the Related Art

In recent years, the nanoscaling of semiconductor devices such as DRAMs (dynamic random-access memories) is progressing. As a result, if the gate length of a transistor becomes short, there is caused the short-channel effect in the transistor becoming prominent, the sub-threshold current increasing, and the transistor threshold voltage (Vt) decreasing.

Increase in impurity concentration of the semiconductor substrate to suppress the decrease of the transistor threshold voltage (Vt) will increase the junction leakage current.

For this reason, nanoscaling DRAM memory cells in a DRAM as a semiconductor device will deteriorate refresh characteristics.

Japanese Patent Application Publications Nos. JPA 2006-339476 and JPA 2007-081095 disclose a so-called trench gate transistor (recessed-channel transistor), in which a gate electrode is buried in a trench formed in the front surface side of the semiconductor substrate.

By making the transistors trench gate transistors, it is possible to physically and sufficiently achieve an effective channel length (gate length), thereby enabling a DRAM having nanoscaled cells with a minimum process dimension of 60 nm or smaller.

In Japanese Patent Application Publication No. JPA 2007-081095, there is disclosed a DRAM having two trenches formed to be adjacent to one another in a semiconductor substrate, a gate electrode formed in each of the trenches with an intervening gate insulating film therebetween, a first impurity diffusion region common to the two gate electrodes formed on the surface of the semiconductor substrate and positioned between the two gate electrodes, and a second impurity diffusion region formed on the surface of the semiconductor substrate and positioned on the element separation region side of the two gate electrodes.

SUMMARY

In one embodiment, a semiconductor device may include, but is not limited to, a semiconductor substrate having a first gate groove having first and second sides opposite to each other; a first diffusion region underneath the first gate groove; a second diffusion region in the semiconductor substrate, the second diffusion region covering an upper portion of the first side of the first gate groove; and a third diffusion region in the semiconductor substrate. The third diffusion region covers the second side of the first gate groove. The third diffusion region is coupled to the first diffusion region. The third diffusion region has a bottom which is deeper than a bottom of the first gate groove. The bottom of the third diffusion region is different in level from the bottom of the first diffusion region.

In another embodiment, a semiconductor device may include, but is not limited to, a semiconductor substrate, first isolation regions, second isolation regions, first to fifth diffusion regions. The semiconductor substrate has first and second gate grooves. The first gate groove has first and second sides opposite to each other. The second gate groove has third and fourth sides opposite to each other. First isolation regions define an active region of the semiconductor substrate. Second isolation regions define a device formation region in the active region. The first diffusion region is disposed underneath the first gate groove. The second diffusion region is disposed underneath the second gate groove. The third diffusion region is disposed in the semiconductor substrate. The third diffusion region covers an upper portion of the first side of the first gate groove. The fourth diffusion region is disposed in the semiconductor substrate. The fourth diffusion region covers an upper portion of the first side of the second gate groove. The fifth diffusion region is disposed in the semiconductor substrate. The fifth diffusion region is disposed between the first and second gate grooves. The fifth diffusion region covers the second sides of the first and second gate grooves. The fifth diffusion region is coupled to the first and second diffusion regions. The fifth diffusion region has a bottom which is deeper than bottoms of the first and second gate grooves. The bottom of the fifth diffusion region is different in level from the bottoms of the first and second diffusion regions.

In still another embodiment, a semiconductor device may include, but is not limited to, a semiconductor substrate, a first diffusion region, a second diffusion region and a channel region. The semiconductor substrate has a first gate groove having first and second sides opposite to each other. The first diffusion region is disposed in the semiconductor substrate. The first diffusion region covers an upper portion of the first side of the first gate groove. The second diffusion region is disposed in the semiconductor substrate. The second diffusion region covers at least the second side and a bottom of the first gate groove. The channel region extends along the first side of the first gate groove and between the first and second diffusion regions.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
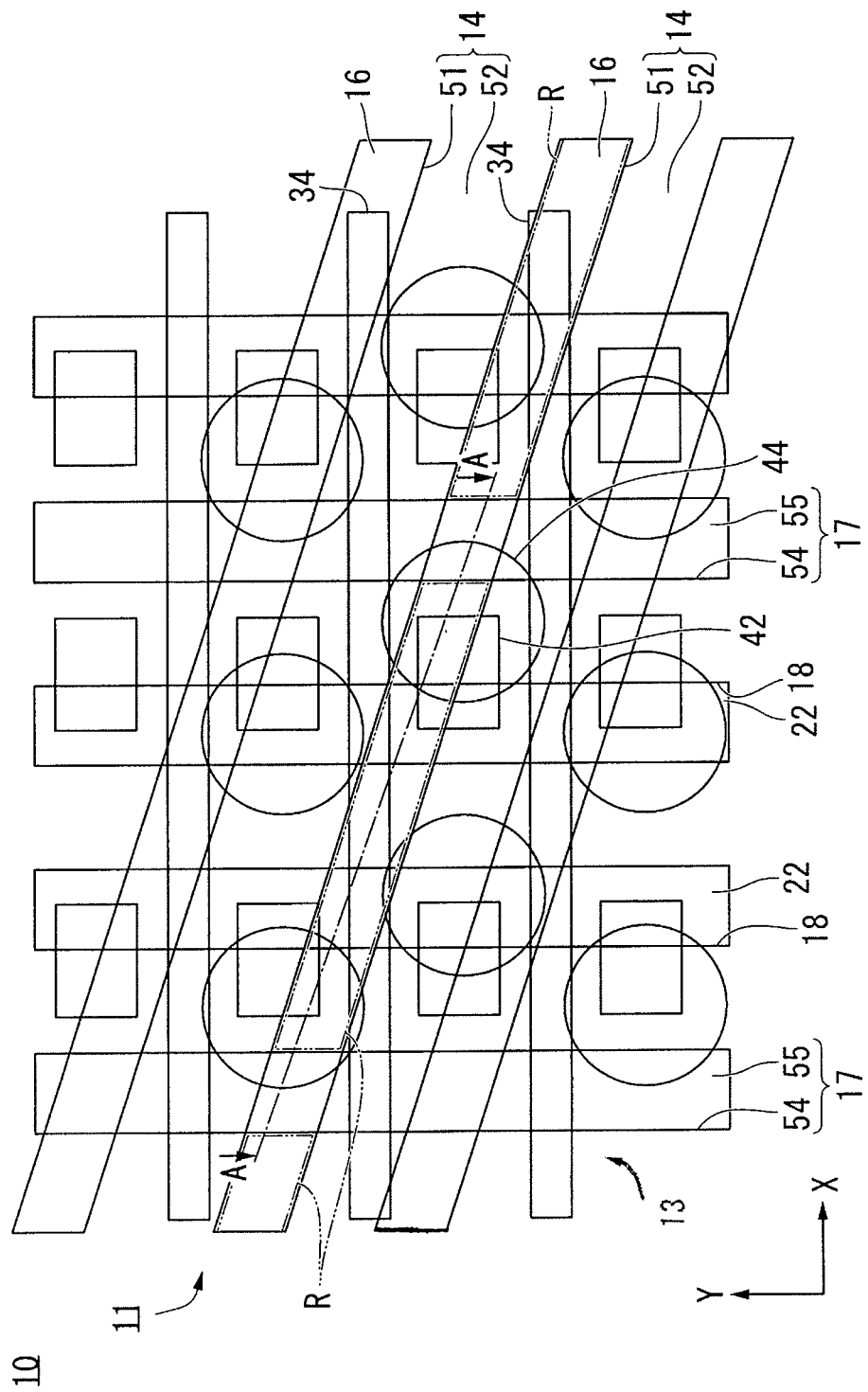
FIG. 1 is a fragmentary plan view of a memory cell array of a semiconductor device in accordance with one or more embodiments of the present invention.

Before describing the present embodiments, the related art will be explained in detail with reference to FIGS. 26 and 27, in order to facilitate the understanding of embodiments of the present invention.

In the DRAM having a trench gate transistor such as described in Japanese Patent Application Publications Nos.

JPA 2006-339476 and JPA 2007-081095, the channel region of the above-noted transistor is formed on three surfaces of the trench, these being both side surfaces and the bottom surface.

The inventor became aware that, as further progress is made in the nanoscaling of transistors having the above-noted constitution, it is not possible to achieve sufficient transistor on current, making normal DRAM operation difficult. This is caused, as noted above, by an increase in the channel resistance because of formation of the channel region of the transistor being formed on three surfaces of the trench.

If the trench gate placement pitch become narrow, when a given transistor is operated, the operating state thereof interferes with another, neighboring transistor, making it difficult to operate the transistor independently.

With regard to this technical matters as well, it is thought that the channel region being formed between neighboring trench gates has an adverse effect.

In a trench gate transistor, because the gate electrode is formed so as to protrude upward beyond the surface of the semiconductor substrate, the protruding gate electrode itself makes it very difficult to form the bit lines and capacitors to be formed in subsequent processes, so that the very manufacturing of the DRAM becomes difficult.

Accordingly, there is a desire for a semiconductor device and method for manufacturing the semiconductor device that, even in the case of a DRAM having transistors that use trenches, not only achieves sufficient transistor on current, but also avoids the operational interference between neighboring transistors and solves the issue of manufacturing difficulty.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate having a first gate groove having first and second sides opposite to each other; a first diffusion region underneath the first gate groove; a second diffusion region in the semiconductor substrate, the second diffusion region covering an upper portion of the first side of the first gate groove; and a third diffusion region in the semiconductor substrate. The third diffusion region covers the second side of the first gate groove. The third diffusion region is coupled to the first diffusion region. The third diffusion region has a bottom which is deeper than a bottom of the first gate groove.

The bottom of the third diffusion region is different in level from the bottom of the first diffusion region.

In some cases, the bottom of the first diffusion region is deeper than the bottom of the third diffusion region.

In some cases, the bottom of the first diffusion region is shallower than the bottom of the third diffusion region.

In some cases, the first diffusion region includes a first side diffusion portion which extends along a lower portion of the first side of the first groove. The first side diffusion portion is separate from the second diffusion region.

In some cases, the semiconductor device may further include, but is not limited to, a first gate insulator, a first gate electrode, and a first buried insulator. The first gate insulator covers inside surfaces of the first gate groove. The first gate electrode is disposed in a lower portion of the first gate groove and on the first gate insulator. The first buried insulator is buried in an upper portion of the first gate groove. The first buried insulator is positioned over the first gate groove.

In some cases, the semiconductor substrate has a second gate groove. The third diffusion region is disposed between the first and second gate grooves.

In some cases, the semiconductor device may further include, but is not limited to, a fourth diffusion region underneath the second gate groove; and a fifth diffusion region in the semiconductor substrate. The fifth diffusion region covers an upper portion of the first side of the second gate groove. The third diffusion region covers the second side of the second gate groove. The third diffusion region is coupled to the fourth diffusion region. The bottom of the third diffusion region is deeper than a bottom of the second gate groove. The bottom of the third diffusion region is different in level from a bottom of the fourth diffusion region.

In some cases, the bottom of the fourth diffusion region is deeper than the bottom of the third diffusion region.

In some cases, the bottom of the fourth diffusion region is shallower than the bottom of the third diffusion region.

In some cases, the fourth diffusion region includes a second side diffusion portion which extends along a lower portion of the first side of the second gate groove, the second side diffusion portion is separate from the fifth diffusion region.

In some cases, the semiconductor device may further include, but is not limited to, a second gate insulator covering inside surfaces of the second gate groove; a second gate electrode in a lower portion of the second gate groove and on the second gate insulator; and a second buried insulator in an upper portion of the second gate groove, the second buried insulator being positioned over the second gate groove.

In some cases, the semiconductor device may further include, but is not limited to, a first isolation region in the semiconductor substrate, the first isolation region defining an active region; and a second isolation region in the semiconductor substrate, the second isolation region defining a device formation region in the active region.

In some cases, bottoms of the first and third diffusion regions are shallower than bottoms of the first and second isolation regions.

In some cases, the first and second isolation regions may include, but is not limited to, an insulator buried in first and second isolation grooves in the semiconductor substrate.

In some cases, the first and second isolation regions may include, but is not limited to, an insulator buried in lower portions of first and second isolation grooves in the semiconductor substrate; an insulating layer covering inside surfaces of upper portions of the first and second isolation grooves; and a conductor on the insulating layer and being buried in upper portions of the first and second isolation grooves.

In some cases, the semiconductor device may further include, but is not limited to, a bit line coupled to the third diffusion region; a contact plug coupled to the second diffusion region; and a capacitor coupled to the contact plug.

In another embodiment, a semiconductor device may include, but is not limited to, a semiconductor substrate, first isolation regions, second isolation regions, first to fifth diffusion regions. The semiconductor substrate has first and second gate grooves. The first gate groove has first and second sides opposite to each other. The second gate groove has third and fourth sides opposite to each other. First isolation regions define an active region of the semiconductor substrate. Second isolation regions define a device formation region in the active region. The first diffusion region is disposed underneath the first gate groove. The second diffusion region is disposed underneath the second gate groove. The third diffusion region is disposed in the semiconductor substrate. The third diffusion region covers an upper portion of the first side of the first gate groove. The fourth diffusion region is disposed in the semiconductor substrate. The fourth diffusion region covers an upper portion of the first side of the second gate groove. The fifth diffusion region is disposed in the semiconductor substrate. The fifth diffusion region is disposed between the first and second gate grooves. The fifth diffusion region covers the second sides of the first and second gate grooves. The fifth diffusion region is coupled to the first and second diffusion regions. The fifth diffusion region has a bottom which is deeper than bottoms of the first and second gate grooves. The bottom of the fifth diffusion region is different in level from the bottoms of the first and second diffusion regions.

In still another embodiment, a semiconductor device may include, but is not limited to, a semiconductor substrate, a first diffusion region, a second diffusion region and a channel region. The semiconductor substrate has a first gate groove having first and second sides opposite to each other. The first diffusion region is disposed in the semiconductor substrate. The first diffusion region covers an upper portion of the first side of the first gate groove. The second diffusion region is disposed in the semiconductor substrate. The second diffusion region covers at least the second side and a bottom of the first gate groove. The channel region extends along the first side of the first gate groove and between the first and second diffusion regions.

In some cases, the second diffusion region includes a first side diffusion portion which extends along a lower portion of the first side of the first gate groove. The first side diffusion portion is separate from the second diffusion region.

In some cases, the semiconductor substrate has a second gate groove having third and fourth sides opposite to each other. The second diffusion region is disposed between the first and second gate grooves and the second diffusion region covering the second side and a bottom of the second gate groove.

According to a semiconductor device of the present embodiment, by having a first impurity diffusion region provided at the bottom part of a gate electrode trench, a second impurity diffusion region provided on the semiconductor substrate so as to cover the upper part of a gate insulating film disposed on a first side surface, and a third impurity diffusion region joined to the first impurity diffusion region and provided on the semiconductor substrate so as to cover at least the gate insulating film disposed on a second side surface, the channel region is formed only on the first side surface positioned between the first impurity diffusion region and the second impurity diffusion region, so that, compared with a conventional semiconductor device in which the channel region is formed on three surfaces, these being the bottom surface and opposing side surfaces of the gate electrode trench, it is possible to reduce the channel resistance. By doing this, it is possible to achieve sufficient transistor on current.

Also, by providing another gate electrode trench on the second side surface side of the gate electrode trench and disposing another transistor neighboring this gate electrode trench, no channel region is formed between the gate electrode trenches. By doing this, when the placement pitch of the gate electrode trenches becomes narrow, because there is no interference by the operating state of a transistor with the operating state of another transistor neighboring thereto, it is possible to operate each of the transistors independently.

By providing a gate electrode that is disposed so as to bury the lower part of a gate electrode trench, with an intervening gate insulating film therebetween, and a buried insulating film that is disposed so as to bury the gate electrode trench to cover the upper surface of the gate electrode, there is no protrusion of the gate electrode above the surface of the semiconductor substrate. By doing this, in the case in which the semiconductor device is, for example, a DRAM, because formation of bit lines and capacitors in subsequent process steps is facilitated, it is easy to manufacture the semiconductor device.

EMBODIMENTS

The inventor became newly aware that, as the nanoscaling of the memory cells in a DRAM progresses, as a result of the shrinking of the spacing between two neighboring cells provide in one active region, in the case in which one cell stores the data "0" and the other cell stores the data "1" and also in which repeated continuous access is made of the cell that stores the data "0", the data stored in the data "1" cell is destroyed by disturbance failure between neighboring cells (hereinafter simple "disturbance failure"). This disturbance failure can be the cause of a loss of reliability of the semiconductor device.

Figure 26:
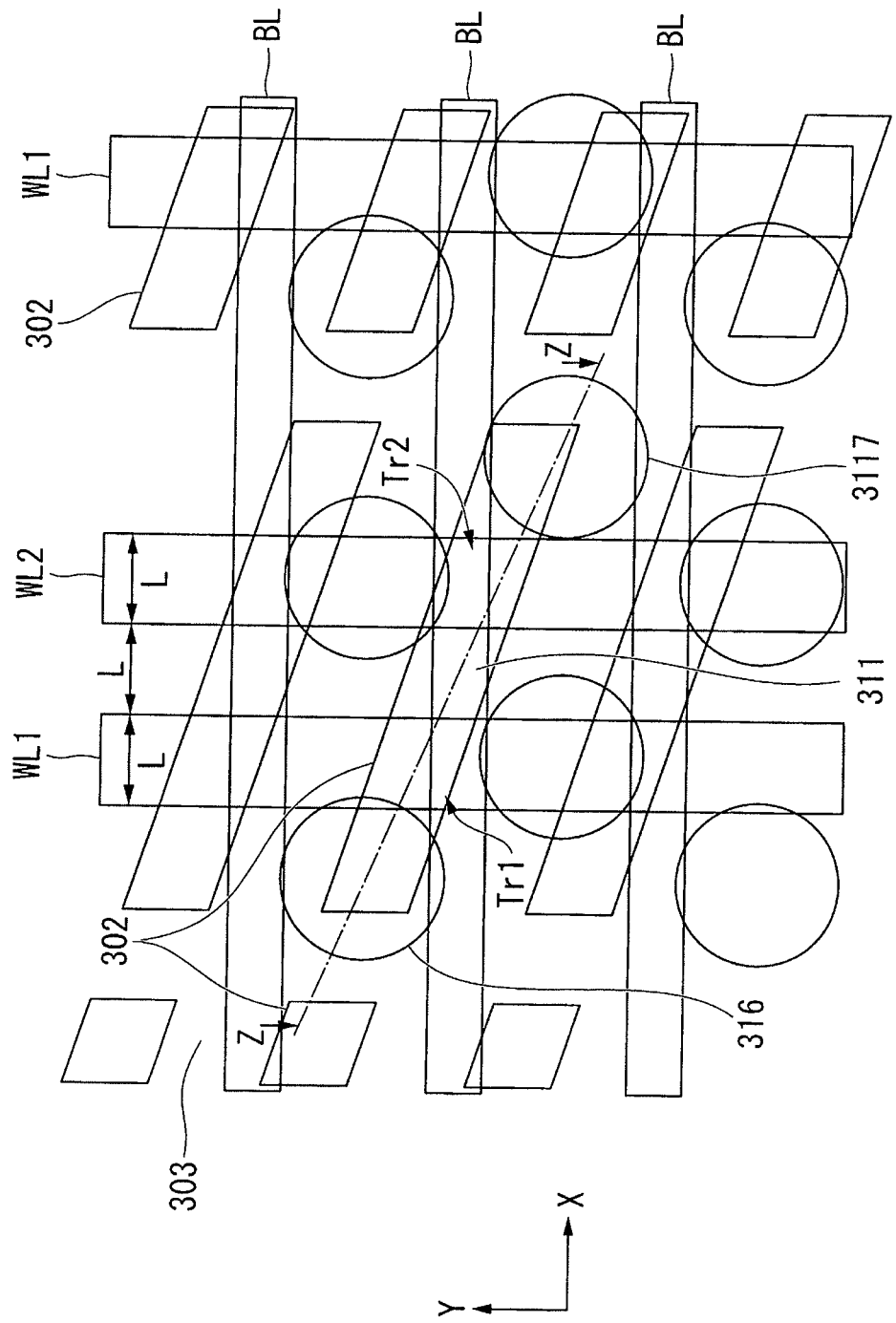
FIG. 26 is a fragmentary plan view of a memory cell array of a semiconductor device in accordance with the related art.
Figure 27:
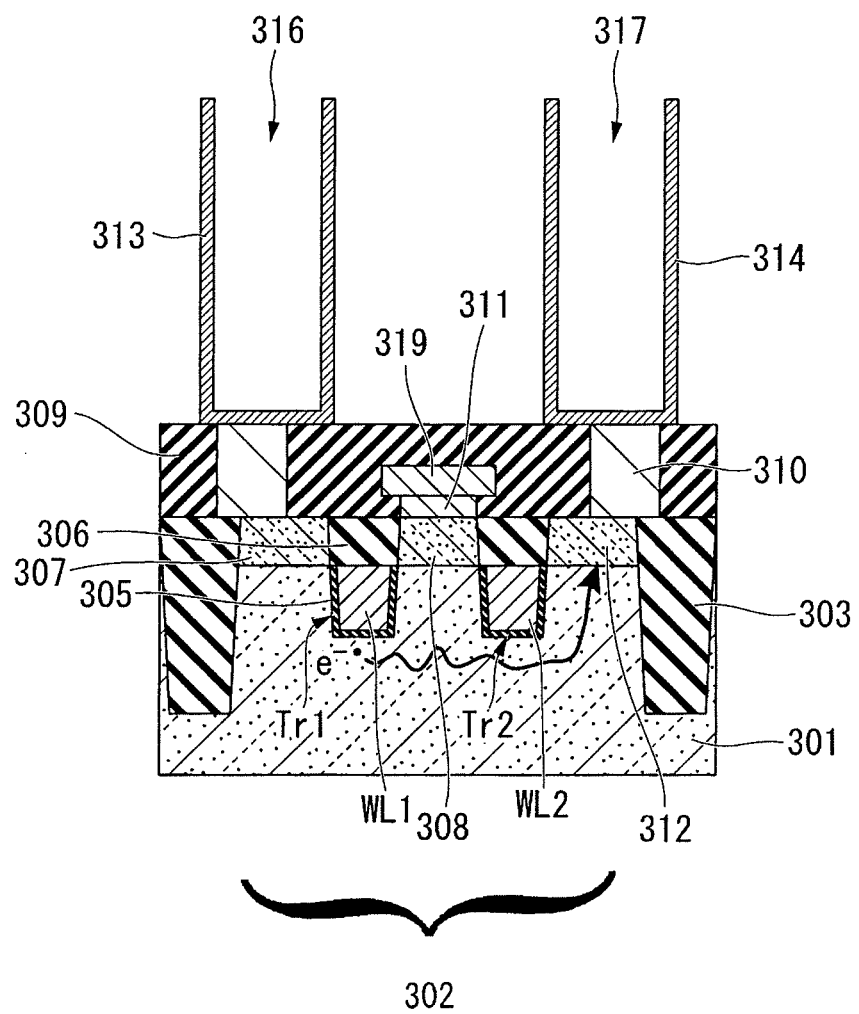
FIG. 27 is a fragmentary cross sectional elevation view, taken along a Z-Z line of FIG. 26, of the memory cell array of the semiconductor device in accordance with the related art.

FIG. 26 is a plan view showing an example of a conventional DRAM layout, and FIG. 27 is a cross-sectional view of the DRAM shown in FIG. 26 along the line Z-Z.

Referring to FIG. 26 and FIG. 27, the learning of the inventor regarding the above described disturbance failure will be described.

Referring to FIG. 26, a plurality of active regions 302 are a arranged in a regular manner on the surface of a semiconductor substrate 301. Each of the active regions 302 is surrounded by an element separation region 303 in which a trench formed in the surface of the semiconductor substrate 301 is buried with an insulating film. A plurality of word lines WL extending in the Y direction are disposed in the Y direction intersecting with the active regions 302.

Referring to FIG. 27, word lines WL1 and WL2 are formed by burying, via an intervening gate insulating film 305, in trenches that straddle a plurality of active regions 302 and element separation regions 303 in the surface of the semiconductor substrate 301.

A cap insulating film 306 is buried into the trenches at the upper surface of the word lines WL1 and WL2. The two word lines, WL1 and WL2, are provided so as to intersect with one active region 302.

The two word lines WL1 and WL2 constitute the gate electrodes of two corresponding transistors, Tr1 and Tr2. In addition to the gate electrode made of the word line WL1, the transistor Tr1 is constituted by a drain diffusion layer 307 and a source diffusion layer 308.

In addition to the gate electrode made of the word line WL2, the transistor Tr2 is constituted by a drain diffusion layer 312 and a source diffusion layer 308. The source diffusion layer 308 is common to the transistors Tr1 and Tr2, and is connected to the bit line BL at a bit line contact 311.

The drain diffusion layers 307 and 312 are each connected to the lower electrodes 313 and 314 (storage nodes) respectively, via an intervening contact plug 310 that is formed in an interlayer insulating film 309.

The lower electrodes 313 and 314 each form, together with an unshown capacitor insulating film and upper electrode, capacitive elements 316 and 317. The surfaces of the semiconductor substrate 301 that are opposite the bottom surface and the two opposing side surfaces of the trench that is buried with the word line are the channels of the transistors Tr1 and Tr2.

For example, with the word line WL1 in the on state forming the channel of the transistor Tr1, if a low-level potential is applied to a bit line 319, the lower electrode 313 changes to the low level, after which by placing the word line WL1 in the off state, low (data "0") information is stored at the lower electrode 313.

If, for example, with the word line WL2 in the on state forming the channel of the transistor Tr2, if a high-level potential is applied to the bit line 319, the lower electrode 314 changes to the high level, after which by placing the word line WL2 in the off state, high (data "1") information is stored at the lower electrode 314.

Based on these operational states, the condition is formed in which the lower electrode 313 stores low and the lower electrode 314 stores high. In this state, on and off of the word line WL1 corresponding to the low-side lower electrode 313 are repeated (corresponding to cell operations of another active region using the same word line WL1).

As a result, electrons e⁻ that are induced in the channel of the transistor Tr1 reach the neighboring drain diffusion layer 312, destroying the high information stored at the lower electrode 314, and changing the state thereof to low.

That is, a failure mode occurs in which a "1" data is changes to a "0" data. This failure is dependent of the number of on/off operations of the word line WL1 and, for example, when the on/off operation is repeated 10,000 times, one cell of the plurality of cells is destroyed, this occurring with a cell destruction frequency of 10 times with 100,000 operations.

Although neighboring cells should independently maintain their individual information, when a disturbance failure occurs, there is a problem of the operating state of one neighboring cell causing a change in the stored state in another cell, the normal operation of the semiconductor device (DRAM) is hindered and the reliability thereof is lost.

In the case of a large cell size, that is, when a spacing L between the word line WL1 and the word line WL2 that is governed by the minimum process dimension F is 70 nm as shown in FIG. 26, this disturbance failure did not present a problem.

However, with the shrinking of memory cells, when the spacing between the word line WL1 and the word line WL2 becomes smaller than 50 nm, this problem becomes prominent. When it becomes even smaller, it becomes an even greater problem.

Embodiments to which the present invention is applied will be described below, with references made to the drawings. The drawings used in the following descriptions are for the purpose of describing the constitution of the embodiments of the present invention, and the sizes, thicknesses, dimensions, and the like of various parts shown therein may be different that the dimensional relationships in an actual semiconductor device.

First Embodiment

Figure 2:
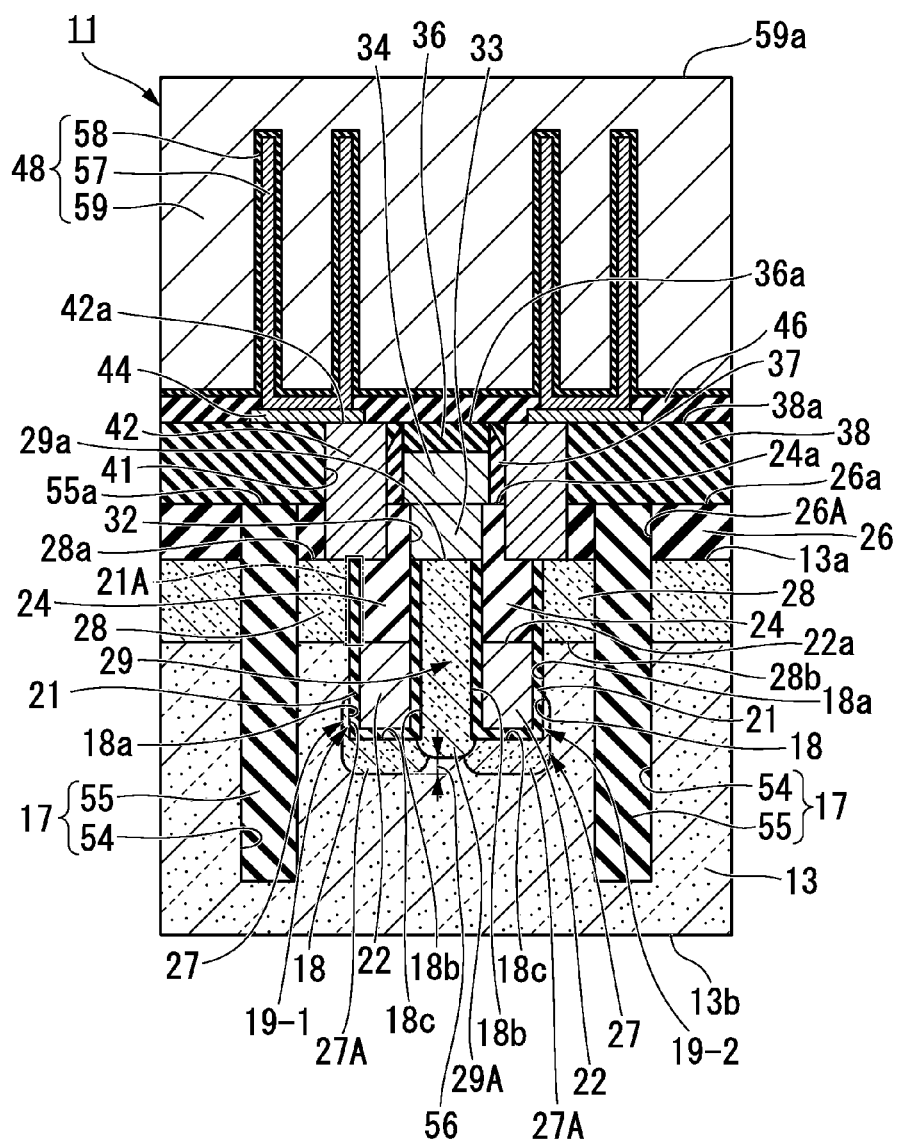
FIG. 2 is a fragmentary cross sectional elevation view, taken along an A-A line of FIG. 1, of the memory cell array of the semiconductor device in accordance with one or more embodiments of the present invention.

FIG. 1 is a simplified plan view of a memory cell array provided in a semiconductor device according to a first embodiment of the present invention, and FIG. 2 is a cross-sectional view of the memory cell array shown in FIG. 1 along the line A-A.

In FIG. 1 and FIG. 2, a DRAM is given as an example of a semiconductor device 10 according to the first embodiment. FIG. 1 shows an example of the layout of a memory cell array in a DRAM.

In FIG. 1, the X direction indicates the direction of extension of a bit line 34, and the Y direction indicates the direction of extension (first direction) of gate electrodes 22, a second element separation region 17, which are perpendicular with respect to the X direction.

In FIG. 1, as a convenience in this description, of the constituent elements of a memory cell array 11, only a semiconductor substrate 13, a first element separation region 14, an active region 16, the second element separation region 17, a gate electrode trench 18, a gate electrode 22, the bit line 34, a capacitor contact plug 42, a capacitor contact pad 44, and a plurality of element formation regions R are shown, with other constituent elements of the memory cell array 11 omitted from the drawing.

In FIG. 2, the bit line 34 that extends in the X direction actually shown in FIG. 1 is shown in schematic form, and in FIG. 2 constituent elements that are the same as those in the semiconductor device 10 shown in FIG. 1 are assigned the same reference symbols.

The semiconductor device 10 according to the first embodiment has a memory cell region in which the memory cell array 11 shown in FIG. 1 and FIG. 2 is formed and an unshown peripheral circuit region (region in which peripheral circuitry is formed) disposed in the periphery of the memory cell region.

Referring to FIG. 1 and FIG. 2, the memory cell array 11 provided in the semiconductor device 10 according to the first embodiment has the semiconductor substrate 13, the first element separation region 14, the active region 16 having a plurality of element formation regions R, the second element separation region 17, the gate electrode trench 18, first and second transistors 19-1 and 19-2, a gate insulating film 21, the gate electrode 22, which is a buried gate electrode, a buried insulating film 24, a mask insulating film 26, a first impurity diffusion region 27, a second impurity diffusion region 28, a third impurity diffusion region 29, an aperture part 32, a bit line contact plug 33, the bit line 34, a cap insulating film 36, a side wall film 37, an interlayer insulating film 38, a contact hole 41, the capacitor contact plug 42, the capacitor contact pad 44, a silicon nitride film 46, and a capacitor 48.

Referring to FIG. 1 and FIG. 2, the semiconductor substrate 13 is a sheet-shaped substrate. A p-type single-crystal silicon substrate can be used as the semiconductor substrate 13. In this case, the p-type impurity concentration of the semiconductor substrate 13 can be made, for example, $1 \times 10^{16}$ atoms/cm².

Referring to FIG. 1, the first element separation region 14 has a first element separation trench 51 and a first element separation insulating film 52. The first element separation trench 51 is formed on the semiconductor substrate 13 so as to extend in a direction (second direction) at a prescribed angle of inclination with respect to the X direction shown in FIG. 1. A plurality of first element separation trenches 51 are formed with a prescribed spacing in the Y direction shown in FIG. 1. The depth of the first element separation trench 51 can be made, for example, 250 nm.

The first element separation insulating film 52 is disposed so as to bury the first element separation trench 51. Although it is not illustrated, the upper surface of the first element separation insulating film 52 is made flush with respect to the surface 13a of the semiconductor substrate 13. A silicon oxide film ($SiO_2$ film), for example, can be used as the first element separation insulating film 52.

The first element separation region 14 having the above-noted constitution partitions the active regions 16 that extend in band shapes in the second direction. Each of the active regions 16 has a plurality of element formation regions R.

Referring to FIG. 1 and FIG. 2, the second element separation region 17 has a second element separation trench 54 and a second element separation insulating film 55. The second element separation trench 54 is formed on the semiconductor substrate 13 so as to extend in the Y direction (first direction) shown in FIG. 1. By doing this, the second element separation trench 54 cuts a part of the first element separation region 14.

The second element separation trench 54 is formed so as to sandwich two gate electrodes 22 disposed so as be neighboring to one another.

Each of the gate electrodes 22 constitutes a memory cell word line. That is, in the memory cell in the present embodiment one second element separation region 17 extending in the Y direction and two gate electrodes 22 (word lines) form a pair, these being repeatedly disposed in the X direction.

The depth of the second element separation trench 54 can be made, for example, 250 nm.

The second element separation insulating film 55 is disposed so as to bury the second element separation trench 54 and an aperture part 26A formed in the mask insulating film 26. The upper surface 55a of the second element separation insulating film 55 is made flush with respect to the upper surface 26a of the mask insulating film 26. A silicon oxide film ($SiO_2$ film), for example, can be used as the second element separation insulating film 55.

The second element separation region 17 having the above-noted constitution partitions a plurality of element formation regions R in the second direction.

In this manner, by providing in the first element separation trench 51 formed in the semiconductor substrate 13 the first element separation region 14 constituted so as to bury the first element separation insulating film 52, and providing in the second element separation trench 54 formed in the semiconductor substrate 13 the second element separation region 17 constituted so as to bury the second element separation insulating film 55 to partition the active region 16 into a plurality of element formation regions R, compared to the case in which a dummy gate electrode (not shown) to which a negative potential is applied is provided in the second element separation trench 54 with the intervening the gate insulating film 21 to partition a plurality of element formation regions R, because there is no adverse effect on the first and second transistors 19-1 and 19-2 by the potential of the dummy gate electrode, it is not only possible to easily turn on the first and second transistors 19-1 and 19-2, but also it is possible to improve the data holding characteristics of the memory cell array 11.

Referring to FIG. 1 and FIG. 2, two gate electrode trenches 18 are provided in the semiconductor substrate 13 to extend in the Y direction between two second element separation regions 17. The gate electrode trench 18 is partitioned by an inner surface constituted by a bottom surface 18c and opposing first and second side surfaces 18a and 18b. The two gate electrode trenches 18 are disposed so that the second side surfaces 18b thereof are in opposition to one another.

The gate electrode trench 18 is constituted so as to have a depth that is shallower than the depth of the first and second element separation trenches 51 and 54 (depth of the first and second element separation regions 14 and 17). In the case in which the depth of the first and second element separation trenches 51 and 54 is 250 nm, the depth of the gate electrode trench 18 can be made, for example, 150 nm.

Referring to FIG. 2, the first and second transistors 19-1 and 19-2 are trench gate transistors, which have the gate insulating film 21, the gate electrode 22, the buried insulating film 24, the first impurity diffusion region 27, the second impurity diffusion region 28, and the third impurity diffusion region 29.

As shown in FIG. 2, the first and second transistors 19-1 and 19-2 are disposed so as to be neighboring one another. The third impurity diffusion region 29 functions as an impurity diffusion region (a drain region in the case of the constitution shown in FIG. 2) that is common to the first and second transistors 19-1 and 19-2.

That is, the second side surface 18b of the gate electrode trench 18 of the first transistor 19-1 and the second side surface 18b of the gate electrode trench 18 of the second transistor 19-2 are constituted so as to be in opposition to one another, with the third impurity diffusion region 29 therebetween.

Figure 3:
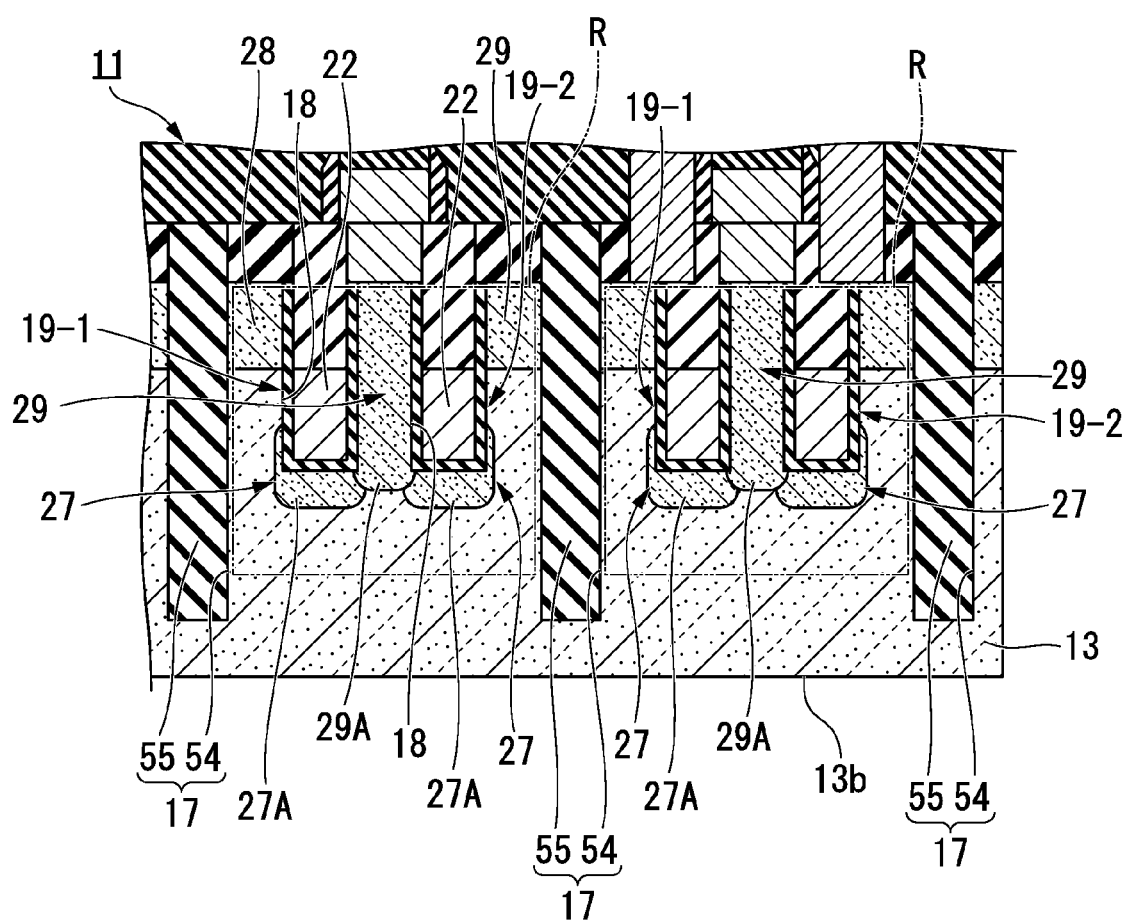
FIG. 3 is a fragmentary cross sectional elevation view, taken along an extension line from the A-A line of FIG. 1, of the memory cell array of the semiconductor device in accordance with one or more embodiments of the present invention.

FIG. 3 is a cross-sectional view of the memory cell array shown in FIG. 1 along the direction of the line A-A. In FIG. 3, only the part of the constituent elements of the memory cell array shown in FIG. 1 which is necessary for the description is shown. In FIG. 3 constituent elements that are the same as in the structure shown in FIG. 1 and FIG. 2 are assigned the same reference symbols.

Referring to FIG. 1 and FIG. 3, the plurality of element formation regions R are separated by the second element separation region 17 in the second direction.

By doing this, the first and second transistors 19-1 and 19-2 formed in an element formation region R are separated by the second element separation region 17 in the second direction from the first and second transistors 19-1 and 19-2 formed in another element formation region R disposed at a position neighboring to the above-noted element formation region R.

Referring to FIG. 2, the gate insulating film 21 is provided so as to cover the first and second side surfaces 18a and 18b of each gate electrode trench 18 and the bottom surface 18c of the gate electrode trench 18. A single-layer of a silicon oxide film ($SiO_2$ film), a nitride silicon oxide film (SiON film), a laminated silicon oxide film ($SiO_2$ film), or a laminated film of a silicon nitride film (SiN film) over a silicon oxide film ($SiO_2$ film) or the like can be used as the gate insulating film 21.

In the case in which a single-layer of silicon oxide film ($SiO_2$ film) is used as the gate insulating film 21, the thickness of the gate insulating film 21 can be made, for example, 6 nm.

Referring to FIG. 2, the gate electrode 22 is disposed so as to bury the lower part of the gate electrode trench 18, with the intervening gate insulating film 21 therebetween. By doing this, the upper surface 22a of the gate electrode 22 is disposed at a position that is lower than the surface 13a of the semiconductor substrate 13. The gate electrode 22 can be made to have a laminated structure of, for example, the successive lamination of a titanium nitride film and a tungsten film.

Referring to FIG. 2, the buried insulating film 24 is disposed so as to cover the upper surface 22a of the gate electrode 22 and so as to bury the gate electrode trench 18 in which the gate insulating film 21 is formed.

The upper part of the buried insulating film 24 protrudes beyond the surface 13a of the semiconductor substrate 13, and the upper surface 24a of this protruding part is made flush with respect to the upper surface 26a of the mask insulating film 26. A silicon oxide ($SiO_2$ film) can be used as the buried insulating film 24.

Referring to FIG. 2, the mask insulating film 26 is provided on the upper surface 28a of the second impurity diffusion region 28. The mask insulating film 26 has the aperture part 26A in the shape of a trench formed in the second element separation region 54. The mask insulating film 26 functions as an etching mask when forming the second element separation trench 54 in the semiconductor substrate 13 by anisotropic etching. A silicon nitride film is used as the mask insulating film 26, in which case the thickness of the mask insulating film 26 can be made, for example, 50 nm.

Referring to FIG. 2, the first impurity diffusion region 27 is provided in the bottom parts of each of the two gate electrode trenches 18.

The first impurity diffusion region 27 is a region that is formed by implanting an n-type impurity, which is of a conductivity type that is different from the semiconductor substrate 13 (p-type silicon substrate) into the bottom surface 18c of the two gate electrode trenches 18. The first impurity diffusion region 27 covers the gate insulating film 21 that is formed on the bottom surface 18c of the two gate electrode trenches 18.

The bottom parts 27A of the two first impurity diffusion regions 27 are joined to the bottom part 29 of the third impurity diffusion region 29. The bottom part 27A of the first impurity diffusion region 27 protrudes more from the bottom part 29A of the third impurity diffusion region 29 toward the rear surface 13b side of the semiconductor substrate 13.

By doing this, a step 56 is provided between the bottom part 27A of the first impurity diffusion region 27 and the bottom part 29A of the third impurity diffusion region 29. The amount of protrusion of the bottom part 27A of the first impurity diffusion region 27 referenced to the bottom part 29A of the third impurity diffusion region 29 can be made, for example, 30 nm.

Two first impurity diffusion regions 27 having the constitution as noted above, function, along with the third impurity diffusion region 29, as the source/drain region that is common to the first and second transistors 19-1 and 19-2 (specifically, in the case of the structure of the present embodiment shown FIG. 2, the drain region).

The first impurity diffusion region 27 is disposed at a position spaced away from the second impurity diffusion region 28 (specifically, in the case of FIG. 2, spaced downward) and not joined to the second impurity diffusion region 28.

The gate insulating film 21 that is provided on the first side surface 18a is exposed between the first impurity diffusion region 27 and the second impurity diffusion region 28. Of the first side surface 18a, the part that is exposed from the first and second impurity diffusion regions 27 and 28 functions as the channel region of the first and second transistors 19-1 and 19-2.

Referring to FIG. 2, the second impurity diffusion region 28 is provided in the semiconductor substrate 13 at a position that is on the first side surface 18a side, so as to cover the upper part 21A of the gate insulating film 21 formed on the first side surface 18a of the gate electrode trench 18.

That is, the constitution is one in which the first side surface 18a of the gate electrode trench 18 of the first transistor 19-1 and the first side surface 18a of the gate electrode trench 18 of the second transistor 19-2 are in opposition to the side surface of the second element separation trench 54, with the semiconductor substrate 13 intervening therebetween.

Therefore, the second impurity diffusion region 28 is provided so as to include the upper surface 13a of the semiconductor substrate 13 sandwiched between the first side surface 18a and the second element separation trench 54, and also so as to cover the upper part 21A of the gate insulating film 21 formed on the first side surface 18a.

The bottom surface 28b of the second impurity diffusion region 28 is disposed at a position that is higher than the upper surface 22a of the gate electrode 22 that is buried inside the gate electrode trench 18 (position that is on the upper surface 13a side of the semiconductor substrate 13). It is desirable that the distance between a horizontal line that includes the bottom surface 28b of the second impurity diffusion region 28 and a horizontal line that includes the upper surface 22a of the buried gate electrode 22 be within 10 nm.

The second impurity diffusion region 28 is provided with respect to each of the gate electrodes 22 of the first and second transistors 19-1 and 19-2.

The second impurity diffusion region 28 is an impurity diffusion region that functions as a source/drain region (specifically, the source region in the case of the structure of the present embodiment shown in FIG. 2) of the first and second transistors 19-1 and 19-2. In the case of a p-type silicon substrate as the semiconductor substrate 13, the second impurity diffusion region 28 is formed by ion implanting an n-type impurity into the semiconductor substrate 13.

Referring to FIG. 2, the third impurity diffusion region 29 is provided over the entire part of the semiconductor substrate 13 disposed between the two gate electrode trenches 18. By doing this, the third impurity diffusion region 29 is disposed so as to cover the entire gate insulating film 21 provided on the second side surfaces 18b of the two gate electrode trenches 18. In the case of a p-type silicon substrate as the semiconductor substrate 13, the third impurity diffusion region 29 is formed by ion implanting an n-type impurity into the semiconductor substrate 13.

As described above, the third impurity diffusion region 29 is joined to the bottom part 27A of the first impurity diffusion region 27 and, together with the first impurity diffusion region 27, functions as a source/drain region that is common with respect to the first and second transistors 19-1 and 19-2 (specifically, in the case of the structure shown in FIG. 2, the drain region).

In this manner, by providing the first impurity diffusion regions 27 on the bottom parts of the two gate electrode trenches 18 disposed to be neighboring to one another, the second impurity diffusion regions 28 so as to cover the upper parts 21A of the gate insulating films 21 disposed on the first side surfaces 18a of the two gate electrode trenches 18, the third impurity diffusion region 29 so as to cover the entire gate insulating films 21 disposed on the second side surfaces 18b of the two gate electrode trenches 18 and so as to be joined to the first impurity diffusion regions 27, and the step 56 between the bottom part 27A of the first impurity diffusion region 27 and the bottom part 29A of the third impurity diffusion region 29, it is possible to form a channel region in only the part of the semiconductor substrate 13 making contact with the first side surface 18a that is positioned between the first impurity diffusion region 27 and the second impurity diffusion region 28.

Specifically, the channel region is not formed in the semiconductor substrate 13 that makes contact with the second side surface 18b (stated in different terms, the semiconductor substrate 13 positioned between the first and second transistors 19-1 and 19-2) and in the semiconductor substrate 13 that makes contact with the bottom part 18c.

That is, it is possible to make the constitution such that, of the three surfaces constituting the gate electrode trench 18, only two surfaces, the one side surface (the first side surface 18a) and the bottom surface (the bottom surface 18c) are made the channel region, the other one side surface (second side surface 18b) not being made the channel region.

That is, it is possible to make the channel region in which the on current flows when the first and second transistors 19-1 and 19-2 are in the on state smaller than in a conventional transistor. By doing this, even in a nanoscaled memory cell, it is possible to reduce the channel resistance and increase the on current.

Also, it is possible when one of the first and second transistors 19-1 and 19-2 operates to suppress an adverse effect that causes faulty operation of the other transistor.

Thus, even in the case in which the semiconductor device 10 is nanoscaled and the gate electrodes 22 are disposed with a narrow placement pitch, it is possible to cause independent stable operation of the first and second transistors 19-1 and 19-2.

Also, by having the first impurity diffusion region 27 provided in the bottom part of two gate electrode trenches 18 disposed so as to be neighboring to one another and the third impurity diffusion region 29 provided so as to cover the entire gate insulating film 21 disposed on the second side surface 18b of the two gate electrode trenches 18 and also so as to be joined to the first impurity diffusion region 27, when the condition is created in which low is stored in the lower electrode 57 that is electrically connected to the first transistor 19-1 and high is stored in the lower electrode 57 that is electrically connected to the second transistor 19-2, and in this condition if on/off of the gate electrode 22 (word line) corresponding to the first transistor 19-1 is repeated, because electrons e⁻ (not shown) that are induced in the channel of the first transistor 19-1 are trapped in the first and third impurity diffusion regions 27 and 29 which are constituted by an n-type impurity, it is possible to suppress the electrons e⁻ induced in the channel of the first transistor 19-1 from reaching the second impurity diffusion region 28 (drain region) of the second transistor 19-2.

By doing this, because electrons e⁻ induced in the channel of the first transistor 19-1 do not destroy the high information stored in the lower electrode 57 that is electrically connected to the second transistor 19-2 by changing it to the low state, it is possible to suppress the occurrence of a disturbance failure, in which the operating state of one neighboring cell changes the stored state in another cell.

Also, even in a DRAM having a spacing between two gate electrodes 22 disposed so as to be neighboring to one another that is 50 nm or smaller, it is possible to suppress the above-noted disturbance failure.

Referring to FIG. 2, the aperture part 32 is formed between buried insulating films 24 that protrude from the two gate electrode trenches 18. The aperture part 32 is formed so as to expose the upper surface 29a of the third impurity diffusion region 29.

Referring to FIG. 2, the bit line contact plug 33 is provided so as to bury the aperture part 32, and is constituted integrally with the bit line 34. The lower end of the bit line contact plug 33 makes contact with the upper surface 29a of the third impurity diffusion region 29. In the case in which the bit line 34 is constituted by a successively laminated film of a polysilicon film, a titanium nitride (TiN) film and a tungsten (W) film, the bit line contact plug 33 can be constituted of a polysilicon film.

Referring to FIG. 2, the bit line 34 is provided on the upper surface 24a of the buried insulating film 24, and is constituted integrally with the bit line contact plug 33. By doing this, the bit line 34 is electrically connected to the third impurity diffusion region 29 via the bit line contact plug 33.

The material used for the bit line 34 can be a laminated film of a successively laminated film of a polysilicon film, a titanium nitride film, and a tungsten film, or a titanium nitride film or the like.

Referring to FIG. 2, the cap insulating film 36 is provided so as to cover the upper surface of the bit line 34. The cap insulating film 36, in addition to protecting the upper surface of the bit line 34, functions as an etching mask when patterning the base material that becomes the bit line 34 by anisotropic etching (specifically, dry etching). A successively laminated film of a silicon nitride film (SiN film) and a silicon oxide film ($SiO_2$) can be used as the cap insulating film 36.

Referring to FIG. 2, the side wall film 37 is provided so as to cover the side surface of the bit line 34. The side wall film 37 has a function of protecting the side wall of the bit line 34. A successively laminated film of a silicon nitride film (SiN film) and a silicon oxide film ($SiO_2$ film) can be used as the side wall film 37.

Referring to FIG. 2, the interlayer insulating film 38 is provided on the upper surface 26a of the mask insulating film 26, and on the upper surface 55a of the second element separation insulating film 55. The upper surface 38a of the interlayer insulating film 38 is made flush with respect to the upper surface 36a of the cap insulating film 36. A silicon oxide film ($SiO_2$) film formed by CVD (chemical vapor deposition) or a insulating film (silicon oxide film ($SiO_2$)) formed by SOG (spin on glass) can be used as the interlayer insulating film 38.

Referring to FIG. 2, the contact hole 41 is formed in the buried insulating film 24, the mask insulating film 26, and the interlayer insulating film 38, so as to expose a part of the upper surface 28a of the second impurity diffusion region 28.

Referring to FIG. 2, the capacitor contact plug 42 is provided so as to bury the contact hole 41. The lower end of the capacitor contact plug 42 makes contact with a part of the upper surface 28a of the second impurity diffusion region 28.

By doing this, the capacitor contact plug 42 is electrically connected to the second impurity diffusion region 28. The upper surface 42a of the capacitor contact plug 42 is made flush with respect to the upper surface 38a of the interlayer insulating film 38. The capacitor contact plug 42 can be made as a laminated structure of, for example, successive laminations of a titanium nitride film and a tungsten nitride film.

Referring to FIG. 2, the capacitor contact pad 44 is provided on the upper surface 38 of the interlayer insulating film 38 so that a part thereof is connected to the upper surface 42a of the capacitor contact plug 42. The lower electrode 57 that constitutes the capacitor 48 is connected on the capacitor contact pad 44. By doing this, the capacitor contact pad 44 is electrically connected to the capacitor contact plug and the lower electrode 57.

Referring to FIG. 1, the capacitor contact pads 44 are circularly shaped and, in the Y direction, are arranged in zig-zag fashion with respect to the capacitor contact plugs 42. These capacitor contact pads 44 are disposed, in the X direction, between neighboring bit lines.

That is, the capacitor contact pads 44 are disposed, either so that the center part of a capacitor contact pad 44 is disposed above every other gate electrode 22 in the Y direction, or so that the center part of the capacitor contact pad 44 is disposed above the side surface of every other gate electrode 22 in the Y direction, with one of these positions being repeated in a zig-zag arrangement in the Y direction. Stated differently, the capacitor contact pads 44 are arranged in zig-zag fashion in the Y direction.

Referring to FIG. 2, the silicon nitride film 39 is provided on the upper surface 33a of the second interlayer insulating film 33, so as to surround the outer periphery of the capacitor contact pad 38.

One capacitor 48 has one lower electrode 57, a capacitor insulator film 58 that is common to a plurality of lower electrodes 57, and an upper electrode, which is an electrode common to a plurality of lower electrodes 57.

The lower electrode 57 is provided on the capacitor contact pad 44 and is connected to the capacitor contact pad 44. The lower electrode 57 is crown-shaped.

The capacitor insulating film 58 is provided so as to cover the surfaces of a plurality of lower electrodes 57 exposed from the silicon nitride film 46 and the upper surface of the silicon nitride film 46.

The upper electrode 59 is provided so as to cover the surface of the capacitor insulating film 58. The upper electrode 59 is disposed so as to bury the inside of the lower electrode 58 in which the capacitor insulating film 58 is formed and between the plurality of lower electrodes 57. The upper surface 59a of the upper electrode 59 is disposed so as to be higher than the upper ends of the plurality of lower electrodes 57.

The capacitor 48 constituted as noted above is electrically connected to the second impurity diffusion region 28 via the capacitor contact pad 44.

An interlayer insulating film (not shown) covering the upper surface 59a of the upper electrode 59, a contact plug (not shown) provided within the interlayer insulating film, and an interconnect connected to the contact plug may also be provided.

According to the semiconductor device of the first embodiment, by providing the first impurity diffusion regions 27 on the bottom parts of the two gate electrode trenches 18 disposed to be neighboring to one another, the second impurity diffusion regions 28 provided on the semiconductor substrate 13 so as to cover the upper parts 21A of the gate insulating films 21 disposed on the first side surfaces 18a of the two gate electrode trenches 18, the third impurity diffusion region 29 provided on the semiconductor substrate 13 so as to cover the entire gate insulating films 21 disposed on the second side surfaces 18b of the two gate electrode trenches 18 and also so as to be joined to the first impurity diffusion regions 27, with a step 56 being provided between the bottom part 27A of the first impurity diffusion region 27 and the bottom part 29A of the third impurity diffusion region 29, a channel region is formed in only a part of the first side surface 18a of the semiconductor substrate 13 making contact with the first side surface 18a that is positioned between the first impurity diffusion region 27 and the second impurity diffusion region 28.

For this reason, compared with the conventional semiconductor device in which the channel region is formed on three surfaces of the gate electrode trench (two opposing side surfaces and bottom surface), because it is possible to reduce the channel resistance, sufficient first and second transistors 19-1 and 19-2 on current can be achieved.

The two gate electrode trenches 18 are provided at both sides of the third impurity diffusion region 29, so as to sandwich the third impurity diffusion region 29, and also the third impurity diffusion region 29 is provided on the entire part reaching from the upper surface 13a of the semiconductor substrate 13 sandwiched by the second side surfaces 18b to the bottom surface 18c of the gate electrode trench 18, so that no channel region is formed between the two the gate electrode trenches 18.

By doing this, in the case in which the placement pitch of the gate electrode trench 18 is made narrow, when operating one of the first and second transistors 19-1 and 19-2, because the operating state thereof does not interfere with the other neighboring transistor, it is possible to operate the first and second transistors 19-1 and 19-2 independently.

Also, by having the first impurity diffusion region 27 provided in the bottom part of two gate electrode trenches 18 disposed so as to be neighboring to one another and the third impurity diffusion region 29 provided in the semiconductor substrate 13 so as to cover the entire gate insulating film 21 disposed on the second side surface 18b of the two gate electrode trenches 18 and so as to be joined to the first impurity diffusion region 27, when the condition is created in which low is stored in the lower electrode 57 that is electrically connected to the first transistor 19-1 and high is stored in the lower electrode 57 that is electrically connected to the second transistor 19-2, and in this condition if on/off of the gate electrode 22 (word line) corresponding to the first transistor 19-1 is repeated, because electrons e$^-$ (not shown) that are induced in the channel of the first transistor 19-1 are trapped in the first and third impurity diffusion regions 27 and 29 which are constituted by an n-type impurity, it is possible to suppress the electrons e$^-$ induced in the channel of the first transistor 19-1 from reaching the second impurity diffusion region 28 (drain region) of the second transistor 19-2.

By doing this, because electrons e$^-$ induced in the channel of the first transistor 19-1 do not change the high information stored in the lower electrode 57 that is electrically connected to the second transistor 19-2 by changing it to the low state, it is possible to suppress the occurrence of a disturbance failure, in which the operating state of one neighboring cell changes the stored state in another cell.

Also, even in a DRAM having a spacing between two gate electrodes 22 disposed so as to be neighboring to one another that is 50 nm or smaller, it is possible to suppress the occurrence of the above-noted disturbance failure.

By providing the gate electrode 22 that is disposed so as to bury the lower part of the gate electrode trench 18, with the intervening gate insulating film 21 therebetween, and the buried insulating film 24 that is disposed so as to bury the gate electrode trench 18 to cover the upper surface 22a of the gate electrode 22, there is no protrusion of the gate electrode 22 above the surface 13a of the semiconductor substrate 13.

By doing this, in the case in which the semiconductor device 10 is a DRAM as in the first embodiment, because formation of the bit line 34 and the capacitor 48 in process steps subsequent to the process step forming the gate electrode 22 is facilitated, the semiconductor device 10 can be easily manufactured.

Figure 4:
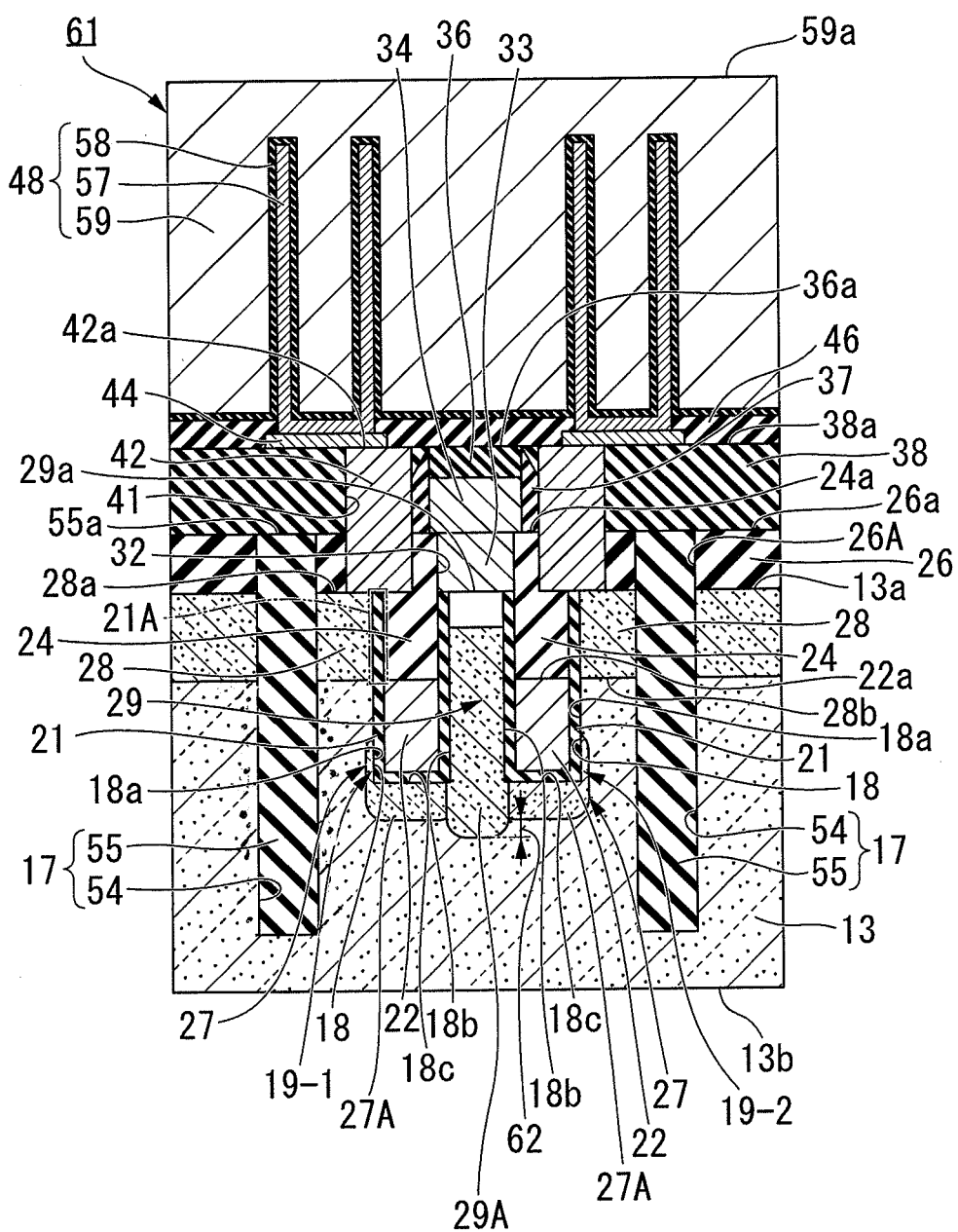
FIG. 4 is a fragmentary cross sectional elevation view, taken along the A-A line of FIG. 1, of a memory cell array of the semiconductor device in accordance with a modified embodiment to the embodiments of the present invention.

FIG. 4 is a cross-sectional view showing the general configuration of a memory cell array provided in the semiconductor device according to a variation example of the first embodiment of the present invention. The cutting surface shown in FIG. 4 corresponds to the cutting surface of the memory cell array shown in FIG. 2. For the same configuration parts as the structure shown in FIG. 2, the same reference numerals are assigned in FIG. 4. In FIG. 4, a DRAM is given as an example of a semiconductor device 60 according to a variation example of the first embodiment.

Referring to FIG. 4, a memory cell array 61 that is provided in the semiconductor device 60 that is a variation example of the first embodiment, with the exception of causing the bottom part 29A of the third impurity diffusion region 29 provided in memory cell array 11 of the already-described the semiconductor device 10 of the first embodiment to protrude further than the bottom part 27A of the first impurity diffusion region 27 toward the rear surface 13b of the semiconductor substrate 13, thereby providing a step 62 between the bottom part 27A of the first impurity diffusion region 27 and the bottom 29A of the third impurity diffusion region 29, is constituted the same as the memory cell array 11.

According to the semiconductor device 60 of the variation of the first embodiment having the above-noted constitution, by having the third impurity diffusion region 29 that is joined to the first impurity diffusion region 27 and that protrudes from the bottom part 27A of the first impurity diffusion region 27 toward the rear surface 13b side of the semiconductor substrate 13, when the condition is created in which low is stored in the lower electrode 57 that is electrically connected to the first transistor 19-1 and high is stored in the lower electrode 57 that is electrically connected to the second transistor 19-2, and in this condition if on/off of the gate electrode 22 (word line) corresponding to the first transistor 19-1 is repeated, it is possible to trap, in the bottom part 29A of the third impurity diffusion region 29, electrons e⁻ (not shown) that are induced in the channel of the first transistor 19-1 and that are not trapped in the first impurity diffusion regions 27.

That is, compared with the constitution of the semiconductor device 10 of the first embodiment, it is possible to improve the probability of trapping the induced electrons e⁻ (not shown) in the channel of the first transistor 19-1.

By doing this, because electrons e⁻ induced in the channel of the first transistor 19-1 do not destroy the high information stored in the lower electrode 57 that is electrically connected to the second transistor 19-2 by change it to the low state, it is possible to accurately suppress the occurrence of a disturbance failure, in which the operating state of one neighboring cell changes the stored state in another cell.

The semiconductor device 60 of the variation example of the first embodiment can achieve the same effect as the semiconductor device 10 of the first embodiment.

Specifically, because it is possible to make the channel region in which the on current flows when the first and second transistors 19-1 and 19-2 are in the on state smaller than in a conventional transistor, even in a nanoscaled memory cell, it is possible to reduce the channel resistance and increase the on current.

Also, because it is possible when one of the first and second transistors 19-1 and 19-2 operates to suppress an adverse effect that causes faulty operation of the other transistor, and even in the case in which the semiconductor device 60 is nanoscaled and the gate electrodes 22 are disposed with a narrow placement pitch, it is possible to cause independent stable operation of the first and second transistors 19-1 and 19-2.

FIG. 5A to FIG. 18 are drawings that show process steps for manufacturing the memory cell arrays provided within the semiconductor device according to the first embodiment of the present invention.

The method for manufacturing the semiconductor device 10 (specifically, memory cell array 11) according to the first embodiment will be described, referring to FIG. 5A to FIG. 18.

Figure 5A:
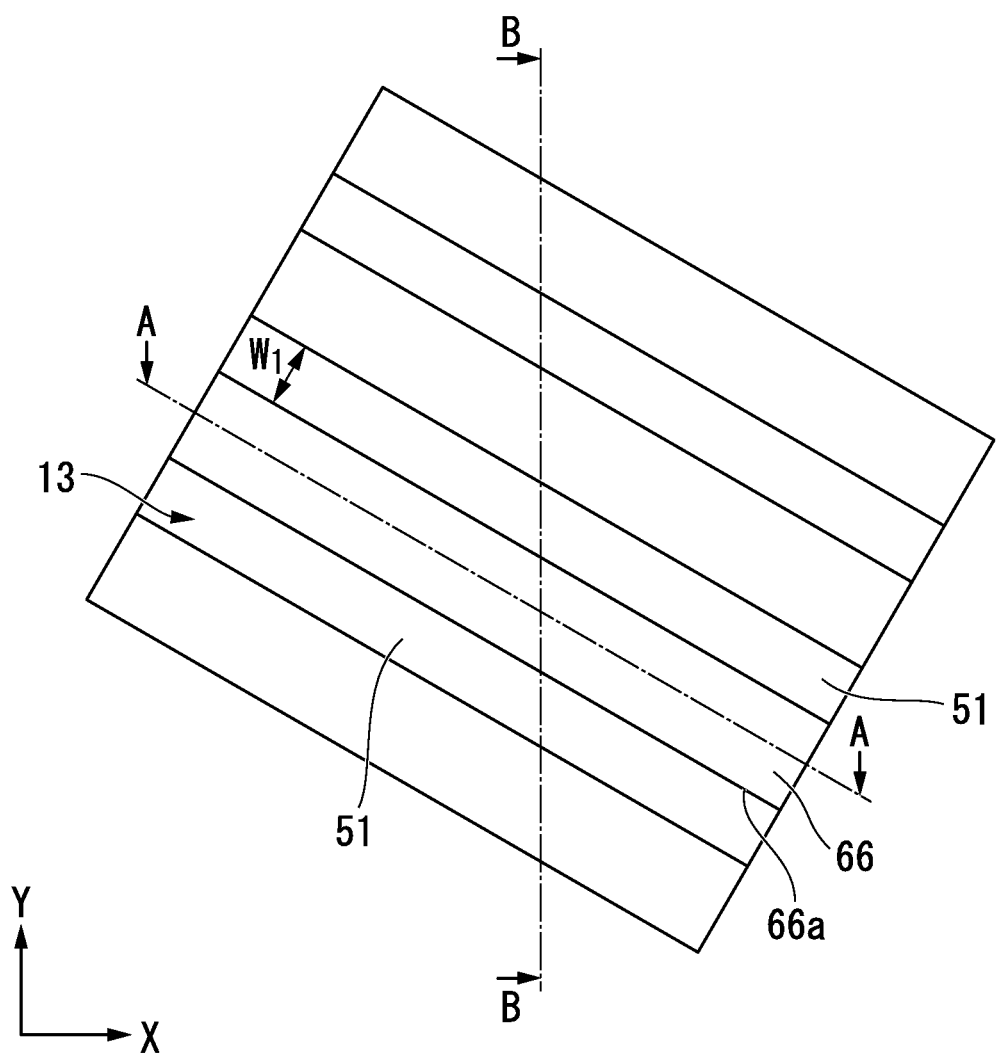
FIG. 5A is a fragmentary plan view of a step involved in a method of forming the semiconductor device of FIGS. 1, 2, and 3, in accordance with one or more embodiments of the present invention.
Figure 5B:
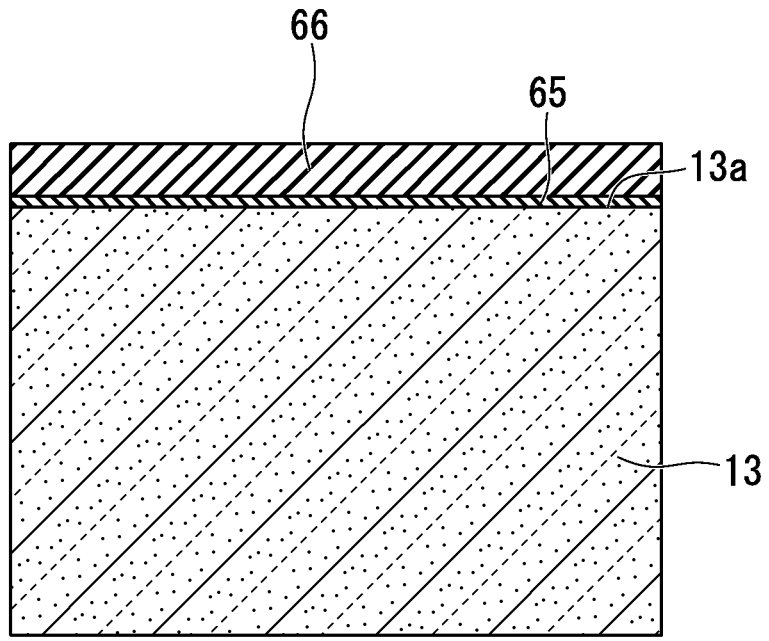
FIG. 5B is a fragmentary cross sectional elevation view of a step, taken along an A-A line of FIG. 5A, involved in the method of forming the semiconductor device of FIGS. 1, 2, and 3, in accordance with one or more embodiments of the present invention.
Figure 5C:
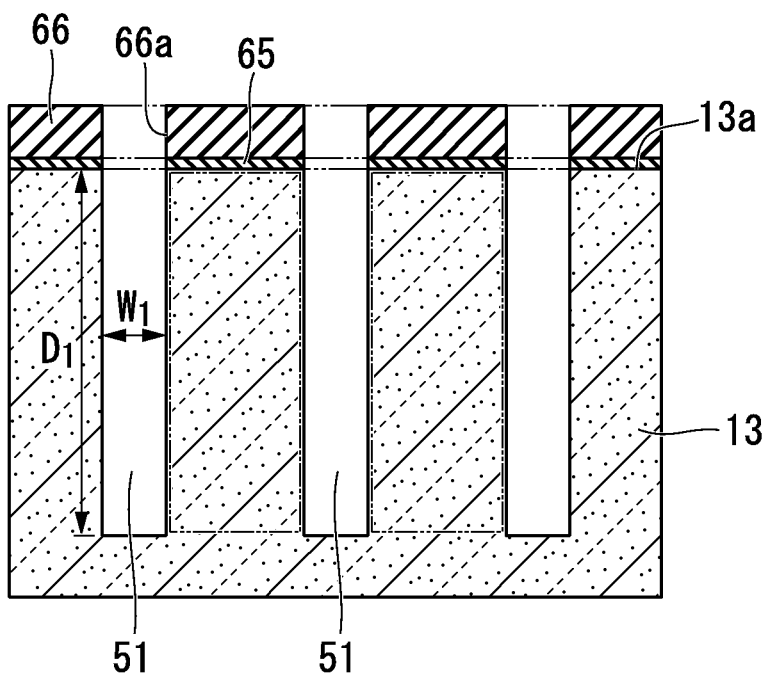
FIG. 5C is a fragmentary cross sectional elevation view of a step, taken along a B-B line of FIG. 5A, involved in the method of forming the semiconductor device of FIGS. 1, 2, and 3, in accordance with one or more embodiments of the present invention.

First, in the process step shown in FIG. 5A to FIG. 5C, a pad oxide film 65 is formed on the surface 13a of the semiconductor substrate 13. Next, a silicon nitride film 66 having a trench-shaped aperture part 66a is formed on the pad oxide film 65.

When this is done, a plurality of aperture parts 66a are formed that extend in band shapes in a direction (second direction) at a prescribed angle of inclination to the X direction as shown in FIG. 5A, with a prescribed spacing in the Y direction.

The aperture parts 66a are formed so as to expose the upper surface of the pad oxide film 65 corresponding to the formation region of the first element separation trench 51. The aperture parts 66a are formed by forming patterned photoresist (not shown) onto the silicon nitride film 66, and etching the silicon nitride film 66 by anisotropic etching using the photoresist as a mask. The photoresist is removed after forming the aperture parts 66a.

Next, anisotropic etching (specifically, dry etching) is done using the silicon nitride film 66 having the aperture parts 66a as a mask to etch the semiconductor substrate 13 and to form the first element separation trenches 51 extending in the second direction.

The width $W_1$ of the first element separation trench 51 can be made, for example, 43 nm. The depth $D_1$ of the first element separation trench 51 (depth referenced to the surface 13a of the semiconductor substrate 13) can be made, for example, 250 nm.

Figure 6A:
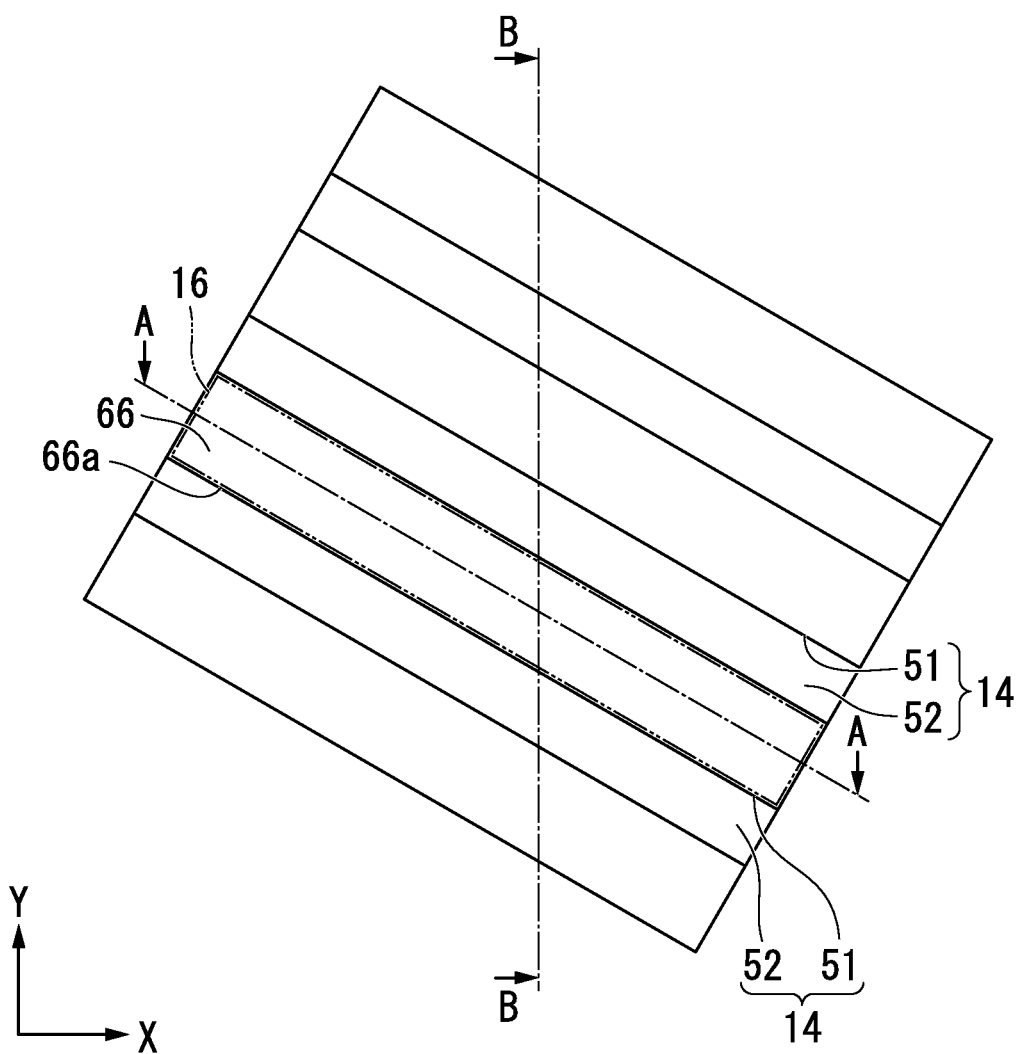
FIG. 6A is a fragmentary plan view of a step, subsequent to the step of FIGS. 5A, 5B, and 5C, involved in the method of forming the semiconductor device of FIGS. 1, 2, and 3, in accordance with one or more embodiments of the present invention.
Figure 6B:
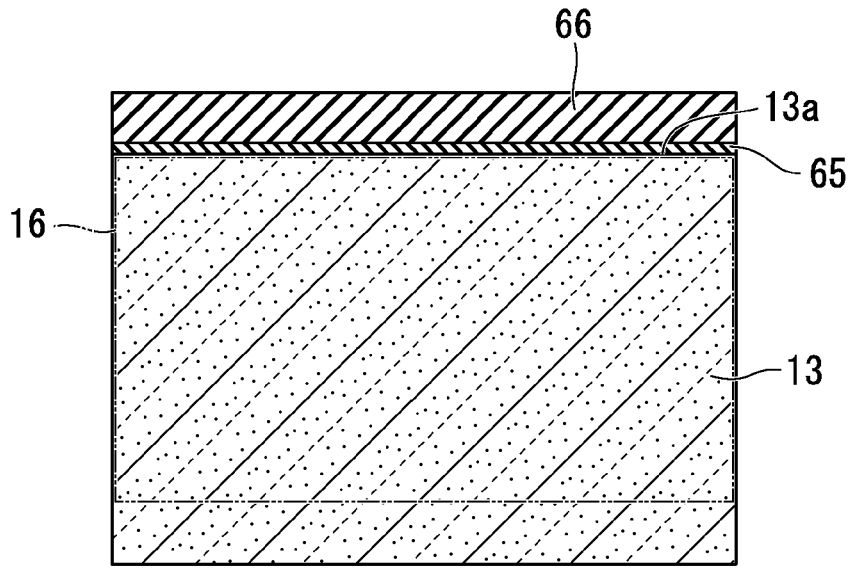
FIG. 6B is a fragmentary cross sectional elevation view of a step, subsequent to the step of FIGS. 5A, 5B, and 5C, taken along an A-A line of FIG. 6A, involved in the method of forming the semiconductor device of FIGS. 1, 2, and 3, in accordance with one or more embodiments of the present invention.
Figure 6C:
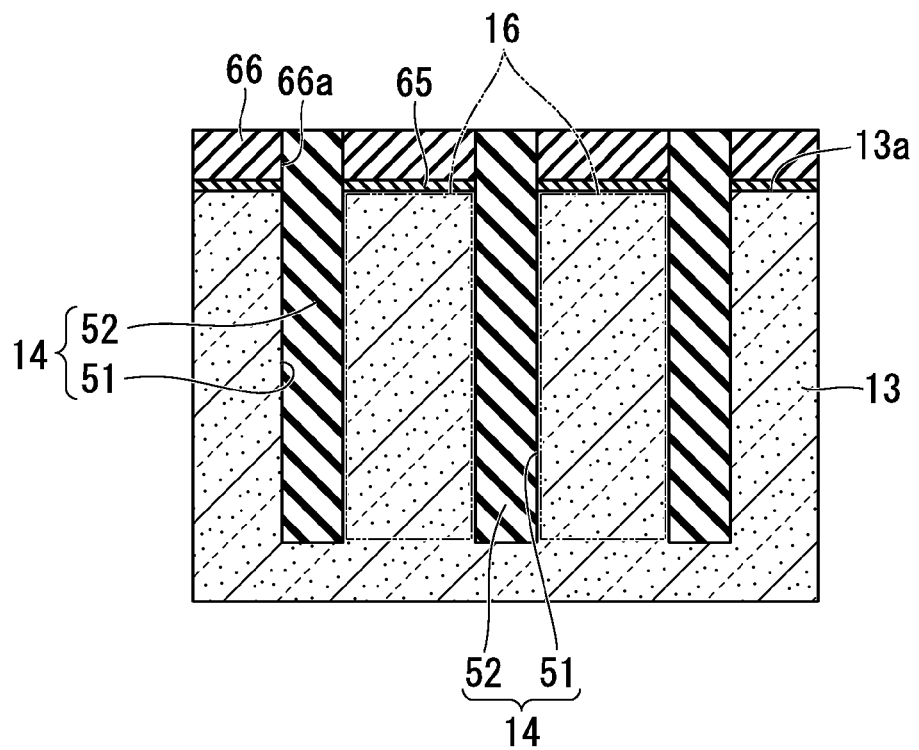
FIG. 6C is a fragmentary cross sectional elevation view of a step, subsequent to the step of FIGS. 5A, 5B, and 5C, taken along a B-B line of FIG. 6A, involved in the method of forming the semiconductor device of FIGS. 1, 2, and 3, in accordance with one or more embodiments of the present invention.

Next, in the process step shown in FIG. 6A to FIG. 6C, the first element separation insulating film 52 that buries the first element separation trench 51 is formed.

Specifically, the first element separation trench 51 is buried with a silicon oxide film ($SiO_2$ film) formed by HDP (high-density plasma) CVD or with a silicon oxide film ($SiO_2$ film) formed by coating using SOG (spin on grass) method.

After that, CMP (chemical mechanical polishing) is done to remove the silicon oxide film ($SiO_2$ film) deposited above the upper surface of the silicon nitride film 66, thereby forming the first element separation insulating film 52 made of a silicon oxide film ($SiO_2$ film) into the first element separation trench 51.

By doing this, the first element separation region 14 that is made of the first element separation trench 51 and the first element separation insulating film 52 and that partitions the band-shaped active region 16 extending in the second direction is formed.

Figure 7A:
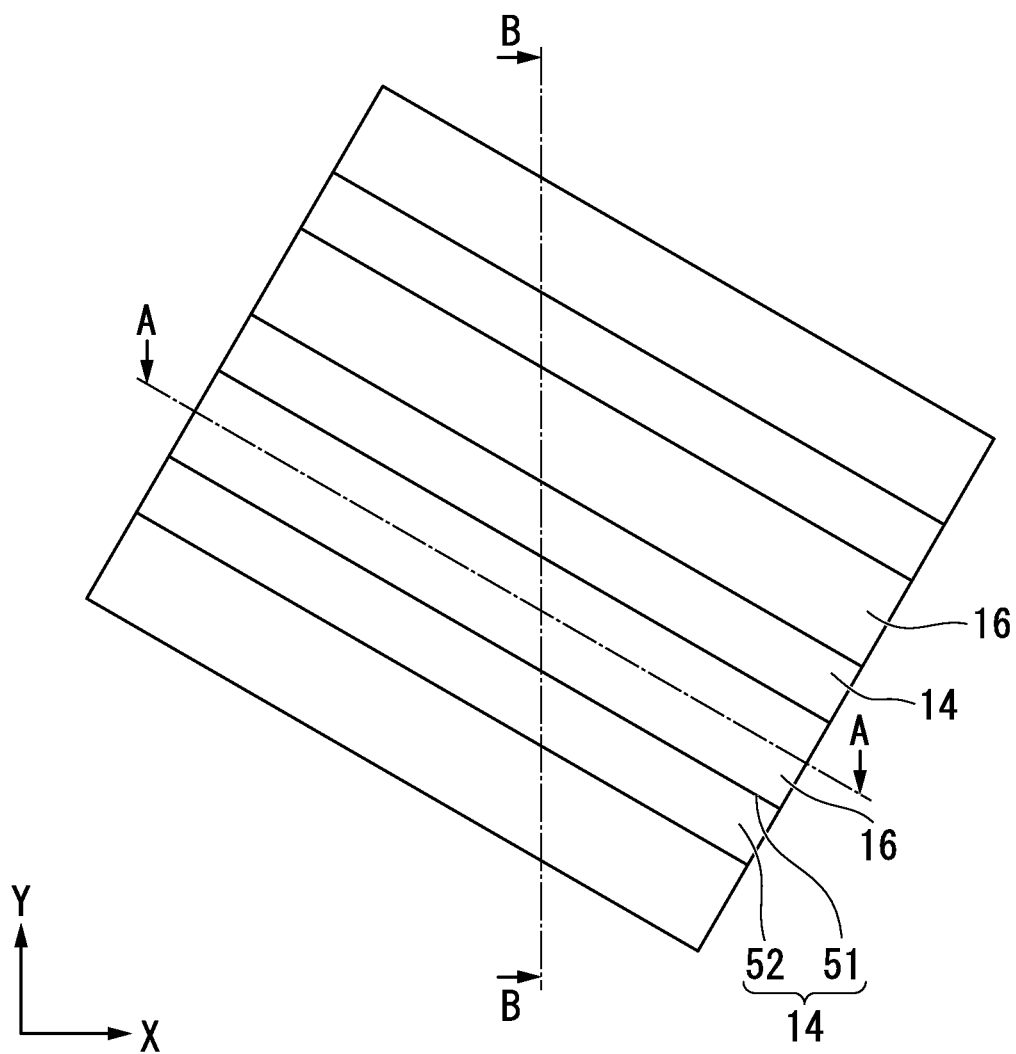
FIG. 7A is a fragmentary plan view of a step, subsequent to the step of FIGS. 6A, 6B, and 6C, involved in the method of forming the semiconductor device of FIGS. 1, 2, and 3, in accordance with one or more embodiments of the present invention.
Figure 7B:
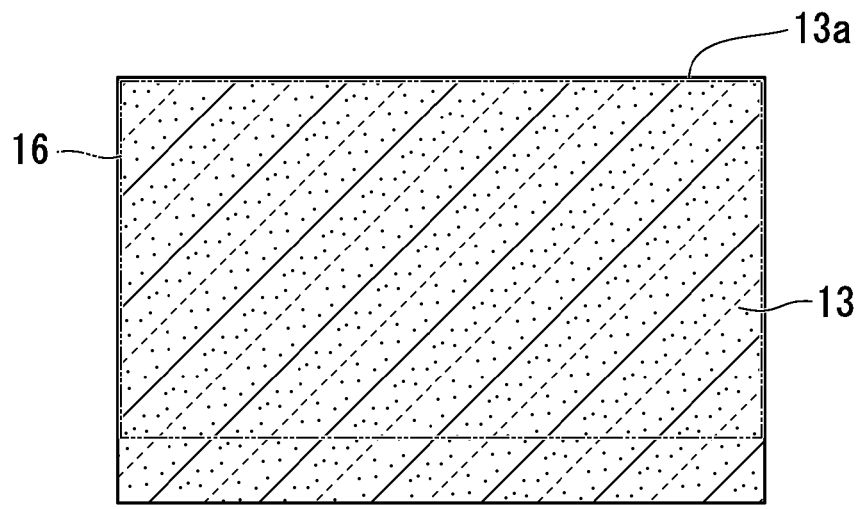
FIG. 7B is a fragmentary cross sectional elevation view of a step, subsequent to the step of FIGS. 6A, 6B, and 6C, taken along an A-A line of FIG. 7A, involved in the method of forming the semiconductor device of FIGS. 1, 2, and 3, in accordance with one or more embodiments of the present invention.
Figure 7C:
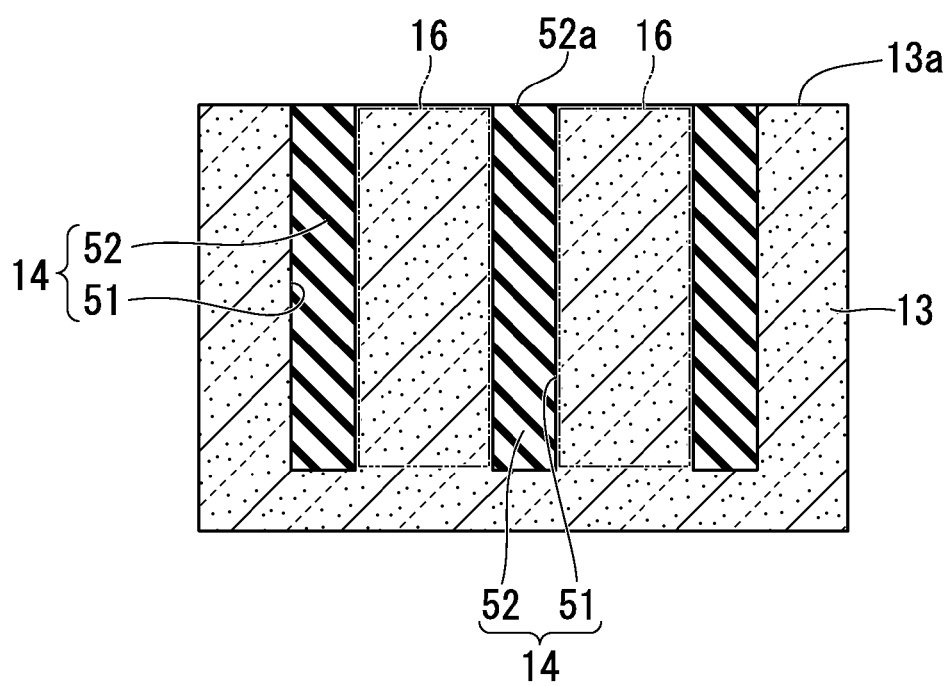
FIG. 7C is a fragmentary cross sectional elevation view of a step, subsequent to the step of FIGS. 6A, 6B, and 6C, taken along a B-B line of FIG. 7A, involved in the method of forming the semiconductor device of FIGS. 1, 2, and 3, in accordance with one or more embodiments of the present invention.

Next, in the process step shown in FIG. 7A to FIG. 7C, the silicon nitride film 66 shown in FIG. 6A to FIG. 6C is removed, after which the pad oxide film 65 is removed. Specifically, hot phosphoric acid is used to remove the silicon nitride film 66, after which an HF (hydrogen fluoride) etching liquid is used to remove the pad oxide film 65. By doing this, the band-shaped active region 16 is exposed.

Next, of the first element separation insulating film 52, a part protruding from the surface 13a of the semiconductor substrate 13 is removed to make the upper surface 52a of the first element separation insulating film 52 flush with the surface 13a of the semiconductor substrate 13. The first element separation insulating film 52 protruding from the surface 13a of the semiconductor substrate 13 is removed by, for example, wet etching.

Figure 8A:
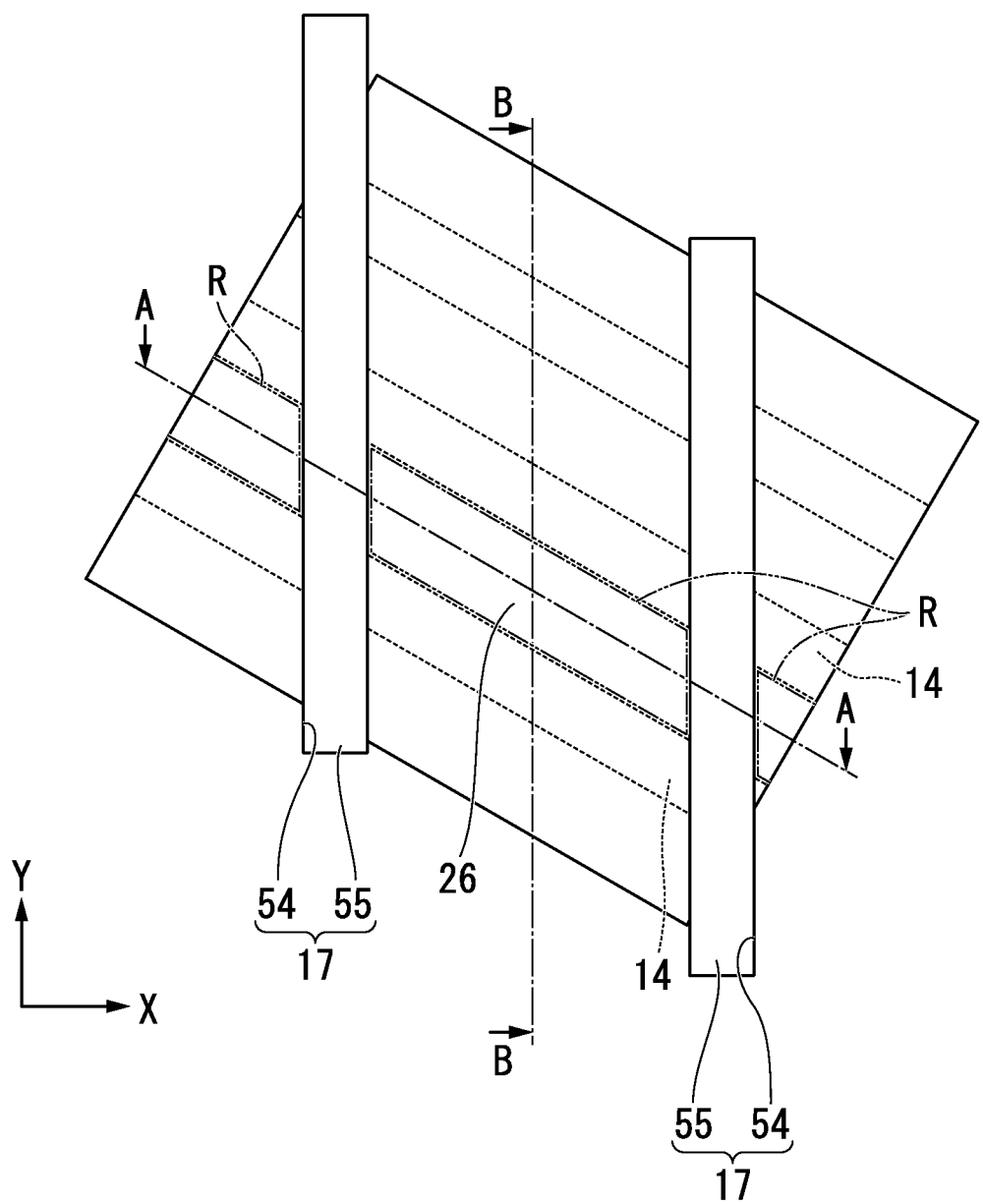
FIG. 8A is a fragmentary plan view of a step, subsequent to the step of FIGS. 7A, 7B, and 7C, involved in the method of forming the semiconductor device of FIGS. 1, 2, and 3, in accordance with one or more embodiments of the present invention.
Figure 8B:
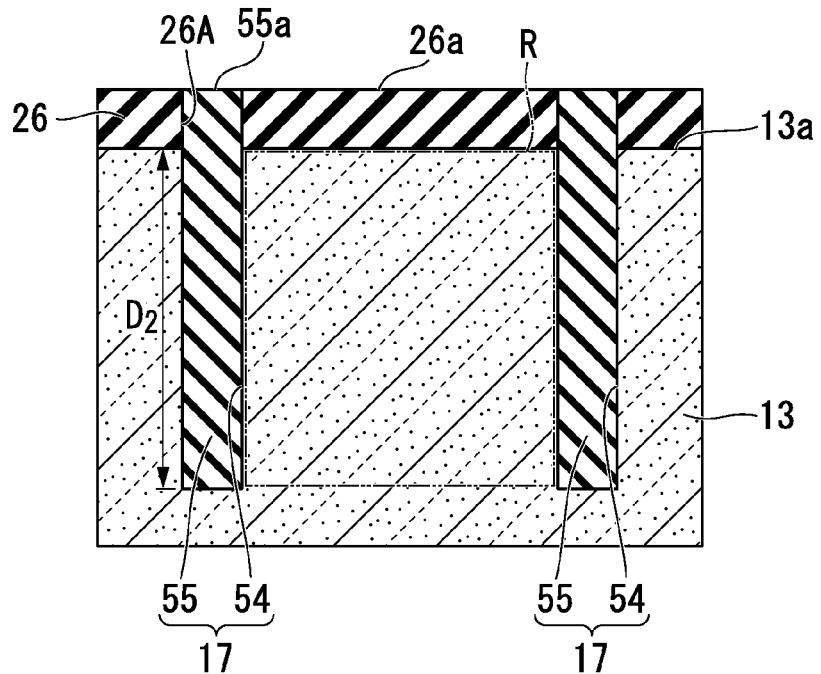
FIG. 8B is a fragmentary cross sectional elevation view of a step, subsequent to the step of FIGS. 7A, 7B, and 7C, taken along an A-A line of FIG. 8A, involved in the method of forming the semiconductor device of FIGS. 1, 2, and 3, in accordance with one or more embodiments of the present invention.
Figure 8C:
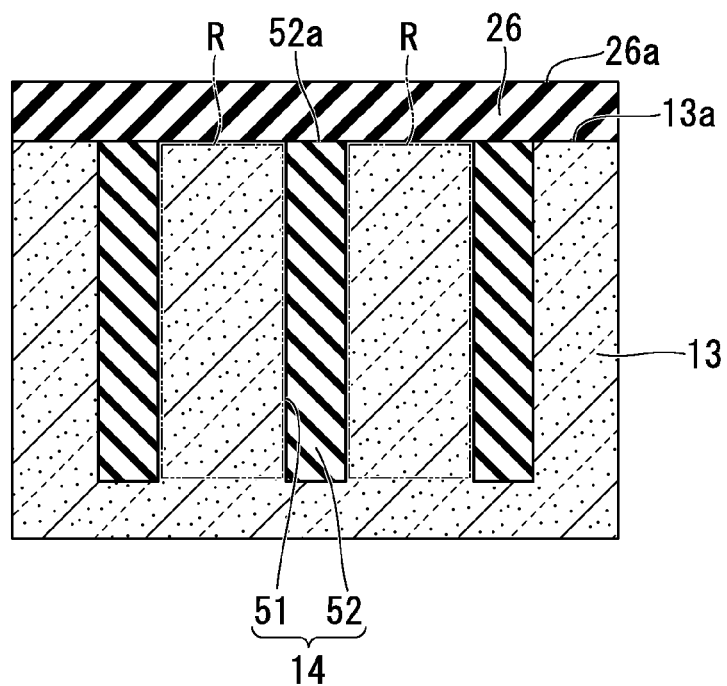
FIG. 8C is a fragmentary cross sectional elevation view of a step, subsequent to the step of FIGS. 7A, 7B, and 7C, taken along a B-B line of FIG. 8A, involved in the method of forming the semiconductor device of FIGS. 1, 2, and 3, in accordance with one or more embodiments of the present invention.

Next, in the process step shown in FIG. 8A to FIG. 8C, the mask insulating film 26 having the trench-shaped aperture part 26A is formed on the surface 13a of the semiconductor substrate 13 and the upper surface 52a of the first element separation insulating film 52, which are shown in FIG. 7A to FIG. 7C.

Specifically, the mask insulating film 26 is formed by forming a silicon nitride film covering the surface 13a of the semiconductor substrate 13 and the upper surface 52a of the first element separation insulating film 52 (base material for the mask insulating film 26), and then forming photoresist patterned onto the silicon nitride film (not shown), and the aperture part 26A is processed by anisotropic etching, using the photoresist as a mask.

When this is done, a plurality of aperture parts 26A extending in the Y direction (first direction) are formed, these being separated by a prescribed spacing with respect to the X direction (refer to FIG. 6A). The aperture parts 26A are also formed so as to expose the surface 13a of the semiconductor substrate 13 corresponding to the formation regions of second element separation trenches 54. The photoresist (not shown) is removed after forming the aperture parts 26A.

Next, anisotropic etching (specifically, dry etching) is done using the mask insulating film 26 having the aperture parts 26A as a mask to etch the semiconductor substrate 13 and to form the second element separation trenches 54 extending in the first direction.

The depth $D_2$ of the second element separation trench 54 (depth referenced to the surface 13a of the semiconductor substrate 13) can be made, for example, 250 nm.

Next, the second element separation insulating film 55 that buries the second element separation trench 54 is formed.

Specifically, the second element separation trench 54 is buried with a silicon oxide film ($SiO_2$ film) formed by HDP CVD, or with a silicon oxide film ($SiO_2$ film) formed by coating to using SOG method.

Next, CMP is done to remove the insulating film deposited above the upper surface 26a of the mask insulating film 26, thereby forming, in the second element separation trench 54, the second element separation insulating film 55 made of a silicon oxide film ($SiO_2$ film) and also having a upper surface 55a that is made flush with the upper surface 26a of the mask insulating film 26.

By doing this, the second element separation regions 17 that are made of the second element separation trench 54 and the second element separation insulating films 55 and that partition the band-shaped active region 16 shown in FIG. 7A to 7C into a plurality of element formation regions R are formed.

By doing this, after forming the first element separation regions 14 that are made of the first element separation trench 51 formed on the semiconductor substrate 13 and the first element separation insulating film 52 burying the first element separation trenches 51 and that partitions the band-shaped active regions 16, the second element separation regions 17 that are made of the second element separation trenches 54 formed in the semiconductor substrate 13 and the second element separation insulating films 55 burying the second element separation trenches 54 and that partition a plurality of element formation regions R are formed and, by doing this, compared to the case in which a dummy gate electrode (not shown) to which a negative potential is applied is provided with the intervening the gate insulating film 21 in the second element separation trench 54 to partition a plurality of element formation regions R, because there is no adverse effect on the first and second transistors 19-1 and 19-2 by the potential of the dummy gate electrode, it is not only easy to turn on the first and second transistors 19-1 and 19-2 (refer to FIG. 2), but also it possible to improve the data holding characteristics of the memory cell array 11.

Figure 9A:
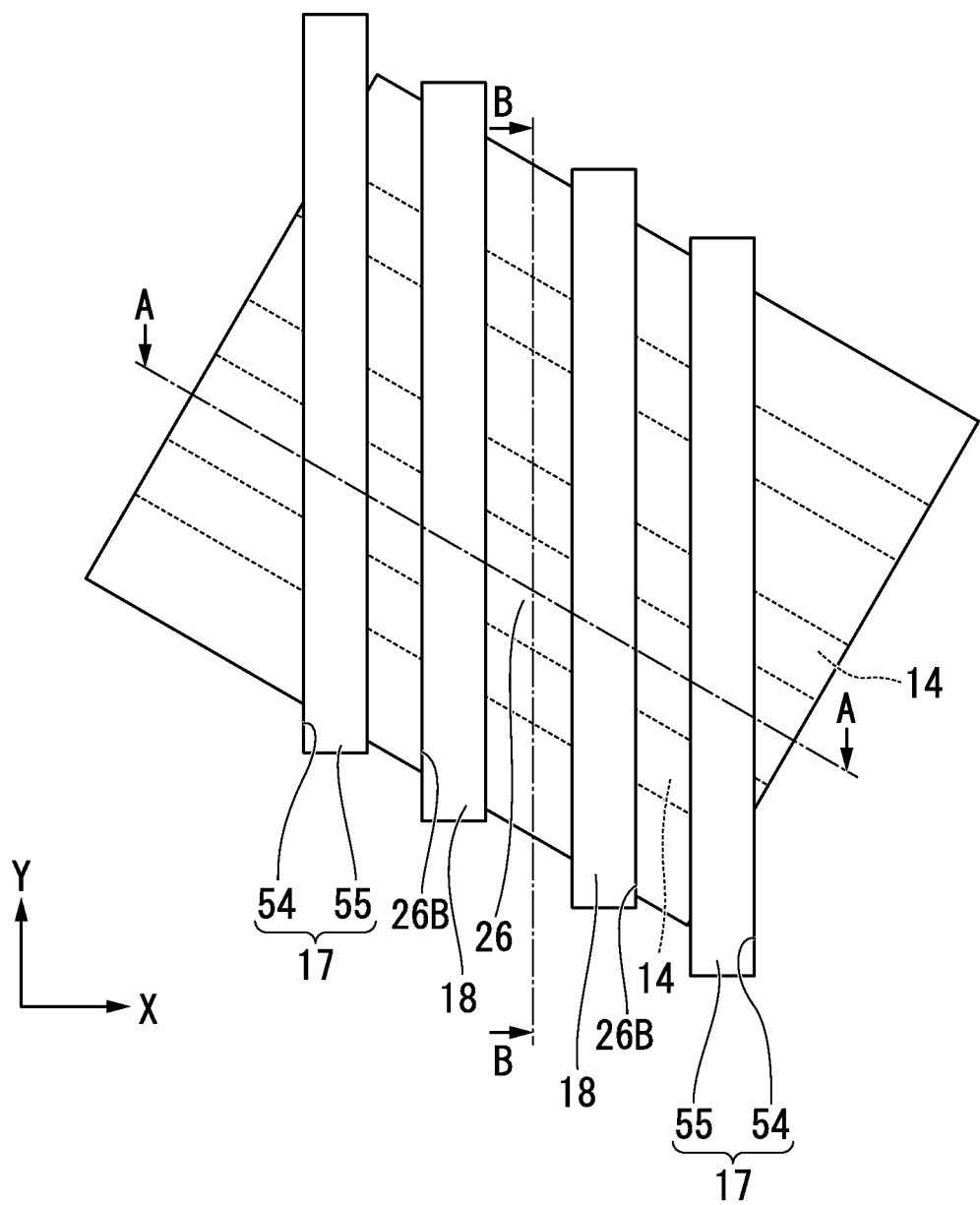
FIG. 9A is a fragmentary plan view of a step, subsequent to the step of FIGS. 8A, 8B, and 8C, involved in the method of forming the semiconductor device of FIGS. 1, 2, and 3, in accordance with one or more embodiments of the present invention.
Figure 9B:
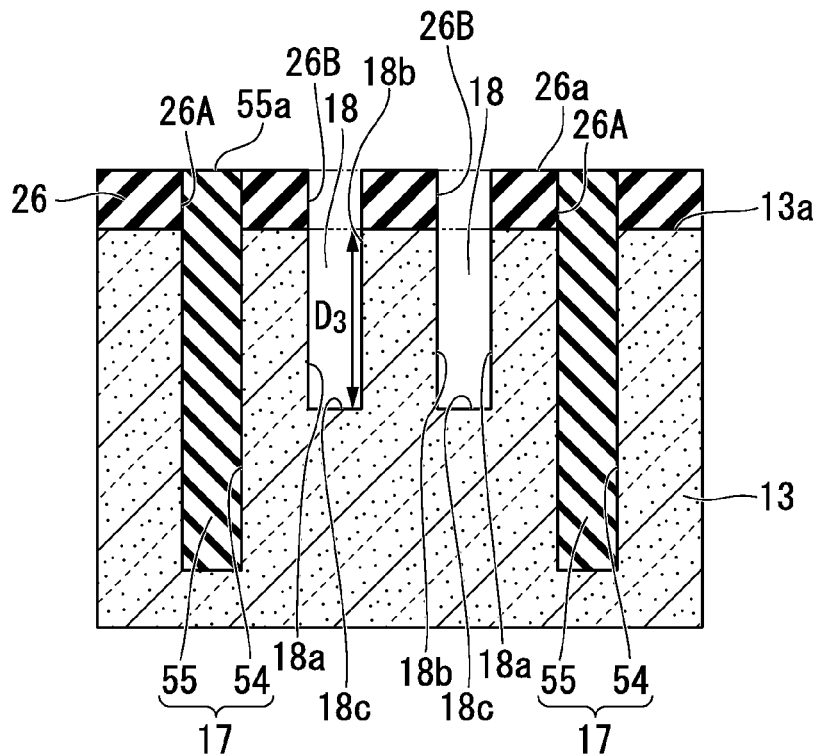
FIG. 9B is a fragmentary cross sectional elevation view of a step, subsequent to the step of FIGS. 8A, 8B, and 8C, taken along an A-A line of FIG. 9A, involved in the method of forming the semiconductor device of FIGS. 1, 2, and 3, in accordance with one or more embodiments of the present invention.
Figure 9C:
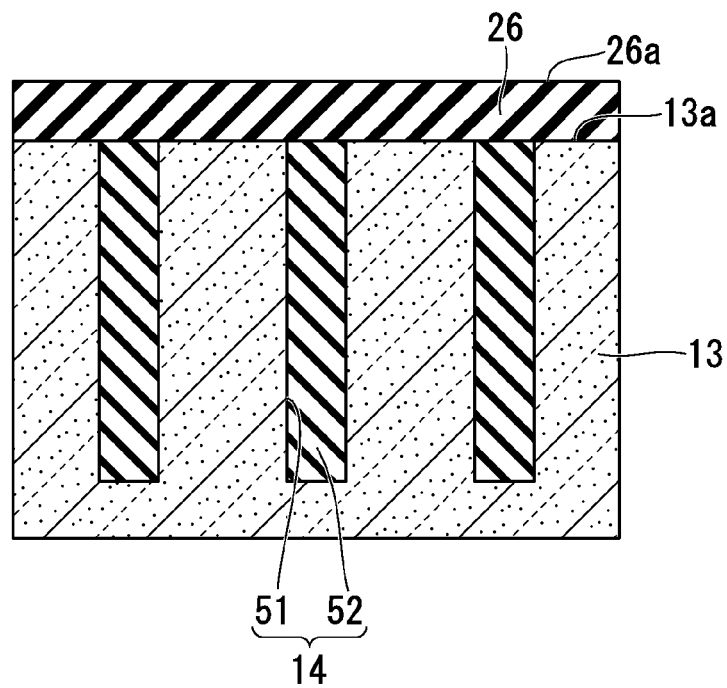
FIG. 9C is a fragmentary cross sectional elevation view of a step, subsequent to the step of FIGS. 8A, 8B, and 8C, taken along a B-B line of FIG. 9A, involved in the method of forming the semiconductor device of FIGS. 1, 2, and 3, in accordance with one or more embodiments of the present invention.

Next, in the process step shown in FIG. 9A to FIG. 9C, two trench-shaped aperture parts 26B extending in the Y direction are formed in the mask insulating film 26 positioned between the two second element separation regions 17.

When this is done, the aperture parts 26B are formed so as to expose the surface 13a of the semiconductor substrate 13 corresponding to the formation region for the gate electrode trench 18.

The aperture part 26B forms photoresist (not shown) that is patterned on the mask insulating film 26, whereby the mask insulating film 26 is etched by anisotropic etching (specifically, dry etching) using the photoresist as a mask. The photoresist is removed after forming the aperture part 26B.

Next, anisotropic etching (specifically, dry etching) is done using the mask insulating film 26 having the aperture parts 26B as a mask to etch the semiconductor substrate 13 and to form the two second gate electrode trenches 18 having the bottom surface 18c and the opposing first and second side surfaces 18a and 18b.

When this is done, the two gate electrode trenches 18 are formed so that the second side surfaces 18b are opposed via the semiconductor substrate 13 (specifically, a part of the semiconductor substrate 13 in which the third impurity diffusion region 29 is formed). The depth $D_3$ of the gate electrode trench 18 (depth referenced to the surface 13a of the semiconductor substrate 13) is formed so as to be shallower than the depths $D_1$ and $D_2$ of the first and second element separation trenches 51 and 54.

When the depths $D_1$ and $D_2$ of the first and second element separation trenches 51 and 54 are 250 nm, the depth $D_3$ of the gate electrode trench 18 can be made, for example, 150 nm.

Figure 10A:
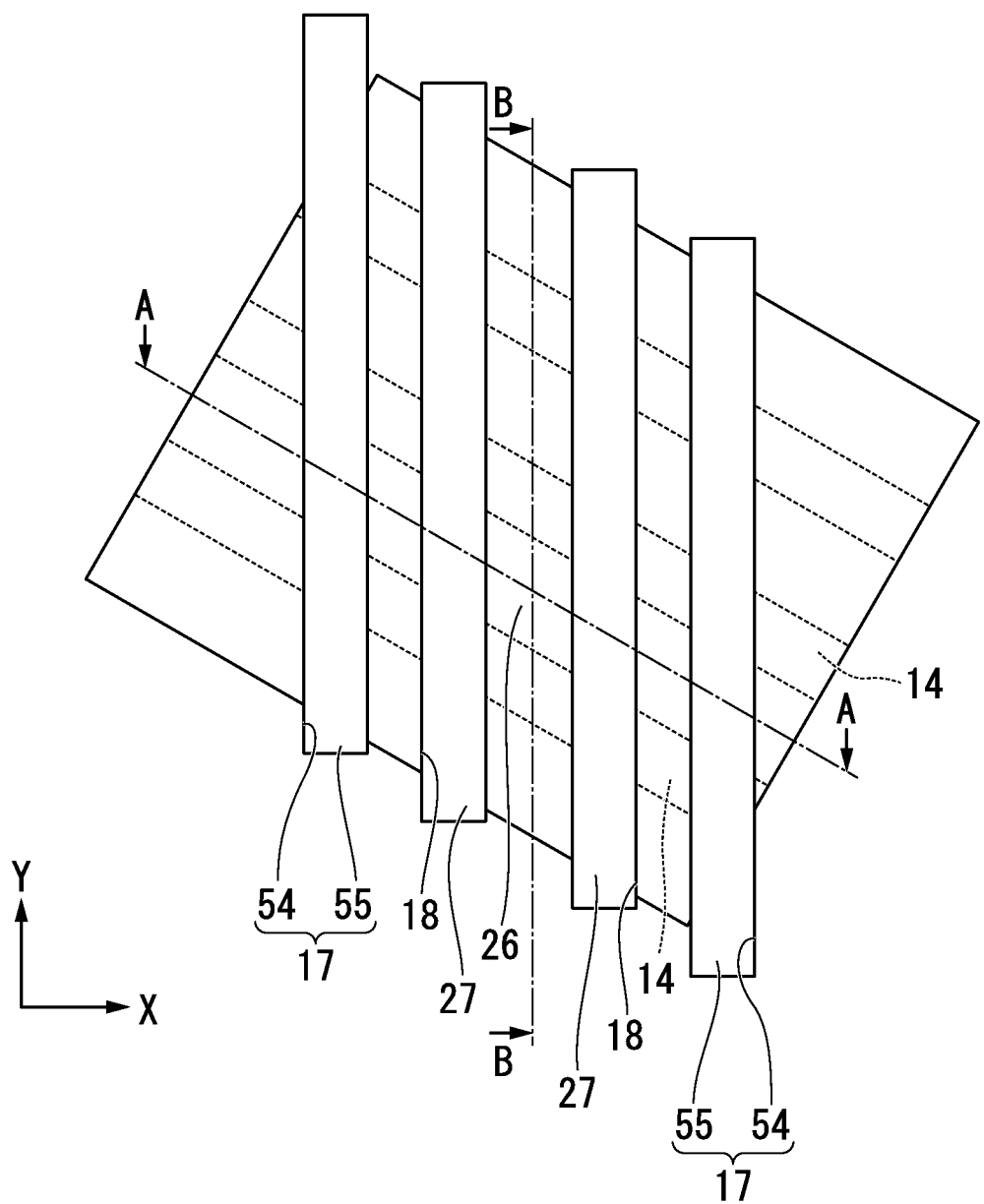
FIG. 10A is a fragmentary plan view of a step, subsequent to the step of FIGS. 9A, 9B, and 9C, involved in the method of forming the semiconductor device of FIGS. 1, 2, and 3, in accordance with one or more embodiments of the present invention.
Figure 10B:
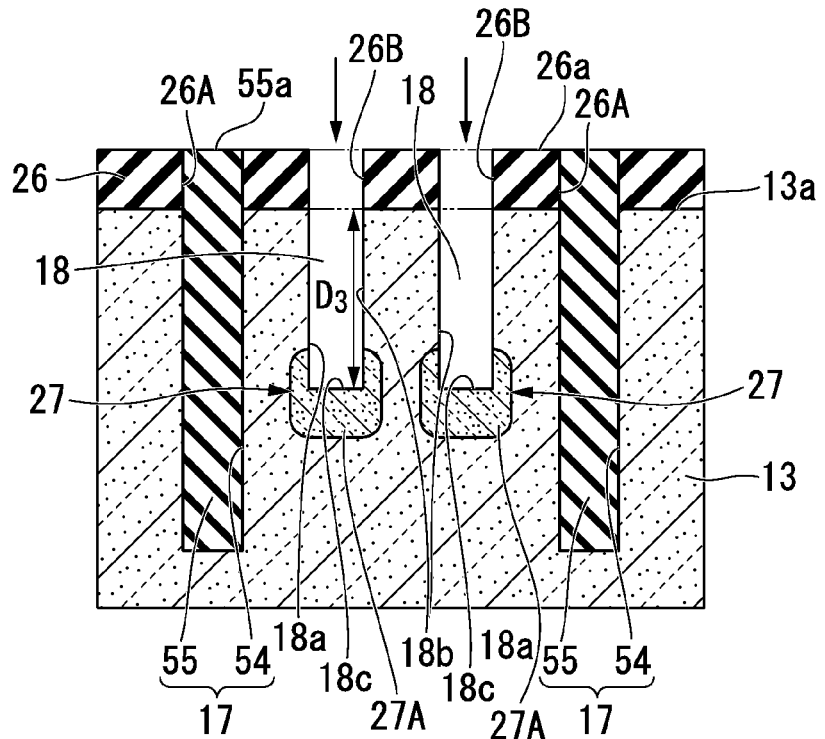
FIG. 10B is a fragmentary cross sectional elevation view of a step, subsequent to the step of FIGS. 9A, 9B, and 9C, taken along an A-A line of FIG. 10A, involved in the method of forming the semiconductor device of FIGS. 1, 2, and 3, in accordance with one or more embodiments of the present invention.
Figure 10C:
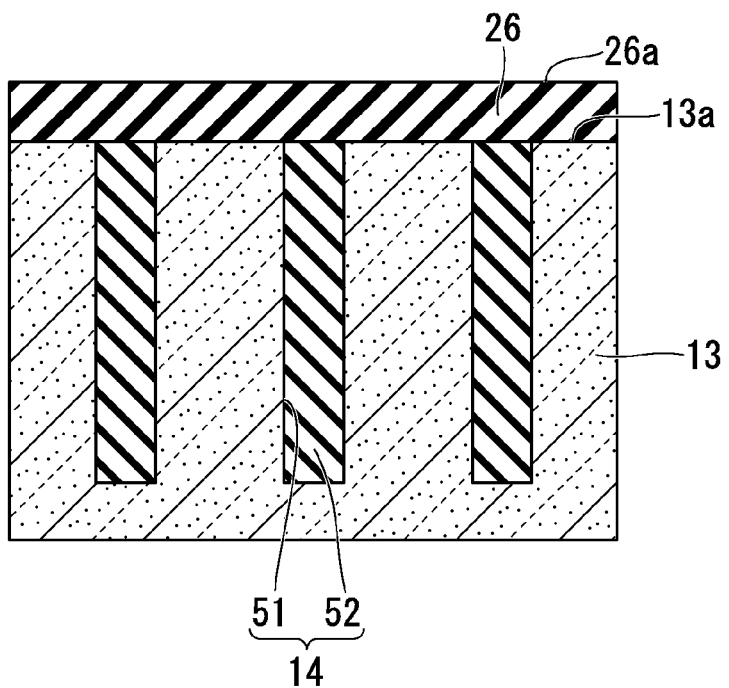
FIG. 10C is a fragmentary cross sectional elevation view of a step, subsequent to the step of FIGS. 9A, 9B, and 9C, taken along a B-B line of FIG. 10A, involved in the method of forming the semiconductor device of FIGS. 1, 2, and 3, in accordance with one or more embodiments of the present invention.

Next, in the process step shown in FIG. 10A to FIG. 10C, selective ion implantation is done into the bottom surfaces 18c of the gate electrode trenches 18, introducing arsenic (As), which is an n-type impurity (conductive-type impurity differing from a p-type silicon substrate which is the semiconductor substrate 13), under conditions of an energy of 10 keV and a dose of $1 \times 10^{13}$ atoms/cm$^2$, thereby forming the first impurity diffusion regions 27 at the bottom parts of the gate electrode trenches 18.

By doing this, the first impurity diffusion regions 27 are formed so as to cover the bottom surfaces 18c of the gate electrode trenches 18 and the parts of the first and second side surfaces 18a and 18b corresponding to the bottom parts of the gate electrode trenches 18.

The first impurity diffusion regions 27 are formed such that the depths thereof are shallower than the depths of the first and second element separation regions 14 and 17.

From the standpoint of suppressing the implantation of arsenic (As) into the first and second side surfaces 18a and 18b of the gate electrode trench 18, instead of implanting arsenic (As) in the process step shown in FIG. 10A to FIG. 10C, after forming the gate insulating film 21, arsenic (As) may be implanted as described in the process step shown in FIG. 10A to FIG. 10C, so as to form the first impurity diffusion region 27 at the bottom parts of each of the gate electrode trenches 18.

Figure 11A:
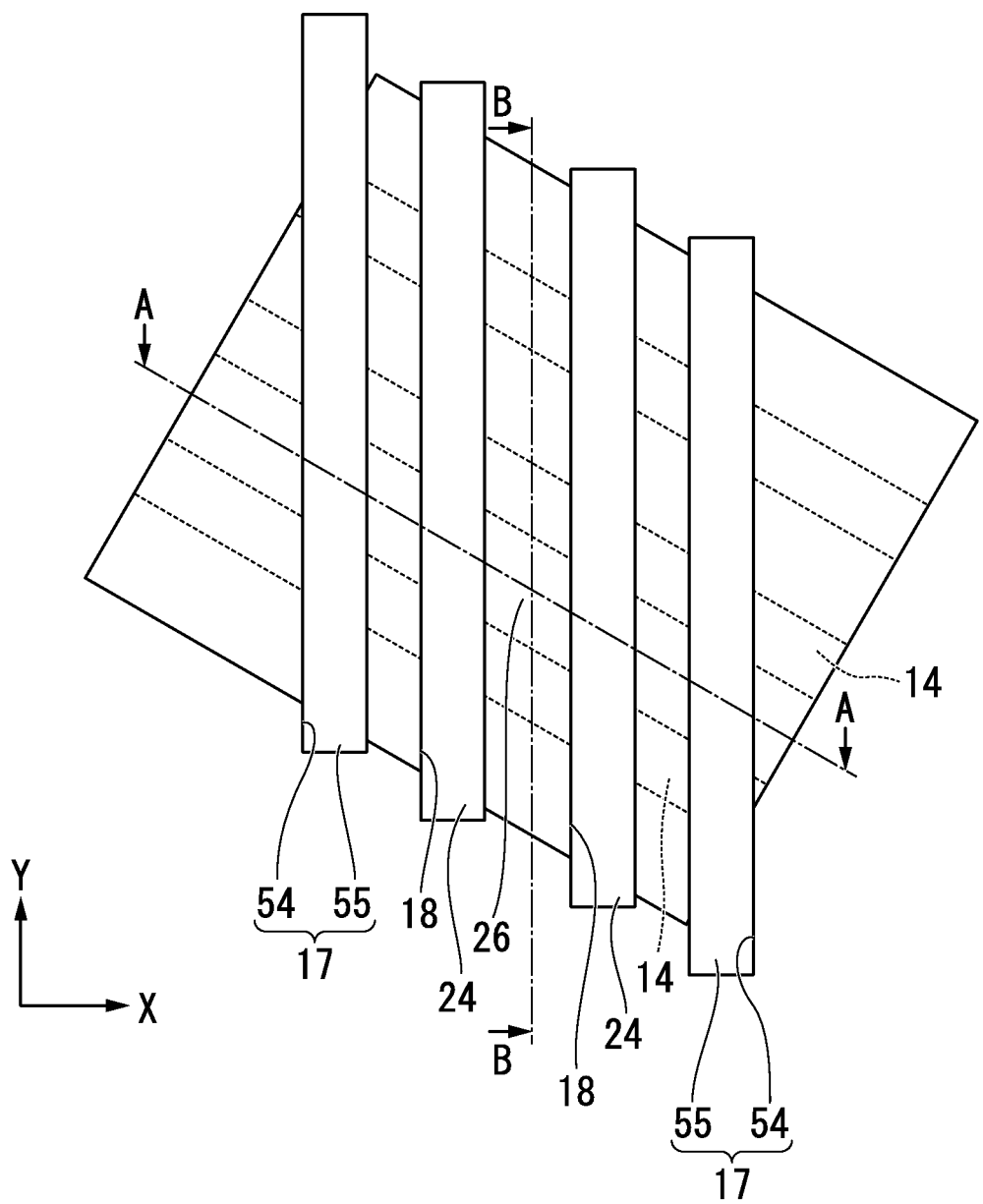
FIG. 11A is a fragmentary plan view of a step, subsequent to the step of FIGS. 10A, 10B, and 10C, involved in the method of forming the semiconductor device of FIGS. 1, 2, and 3, in accordance with one or more embodiments of the present invention.
Figure 11B:
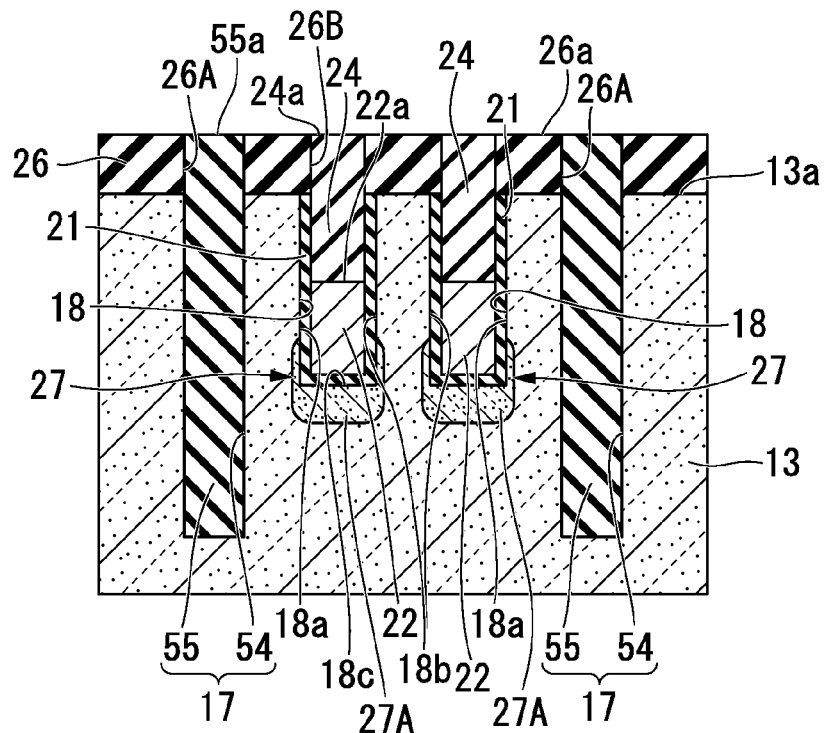
FIG. 11B is a fragmentary cross sectional elevation view of a step, subsequent to the step of FIGS. 10A, 10B, and 10C, taken along an A-A line of FIG. 11A, involved in the method of forming the semiconductor device of FIGS. 1, 2, and 3, in accordance with one or more embodiments of the present invention.
Figure 11C:
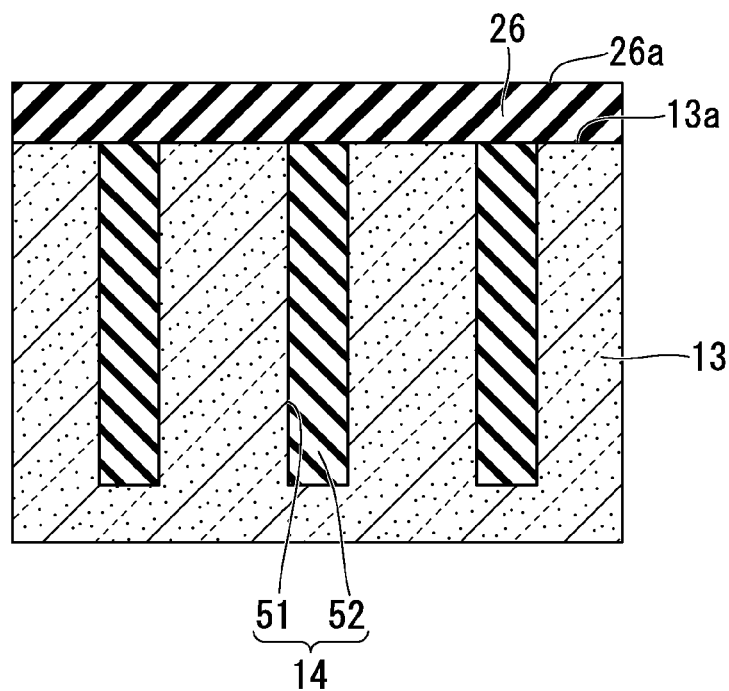
FIG. 11C is a fragmentary cross sectional elevation view of a step, subsequent to the step of FIGS. 10A, 10B, and 10C, taken along a B-B line of FIG. 11A, involved in the method of forming the semiconductor device of FIGS. 1, 2, and 3, in accordance with one or more embodiments of the present invention.

Next, in the process step shown in FIG. 11A to FIG. 11C, a gate insulating film 21 is formed that covers the first and second side surfaces 18a and 18b of the gate electrode trenches 18 and the bottom surface 18c thereof.

A single-layer of silicon oxide film ($SiO_2$ film), a nitride film oxide film (SiON film), a laminated silicon oxide film ($SiO_2$ film), a laminated film of a silicon nitride film (SiN film) over a silicon oxide film ($SiO_2$ film), or the like can be used as the gate insulating film 21.

In the case in which a single-layer of silicon oxide film ($SiO_2$ film) is used as the gate insulating film 21, the gate insulating film 21 can be formed by thermal oxidation. In this case, the thickness of the gate insulating film 21 can be made, for example, 6 nm.

Next, the gate electrodes 22 burying the lower parts of the gate electrode trenches 18 are formed with the intervening gate insulating films 21 therebetween, so that the upper surfaces 22a are lower than the surface 13a of the semiconductor substrate 13.

Specifically, using, for example, CVD, a titanium nitride film and a tungsten film are successively laminated so as to bury the gate electrode trench 18, followed by etching back of the entire surface of the titanium nitride film and the tungsten film, so as to leave the titanium nitride film and the tungsten film in the lower part of the gate electrode trench 18, thereby forming the gate electrodes 22 made of the titanium nitride film and the tungsten film. Each of the gate electrodes 22 constitutes a word line of the memory cell.

Buried insulating films 24 covering the upper surfaces 22a of the gate electrodes 22 and also burying the gate electrode trenches 18 and the trench-shaped aperture parts 26B are then formed.

Specifically, an insulating film formed by HDP CVD (for example, a silicon oxide ($SiO_2$) film) or a coating insulating film formed by SOG (for example, silicon oxide (SiO$_2$) film) buries the upper part of the gate electrode trenches 18 and the aperture parts 26B.

Next, CMP is used to remove the insulating film formed above the upper surface 26a of the mask insulating film 26. By doing this, the buried insulating film 24 that is made of the insulating film burying the gate electrode trench 18 and the aperture part 26B (for example, silicon oxide (SiO$_2$) film) and that has the upper surface 24a made flush with respect to the upper surface 26a of the mask insulating film 26 is formed.

By doing this, the buried insulating film 24 for burying the gate electrode trench 18 that forms the gate electrode 22 is formed so as to cover the upper surface 22a of the gate electrode 22, so that the gate electrode 22 does not protrude upward beyond the surface 13a of the semiconductor substrate 13.

By doing this, in the case in which the semiconductor device 10 is a DRAM as in the first embodiment, because formation of the bit line 34 and the capacitor 48 in subsequent process steps later than the process step forming the gate electrode 22 is facilitated, the semiconductor device 10 can be easily manufactured.

Figure 12A:
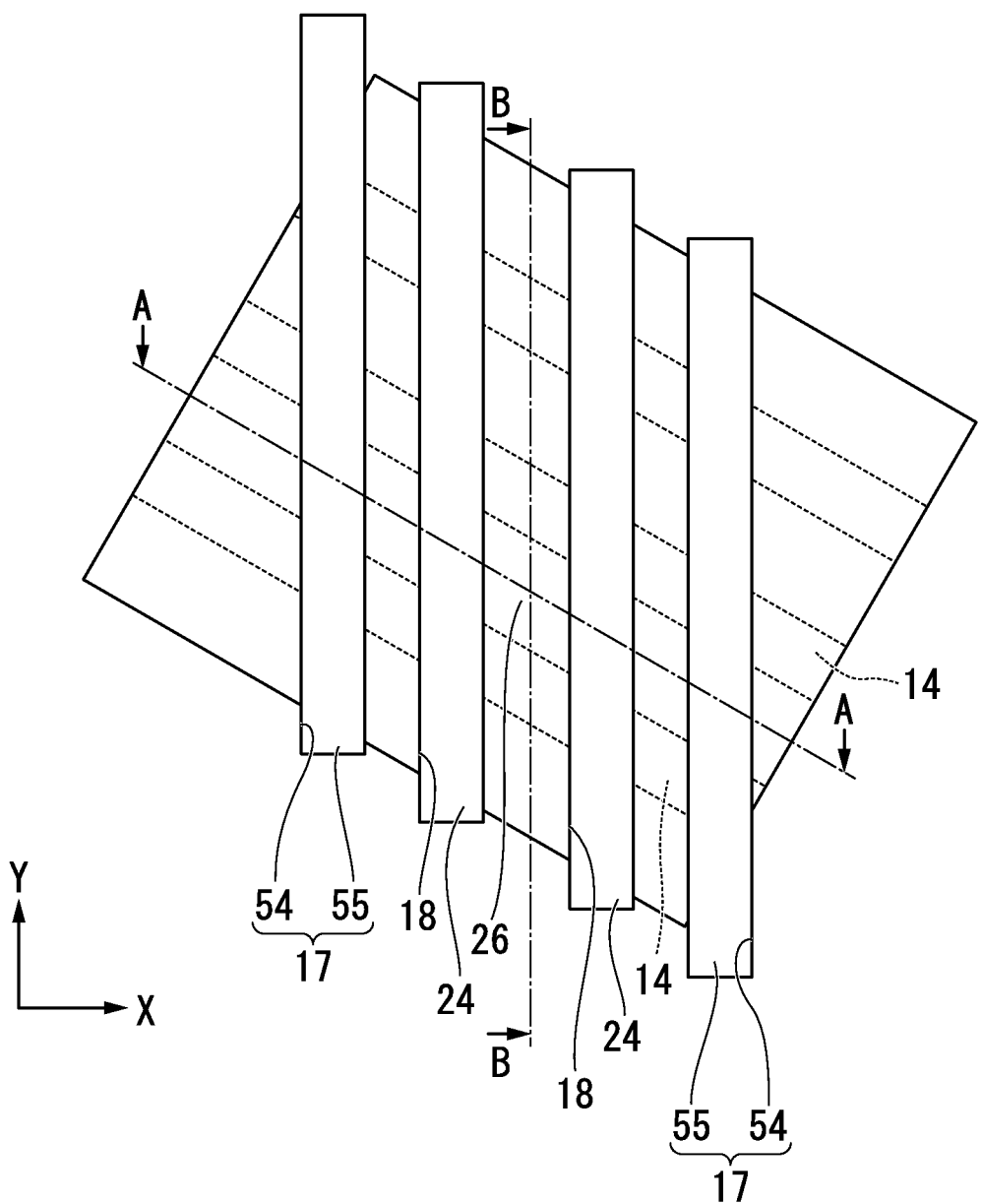
FIG. 12A is a fragmentary plan view of a step, subsequent to the step of FIGS. 11A, 11B, and 11C, involved in the method of forming the semiconductor device of FIGS. 1, 2, and 3, in accordance with one or more embodiments of the present invention.
Figure 12B:
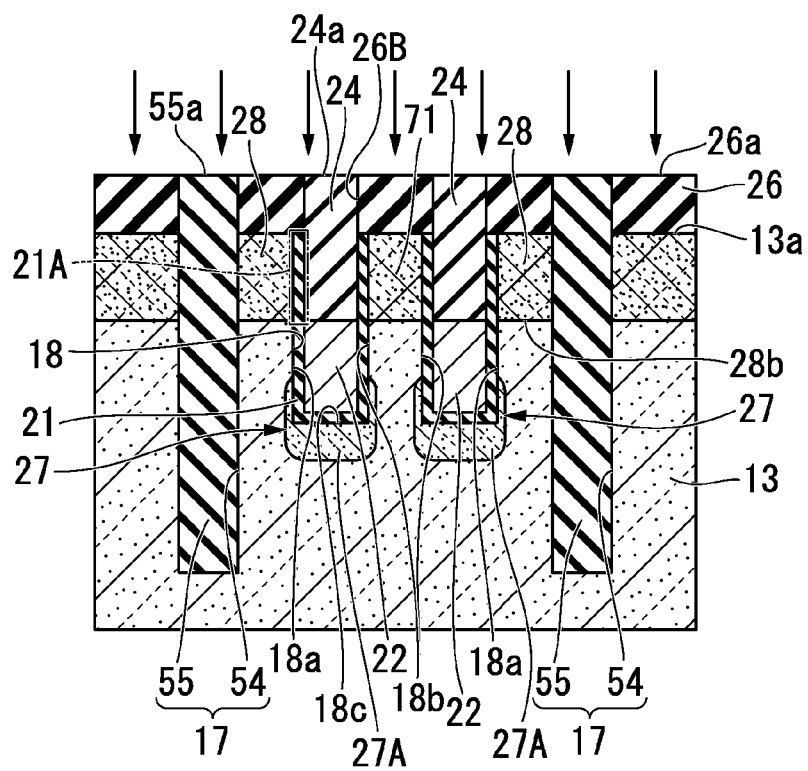
FIG. 12B is a fragmentary cross sectional elevation view of a step, subsequent to the step of FIGS. 11A, 11B, and 11C, taken along an A-A line of FIG. 12A, involved in the method of forming the semiconductor device of FIGS. 1, 2, and 3, in accordance with one or more embodiments of the present invention.
Figure 12C:
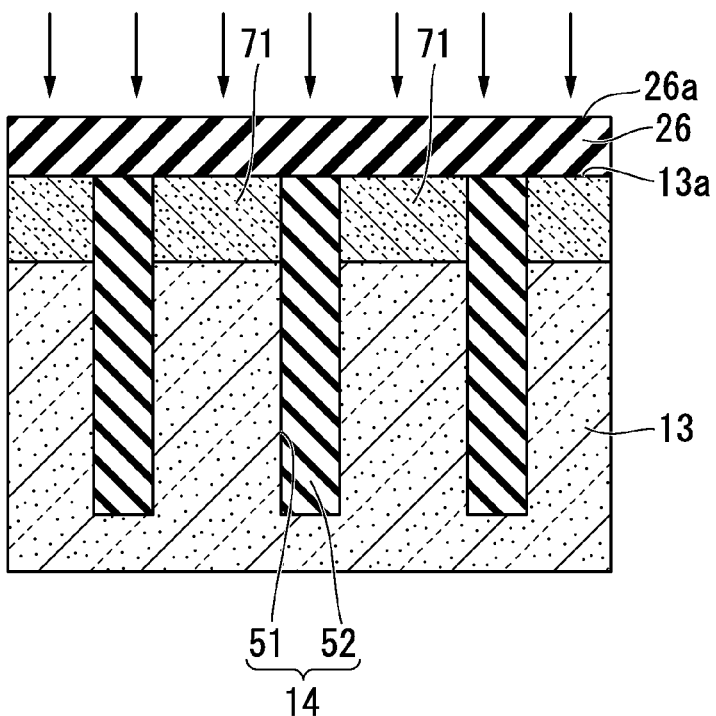
FIG. 12C is a fragmentary cross sectional elevation view of a step, subsequent to the step of FIGS. 11A, 11B, and 11C, taken along a B-B line of FIG. 12A, involved in the method of forming the semiconductor device of FIGS. 1, 2, and 3, in accordance with one or more embodiments of the present invention.

Next, in the process step shown in FIG. 12A to FIG. 12C, phosphorus (P), which is an n-type impurity (conductive-type impurity differing from a p-type silicon substrate which is the semiconductor substrate 13), is introduced by ion implantation onto the entire surface of the structure shown in FIG. 11A to 11C, under conditions of an energy of 100 keV and a dose of $1\times10^{14}$ atoms/cm$^2$, thereby forming the second impurity diffusion regions 28 in the semiconductor substrate 13 positioned between the gate electrode trench 18 and the second element separation region 17 and also forming impurity diffusion regions 71 which will become the parts of the third impurity diffusion regions 29 in the semiconductor substrate 13 positioned between the two gate electrode trenches 18.

By doing this, the second impurity diffusion region 28 is formed so as to cover the upper part 21A of the gate insulating film 21 formed on the first side surface 18a onto the semiconductor substrate 13 positioned at the first surface 18a side of the gate electrode trench 18.

The second impurity diffusion region 28 is formed so as to include the upper surface 13a of the semiconductor substrate 13 that is sandwiched by the first side surface 18a and the second element separation trench 54, and also so as to have the bottom surface 28b the position of which is higher than that of the upper surface 22a of the buried gate electrode 22. At this stage, the thickness of the mask insulating film 26 can be made, for example, 50 nm.

Figure 13A:
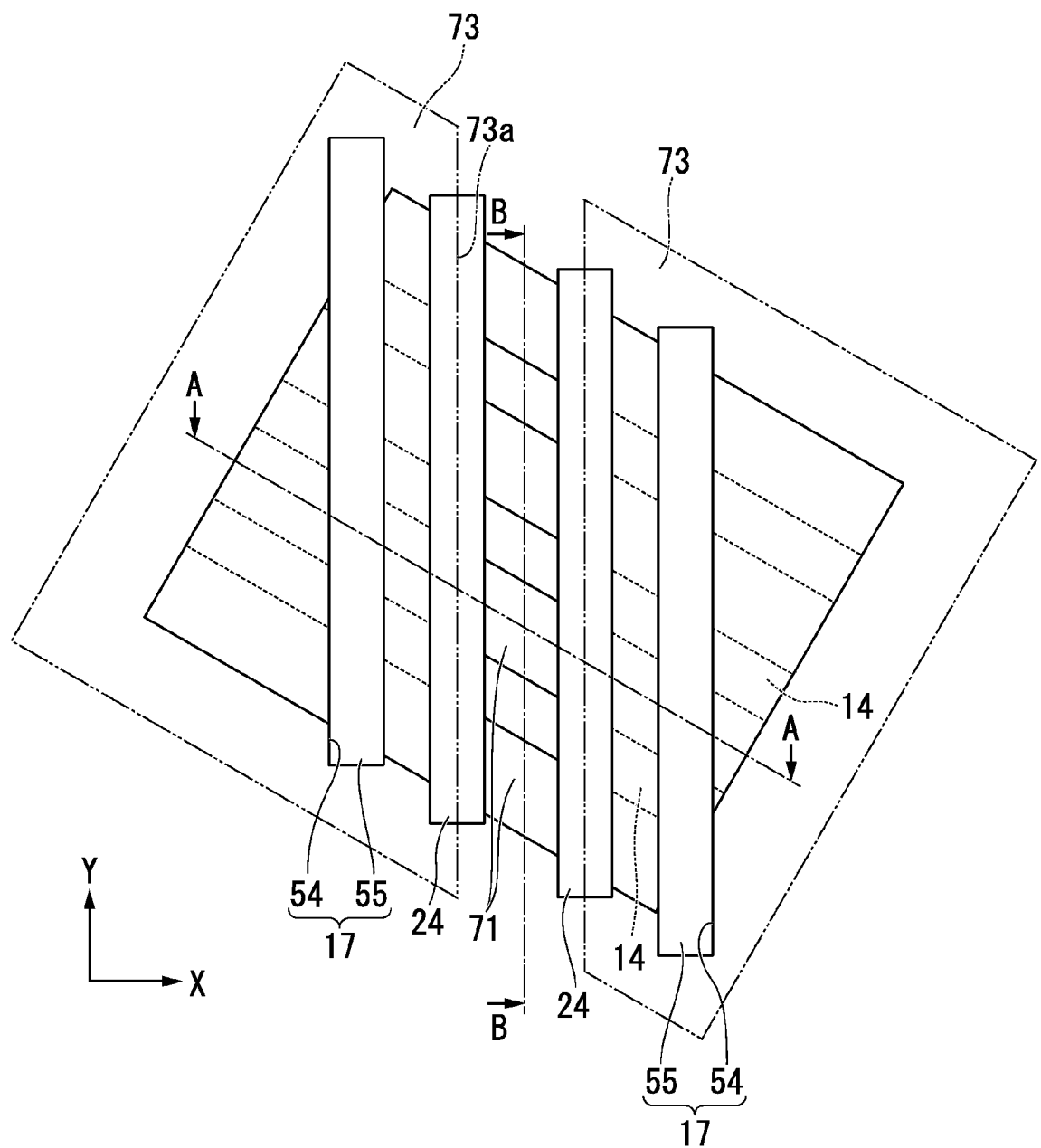
FIG. 13A is a fragmentary plan view of a step, subsequent to the step of FIGS. 12A, 12B, and 12C, involved in the method of forming the semiconductor device of FIGS. 1, 2, and 3, in accordance with one or more embodiments of the present invention.
Figure 13B:
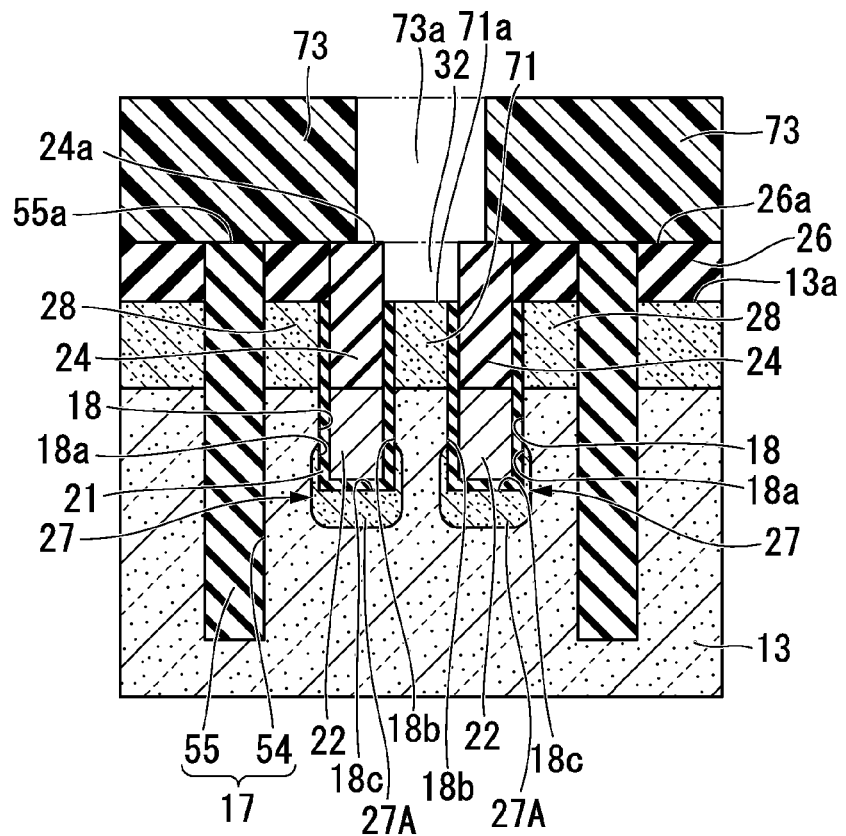
FIG. 13B is a fragmentary cross sectional elevation view of a step, subsequent to the step of FIGS. 12A, 12B, and 12C, taken along an A-A line of FIG. 13A, involved in the method of forming the semiconductor device of FIGS. 1, 2, and 3, in accordance with one or more embodiments of the present invention.
Figure 13C:
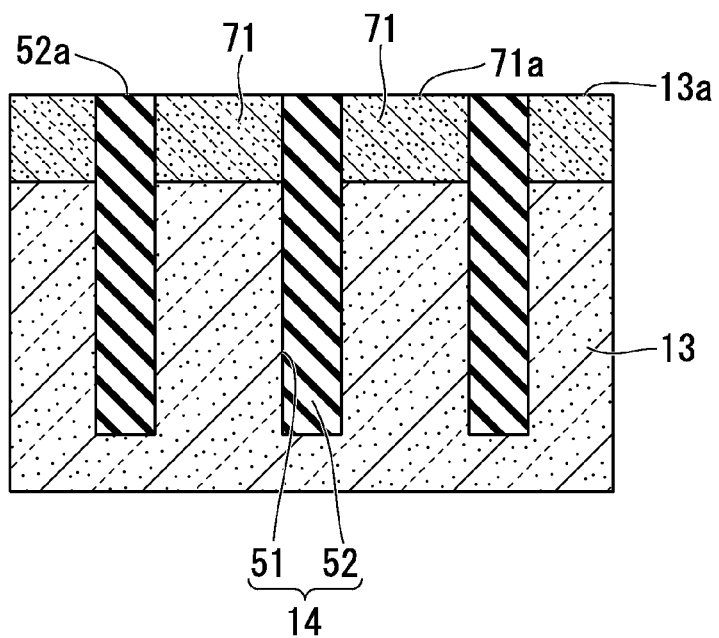
FIG. 13C is a fragmentary cross sectional elevation view of a step, subsequent to the step of FIGS. 12A, 12B, and 12C, taken along a B-B line of FIG. 13A, involved in the method of forming the semiconductor device of FIGS. 1, 2, and 3, in accordance with one or more embodiments of the present invention.

Next, in the process step shown in FIG. 13A to FIG. 13C, photoresist 73 which has a trench-shaped aperture part 73a exposing the upper surface 26a of the mask insulating film 26 that is positioned between the buried insulating films 24 is formed on the upper surface 24a of the buried insulating film 24, the upper surface 26a of the mask insulating film 26, and the upper surface 55a of the second element separation insulating film 55.

Next, using the photoresist 73 as a mask, etching (wet etching or dry etching) is done to remove the mask insulating film 26 exposed from the aperture part 73a. By doing this, the upper surface 71a of the impurity diffusion region 71 is exposed, and also a part of the upper surface 52a of the first element separation insulating film 52 that is flush with respect to the upper surface 71a of the impurity diffusion region 71 is exposed.

Figure 14A:
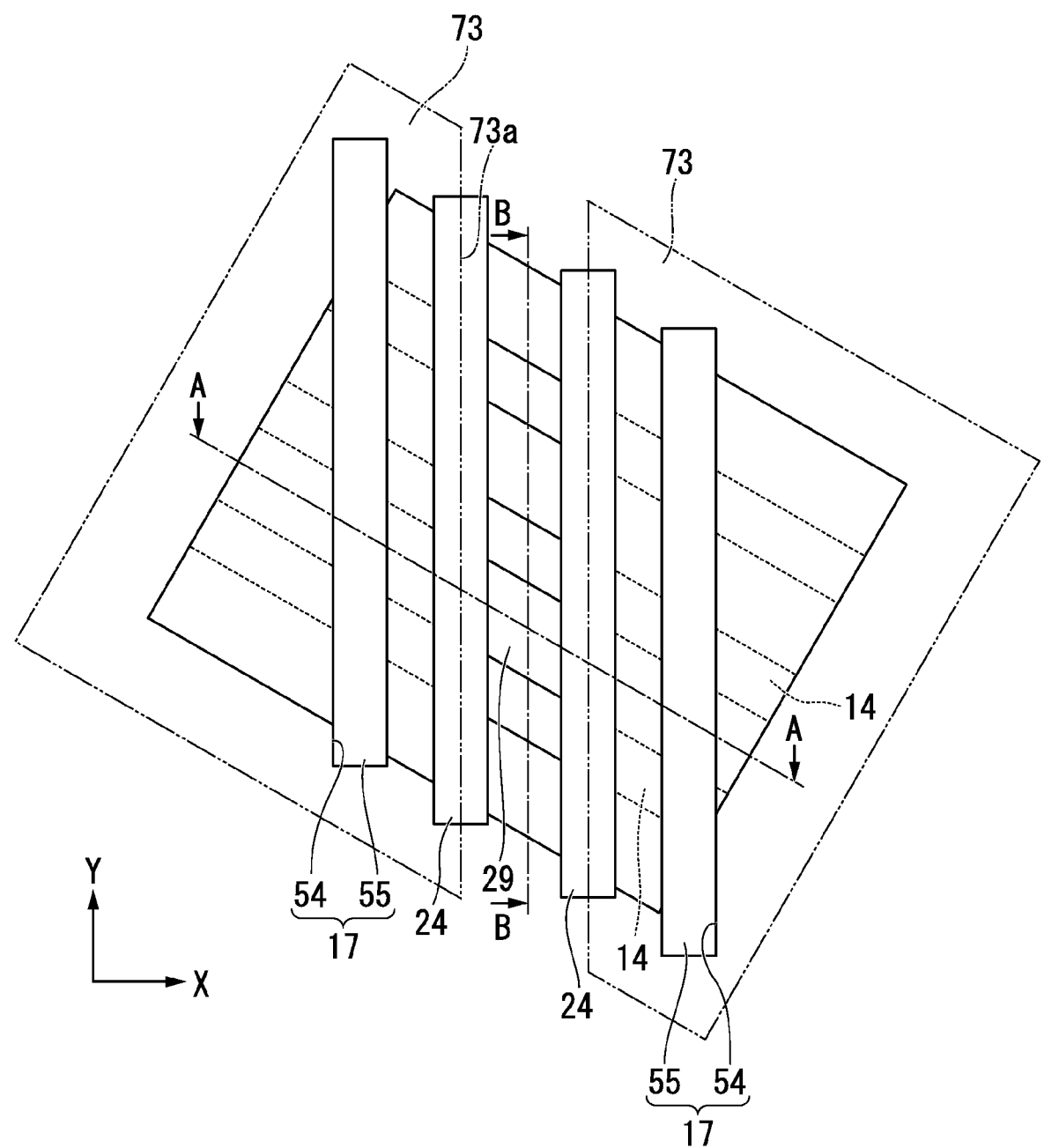
FIG. 14A is a fragmentary plan view of a step, subsequent to the step of FIGS. 13A, 13B, and 13C, involved in the method of forming the semiconductor device of FIGS. 1, 2, and 3, in accordance with one or more embodiments of the present invention.
Figure 14B:
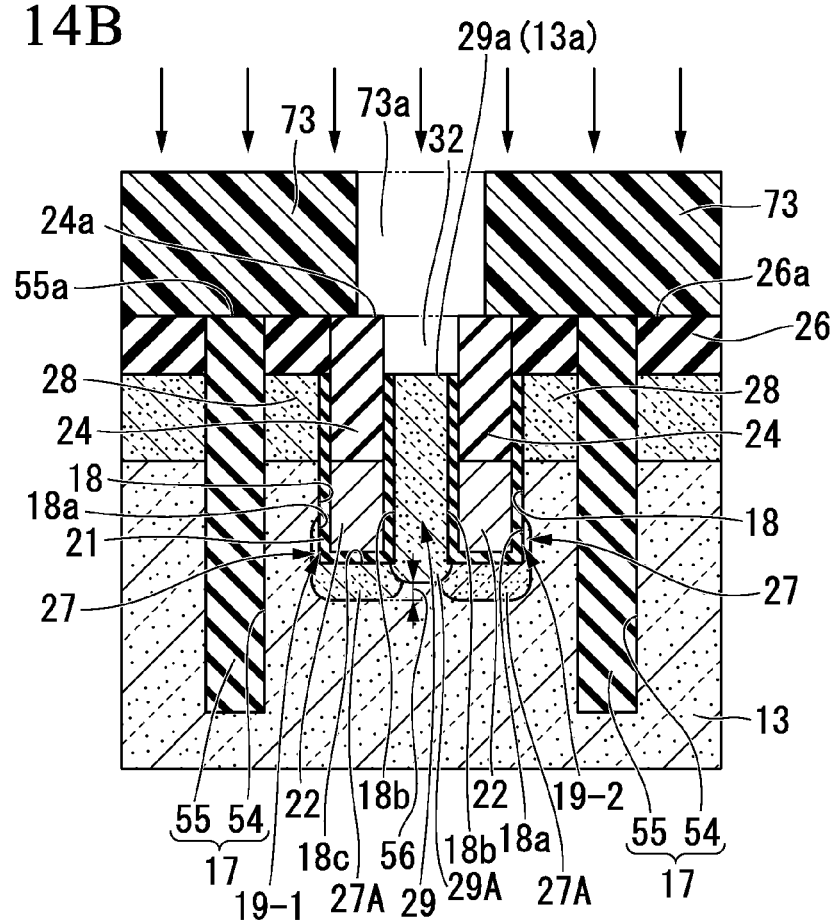
FIG. 14B is a fragmentary cross sectional elevation view of a step, subsequent to the step of FIGS. 13A, 13B, and 13C, taken along an A-A line of FIG. 14A, involved in the method of forming the semiconductor device of FIGS. 1, 2, and 3, in accordance with one or more embodiments of the present invention.
Figure 14C:
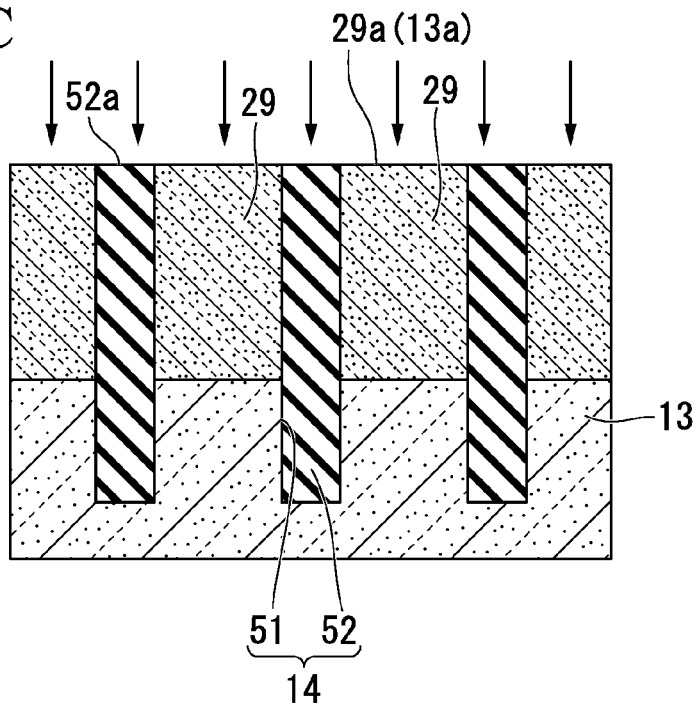
FIG. 14C is a fragmentary cross sectional elevation view of a step, subsequent to the step of FIGS. 13A, 13B, and 13C, taken along a B-B line of FIG. 14A, involved in the method of forming the semiconductor device of FIGS. 1, 2, and 3, in accordance with one or more embodiments of the present invention.

Next, in the process step shown in FIG. 14A to 14C, phosphorus (P) which is an n-type impurity (an impurity having a conductivity type differing from that of the p-type silicon substrate which is the semiconductor substrate 13) is introduced done by selective ion implantation into the impurity diffusion region 71 exposed from the photoresist 73 (or stated differently, the semiconductor substrate 13 in which the impurity diffusion region 71 is formed), under conditions of an energy of 80 keV and a dose of $5\times10^{13}$ atoms/cm$^2$, after which thermal treatment is performed, thereby forming the third impurity diffusion region 29 in the entire semiconductor substrate 13 positioned between the two gate electrode trenches 18, which is joined to the two first impurity diffusion regions 27, and which is disposed at the shallower position than the position of the bottom part 27A of the first impurity diffusion region 27.

By doing this, the third impurity diffusion region 29 is formed so as to cover the entire gate insulating films 21 formed on the second side surfaces 18b of the two gate electrode trenches 18, and also the first and second transistors 19-1, 19-2 having the gate insulating film 21, the gate electrode 22, the buried insulating film 24, the first impurity diffusion region 27, the second impurity diffusion region 28, and the third impurity diffusion region 29 are formed.

By making the formation of the position of the bottom part 29A of the third impurity diffusion region 29 shallower than the position of the bottom part 27A of the first impurity diffusion region 27, the step 56 is formed between the bottom part 29A of the third impurity diffusion region 29 and the two bottom parts 27A of the first impurity diffusion regions 27.

The first impurity diffusion regions 27 are thus formed at the bottom parts of the two gate electrode trenches 18, disposed so as to be neighboring to one another, the second impurity diffusion regions 28 covering the upper surfaces 21A of the gate insulating films 21 that are positioned on the first side surfaces 18a of the two gate electrode trenches 18 are formed, and the third impurity diffusion region 29 is joined with the first impurity diffusion regions 27 so as to cover the entire gate insulating films 21 that are disposed on the second side surfaces 18b of the two gate electrode trenches 18. By doing this, the channel region is formed at only a part of the first side surface 18a that is positioned between the first impurity diffusion region 27 and the second impurity diffusion region 28.

By doing this, compared with a conventional semiconductor device in which the channel region is formed on the three surfaces of the gate electrode trench (two opposing side surfaces and bottom surface), it is possible to reduce the channel resistance. This enables sufficient first and second transistors 19-1 and 19-2 on current.

The third impurity diffusion region 29 is formed on the entire part reaching from the upper surface 13a of the semiconductor substrate 13 sandwiched by the second side surfaces 18b to the bottom surface 18c of the gate electrode trench 18, so that no channel region is formed between the two the gate electrode trenches 18.

By doing this, in the case in which the placement pitch of the gate electrode trench 18 is made narrow, because when one transistor of the first and second transistors 19-1 and 19-2 is caused to be operated, the operating state thereof does not interfere with the other neighboring transistor, it is possible to operate the first and second transistors 19-1 and 19-2 independently.

Also, by forming the first impurity diffusion region 27 in the bottom parts of two respective gate electrode trenches 18 disposed so as to be neighboring to one another, and also forming the third impurity diffusion region 29 so as to cover the entire gate insulating film 21 disposed on the second side surface 18b of the two gate electrode trenches 18 and so as to be joined to the first impurity diffusion region 27, when the condition is created in which low is stored in the lower electrode 57 that is electrically connected to the first transistor 19-1 and high is stored in the lower electrode 57 that is electrically connected to the second transistor 19-2, and in this condition if on/off of the gate electrode 22 (word line) corresponding to the first transistor 19-1 is repeated, because electrons e⁻ (not shown) that are induced in the channel of the first transistor 19-1 are trapped in the first and third impurity diffusion regions 27 and 29 which are constituted by an n-type impurity, it is possible to suppress the electrons e⁻ induced in the channel of the first transistor 19-1 from reaching the second impurity diffusion region 28 (drain region) of the second transistor 19-2.

By doing this, because electrons e⁻ induced in the channel of the first transistor 19-1 do not change the high information stored in the lower electrode 57 that is electrically connected to the second transistor 19-2 by changing it to the low state, it is possible to suppress the occurrence of a disturbance failure, in which the operating state of one neighboring cell changes the stored state in another cell.

Also, even in a DRAM having a spacing between two gate electrodes 22 disposed so as to be neighboring to one another that is 50 nm or smaller, it is possible to suppress the occurrence of the above-noted disturbance failure.

Figure 15A:
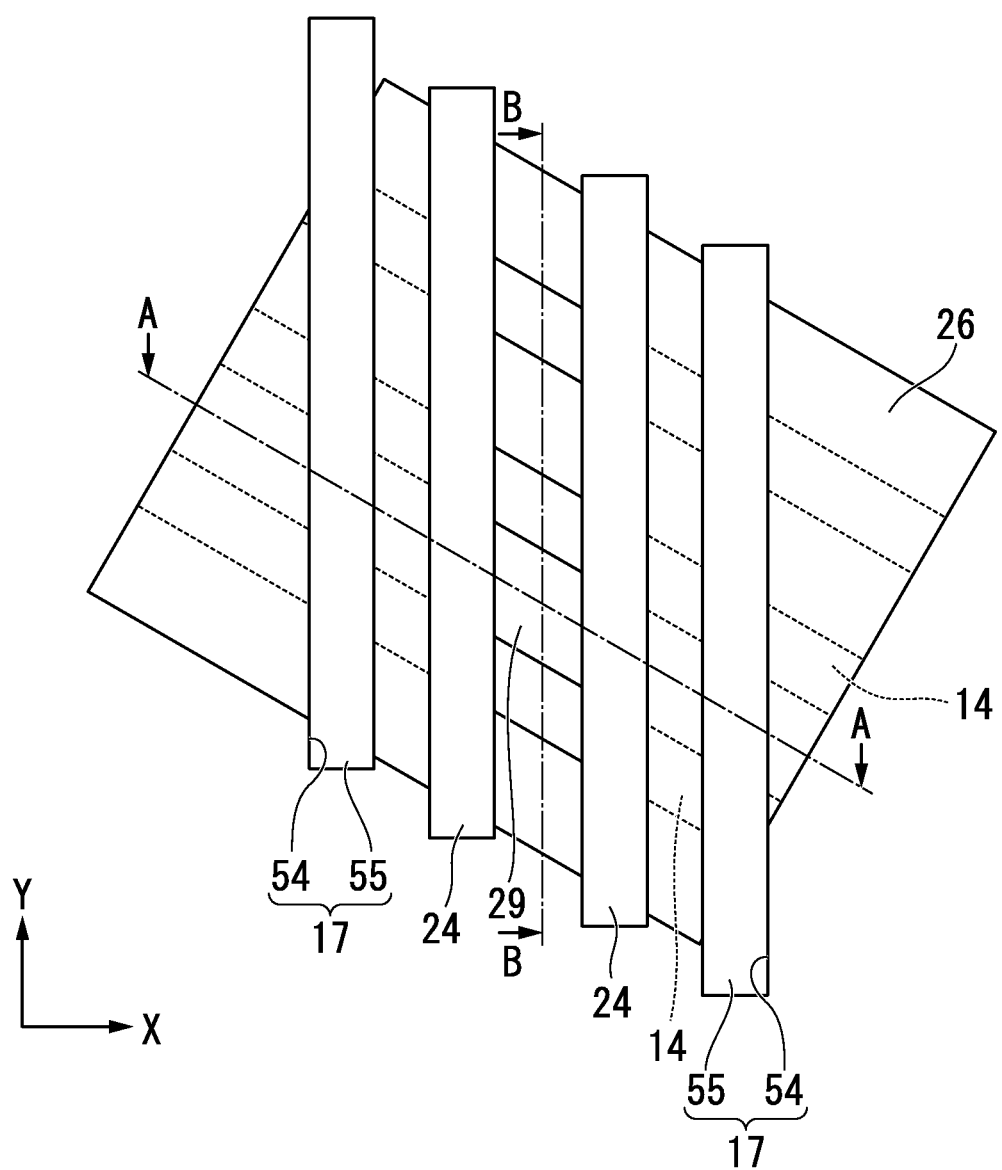
FIG. 15A is a fragmentary plan view of a step, subsequent to the step of FIGS. 14A, 14B, and 14C, involved in the method of forming the semiconductor device of FIGS. 1, 2, and 3, in accordance with one or more embodiments of the present invention.
Figure 15B:
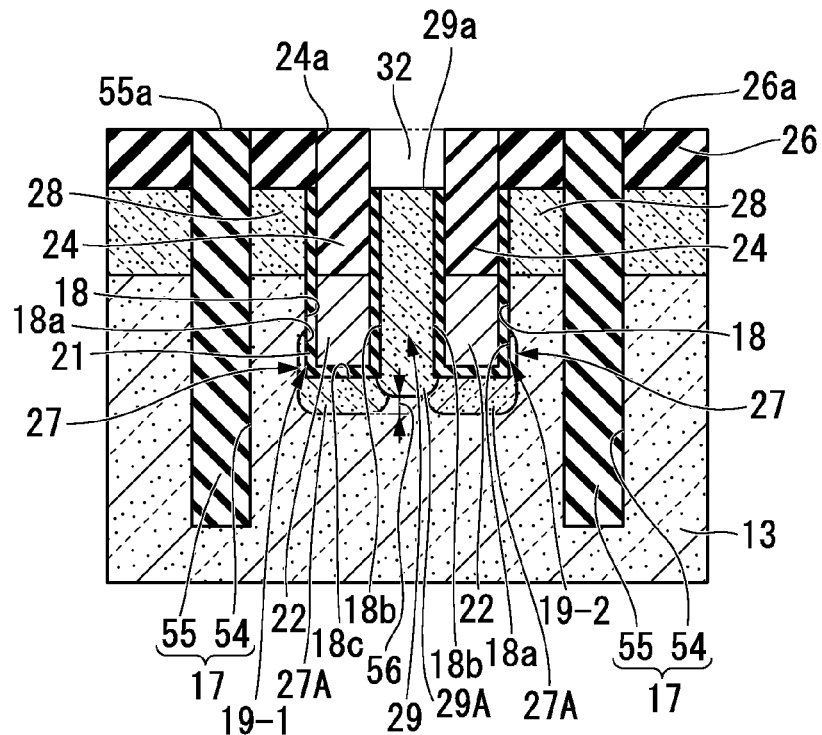
FIG. 15B is a fragmentary cross sectional elevation view of a step, subsequent to the step of FIGS. 14A, 14B, and 14C, taken along an A-A line of FIG. 15A, involved in the method of forming the semiconductor device of FIGS. 1, 2, and 3, in accordance with one or more embodiments of the present invention.
Figure 15C:
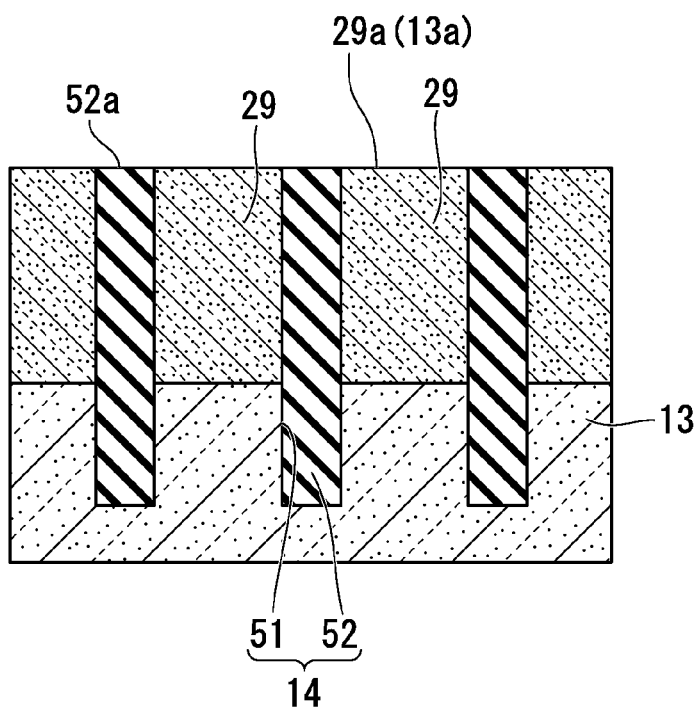
FIG. 15C is a fragmentary cross sectional elevation view of a step, subsequent to the step of FIGS. 14A, 14B, and 14C, taken along a B-B line of FIG. 15A, involved in the method of forming the semiconductor device of FIGS. 1, 2, and 3, in accordance with one or more embodiments of the present invention.

Next, in the process step shown in FIG. 15A to FIG. 15C, the photoresist 73 shown in FIG. 14A and FIG. 14B is removed.

Figure 16:
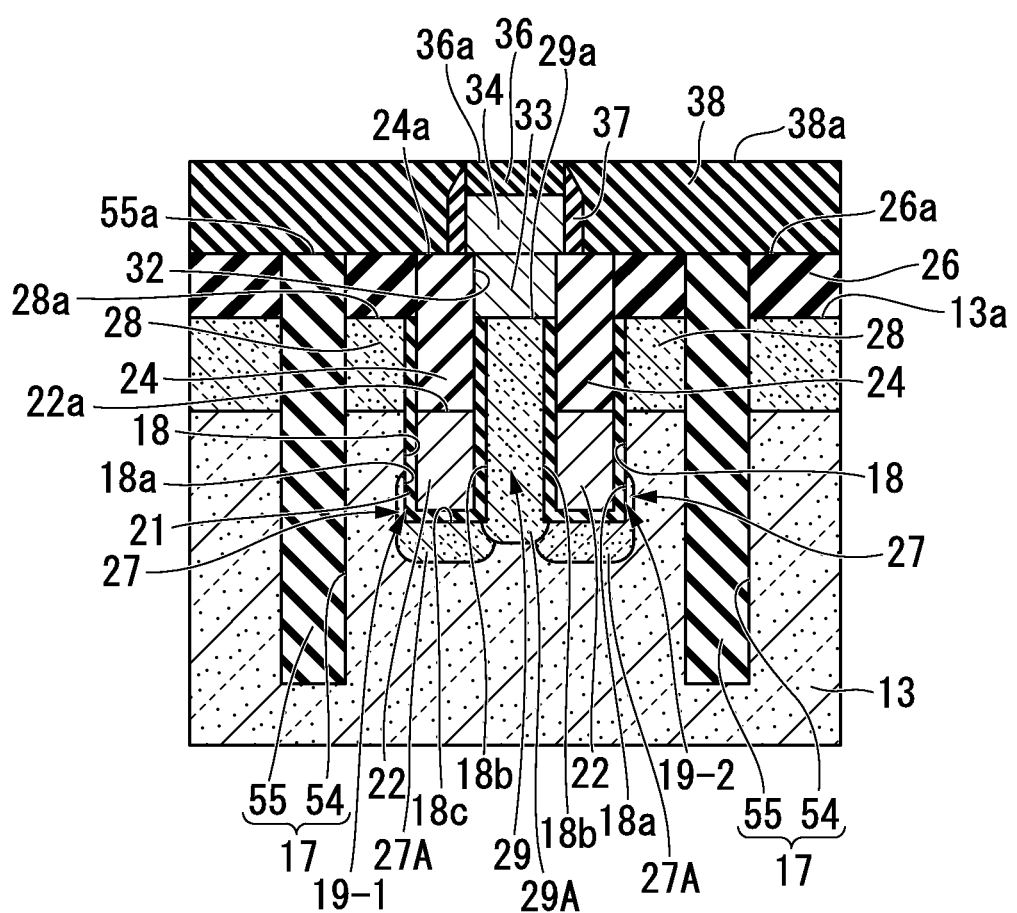
FIG. 16 is a fragmentary cross sectional elevation view of a step, subsequent to the step of FIGS. 15A, 15B, and 15C, taken along the same sectioned line as of FIG. 2, involved in the method of forming the semiconductor device of FIGS. 1, 2, and 3, in accordance with one or more embodiments of the present invention.

Next, in the process step shown in FIG. 16, the bit line contact plug 33 that is buried into the aperture part 32 and the bit line 34 (refer to FIG. 1) that is disposed on the bit line contact plug 33, extending in the X direction, are formed at one time.

Specifically, a polysilicon film, a titanium nitride film, and a tungsten film, which are not shown, are sequentially formed on the upper surface 24a of buried insulating film 24, so as to bury the aperture part 32 (at this time, the polysilicon film is formed so as to bury the aperture part 32).

Next, an unshown silicon nitride film (SiN film) that will serve as the base material for the cap insulating film 36, is formed on an unshown tungsten film.

After that, photolithography is used to form photoresist (not shown) to cover the formation region of the bit line 34 on the silicon nitride film (SiN film).

Next, by anisotropic etching (specifically, dry etching) using the photoresist as a mask, a silicon nitride film (SiN film), a tungsten film, a titanium nitride film, and a polysilicon film are patterned, thereby forming at one time the cap insulating film 36 made of a silicon nitride film (SiN film), the bit line contact plug 33 that is made of a polysilicon film and that is in contact with the upper surface 29a of the third impurity diffusion region 29, and the bit line 34 that is disposed onto the bit line contact plug 33 and that is made of a polysilicon film, a titanium nitride film, and a tungsten film.

A silicon nitride film (SiN film) and a silicon oxide film ($SiO_2$ film), which are not shown are successively laminated so as to cover the side surface of the bit line 34 and the cap insulating film 36, after which, by etching back the entire surface of the silicon oxide film ($SiO_2$ film) and the silicon nitride film (SiN film), the sidewall film 37 that covers the side surface of the cap insulating film 36 and the side surface of the bit line 34 is formed.

By doing this, because the formation of the sidewall film 37 by the sequential lamination of the silicon nitride film (SiN film) and the silicon oxide film ($SiO_2$ film) improves the wettability of the silicon oxide film (coating insulating film) when the coating insulating film (specifically, silicon oxide film ($SiO_2$)) formed by SOG is formed as the interlayer insulating film 38, it is possible to suppress an occurrence of voids in the silicon oxide film (coating insulating film).

Next, the interlayer insulating film 38 that covers the side wall film 37 and that has an upper surface 38a that is made flush with the upper surface 36a of the cap insulating film 36 is formed on the upper surface 24a of the buried insulating film 24, the upper surface 26a of the mask insulating film 26, and the upper surface 55a of the second element separation insulating film 55. By doing this, the upper surface 36a of the cap insulating film 36 is exposed from the interlayer insulating film 38.

Specifically, SOG is used to coat an insulating film (silicon oxide film ($SiO_x$ film)) onto the upper surface 24a of the buried insulating film 24, the upper surface 26a of the mask insulating film 26 and the upper surface 55a of the second element separation insulating film 55, so as to cover the sidewall film 37 is covered, and then thermal treatment is performed to make the silicon oxide film (coated insulating film) more densely packed.

Also, when the silicon oxide film (coated insulating film) is formed using the above-noted SOG, a coating liquid containing a polysilazane is used. The above-noted thermal treatment is preferably done within a water vapor atmosphere.

Next, CMP is used to polish the thermally treated silicon oxide film (coated insulating film) until the upper surface 36a of the cap insulating film 36 is exposed. By doing this, an interlayer insulating film 38 that has an upper surface 38a that is flush with the upper surface 36a of the cap insulating film 36 is formed.

Although not shown in the structure shown in FIG. 13, after polishing the above-noted silicon oxide film (coated insulating film), CVD may be used to form a silicon oxide film ($SiO_2$ film) that covers the upper surface 36a of the cap insulating film 36 and the upper surface 38a of the interlayer insulating film 38.

Figure 17:
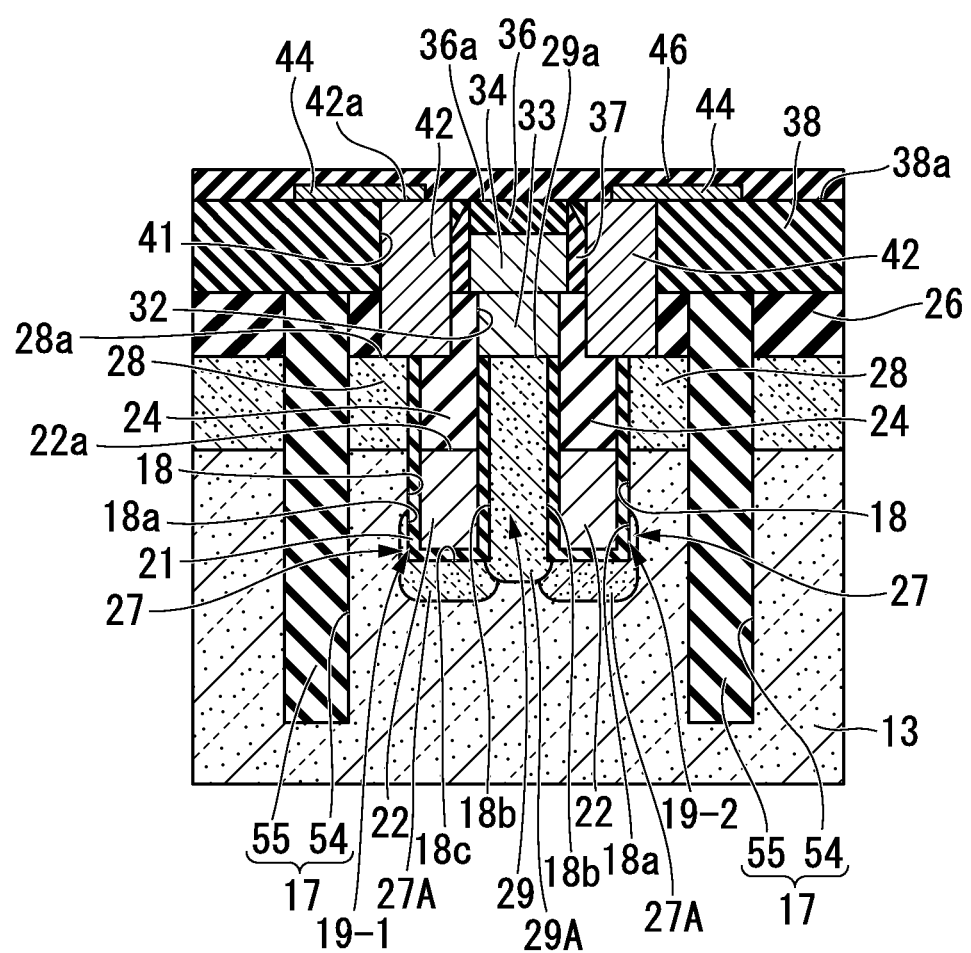
FIG. 17 is a fragmentary cross sectional elevation view of a step, subsequent to the step of FIG. 16, taken along the same sectioned line as of FIG. 2, involved in the method of forming the semiconductor device of FIGS. 1, 2, and 3, in accordance with one or more embodiments of the present invention.

Next, in the process step shown in FIG. 17, using SAC (self-aligned contact) the interlayer insulating film 38, the mask insulating film 26, the buried insulating film 24, and the gate insulating film 21 are anisotropically etched (specifically, dry etched), thereby forming the contact hole 41 exposing a part of the upper surface 28a of the second impurity diffusion region 28.

When this is done, the dry etching is separated into two steps, a step of selectively etching the silicon oxide film ($SiO_2$ film) and a step of selectively etching the silicon nitride film (SiN film).

Next, in the contact hole 41, the capacitor contact plug 42 is formed, the upper surface 42a thereof being flush with respect to the upper surface 38a of the interlayer insulating film 38 and also the lower edge thereof making contact with the upper surface 28a of the second impurity diffusion region 28.

Specifically, a titanium nitride film and tungsten film, which are not shown, are sequentially laminated using CVD, so as to bury the contact hole 41, after which CMP is used to polish so as to remove the unwanted titanium nitride film and tungsten film that are formed on the upper surface 38a of the interlayer insulating film 38, thereby forming the capacitor contact plug 42 made of the titanium nitride film and the tungsten film within the contact hole 41.

Next, the capacitor contact pad 44 that is in contact with a part of the upper surface 42a of the capacitor contact plug 42 is formed on the upper surface 38a of the interlayer insulating film 38.

Specifically, a metal film (not shown) that will serve as the base material for the capacitor contact pad 44 is formed so as to cover the upper surface 36a of the cap insulating film 36, the upper surface 42a of the capacitor contact plug 42, and the upper surface 38a of the interlayer insulating film 38.

Next, photolithography is used to form photoresist (not shown) to cover the surface corresponding to the formation region of the capacitor contact pad 44 of the upper surface of the metal film, after which, by dry etching using the photoresist as a mask, unwanted metal film exposed from the photoresist is removed, thereby forming the capacitor contact pad 44 made of the metal film. After formation of the capacitor contact pad 44, the photoresist (not shown) is removed.

Next, the silicon nitride film 46 to cover the capacitor contact pad 44 is formed on the upper surface 36a of the cap insulating film 36, the upper surface 42a of the capacitor contact plug 42, and the upper surface 38a of the interlayer insulating film 38.

Figure 18:
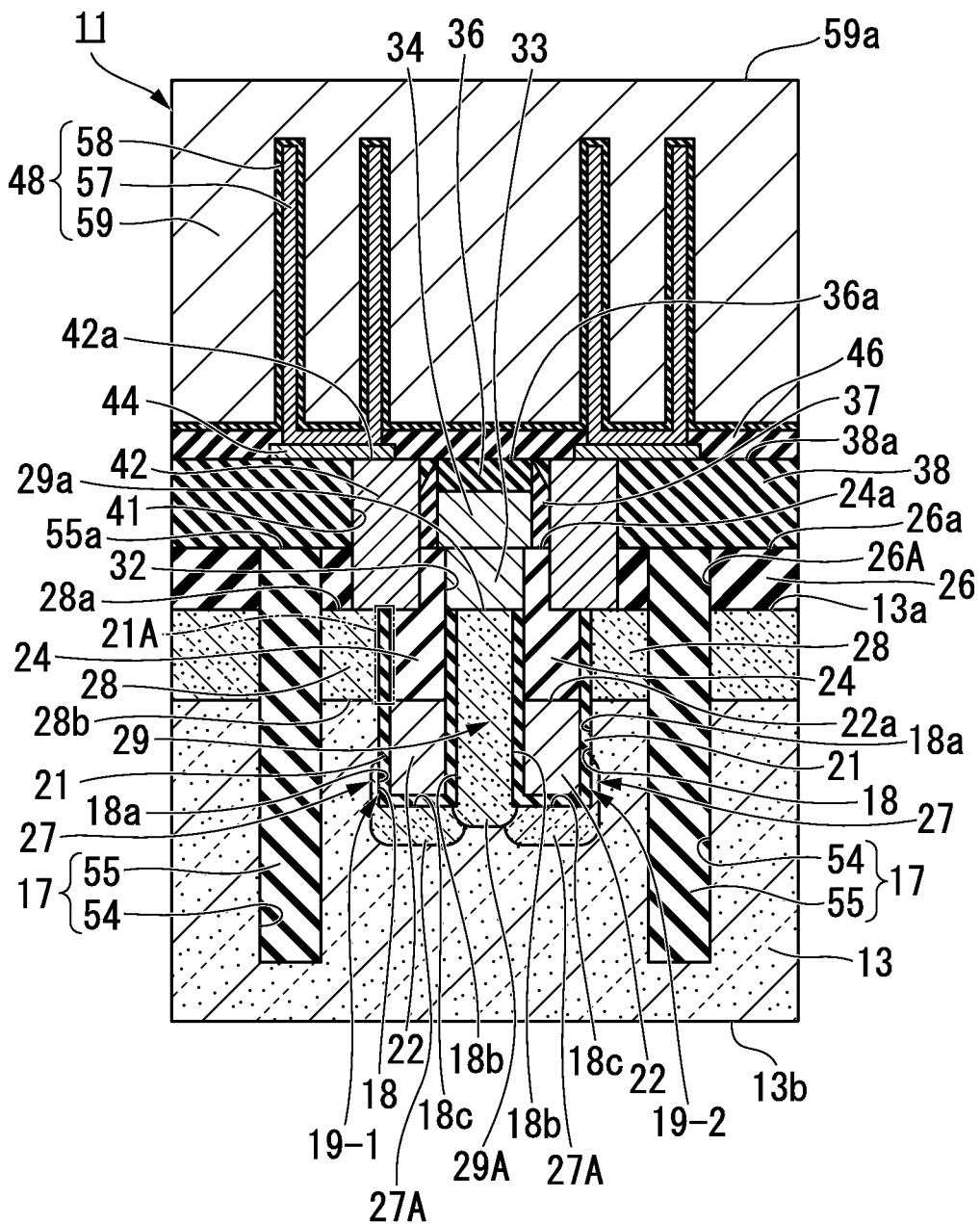
FIG. 18 is a fragmentary cross sectional elevation view of a step, subsequent to the step of FIG. 17, taken along the same sectioned line as of FIG. 2, involved in the method of forming the semiconductor device of FIGS. 1, 2, and 3, in accordance with one or more embodiments of the present invention.

Next, in the process step shown in FIG. 18, an unshown thick silicon oxide film (SiO$_2$ film), is formed on the silicon nitride film 46. The thickness of the silicon oxide film (SiO$_2$ film) can be made, for example, 1500 nm.

Next, photolithography is used to form photoresist (not shown) that is patterned on the silicon oxide film (SiO$_2$ film), after which, by dry etching using the photoresist as a mask, a silicon oxide film (not shown) formed onto the capacitor contact pad 44 and the silicon nitride film 46 are etched, thereby forming a cylinder hole (not shown) exposing the capacitor contact pad 44. After that, the photoresist (not shown) is removed.

Next, a conductive film (for example, a titanium nitride film) is formed on the inner surface of the cylinder hole (not shown) and the upper surface of the capacitor contact pad 44, thereby forming the crown-shaped lower electrode 57 made of the conductive film.

Next, wet etching is used to remove the silicon oxide film (not shown) so as to expose the upper surface of the silicon nitride film 46. Next, the capacitor insulating film 58 that covers the upper surface of the silicon nitride film 46 and the lower electrode 57 is formed.

Next, the upper electrode 59 is formed so as to cover the surface of the capacitor insulating film 58. When this is done, the upper electrode 59 is formed so that the position of the upper surface 59a of the upper electrode 59 is disposed above that of the capacitor insulating film 58. By doing this, the capacitor 48 made of the lower electrode 57, the capacitor insulating film 58, and the upper electrode 59 is formed onto each of the capacitor contact pads 44.

By doing this, the semiconductor device 10 according to the first embodiment is manufactured. Although not shown in the drawings, an interlayer insulating film, a via, an interconnect and the like, are actually formed on the upper surface 59a of the upper electrode 59.

According to the semiconductor device of the first embodiment, the first impurity diffusion region 27 is formed on the semiconductor substrate 13 positioned at the bottom part of the two gate electrode trenches 18 disposed so as to be neighboring to one another, the second impurity diffusion region 28 is formed on the semiconductor substrate 13 so as to cover the upper part 21A of the gate insulating film 21 disposed on the first side surface 18a of the two gate electrode trenches 18, and the third impurity diffusion region 29 is formed on the semiconductor substrate 13 so as to cover the entire gate insulating films 21 disposed on the second side surfaces 18b of the two gate electrode trenches 18 and so as to be joined to the first impurity diffusion region 27, thereby enabling formation of a channel region in only a part (part of the first side surface 18a), of the semiconductor substrate 13, positioned between the first impurity diffusion region 27 and the second impurity diffusion region 28, and enabling nonformation of a channel region between the first and second transistors 19-1 and 19-2.

That is, it is possible to make the channel region in which the on current flows when the first and second transistors 19-1 and 19-2 are in the on state smaller than in a conventional transistor. By doing this, even in a nanoscaled memory cell, it is possible to reduce the channel resistance and increase the on current.

Also, it is possible when one of the first and second transistors 19-1 and 19-2 operates to suppress an adverse effect that causes faulty operation of the other transistor. By doing this, even in the case in which the semiconductor device 10 is nanoscaled and the gate electrodes 22 are disposed with a narrow placement pitch, it is possible to cause independent stable operation of the first and second transistors 19-1 and 19-2.

The gate electrodes 22 is formed so as to bury each of the lower parts of the gate electrode trenches 18, with the intervening gate insulating films 21 therebetween, after which, the buried insulating film 24 covering the upper surface 22a of the gate electrode 22 is formed so as to bury each of the gate electrode trenches 18 and, by this formation, there is no protrusion of the gate electrode 22 above the surface 13a of the semiconductor substrate 13.

By doing this, in the case in which the semiconductor device 10 is a DRAM as in the first embodiment, formation of the bit line 34 and the capacitor 48 in process steps subsequent to the process step forming the gate electrode 22 can be facilitated. That is, the semiconductor device 10 can be easily manufactured.

Also, by forming the first impurity diffusion region 27 in the bottom parts of two respective gate electrode trenches 18 disposed so as to be neighboring to one another, and also forming the third impurity diffusion region 29 so as to cover the entire gate insulating film 21 disposed on the second side surface 18b of the two gate electrode trenches 18 and so as to be joined to the first impurity diffusion region 27, when the condition is created in which low is stored in the lower electrode 57 that is electrically connected to the first transistor 19-1 and high is stored in the lower electrode 57 that is electrically connected to the second transistor 19-2, and in this condition if on/off of the gate electrode 22 (word line) corresponding to the first transistor 19-1 is repeated, because electrons e$^-$ (not shown) that are induced in the channel of the first transistor 19-1 are trapped in the first and third impurity diffusion regions 27 and 29 which are constituted by an n-type impurity, it is possible to suppress the electrons e$^-$ induced in the channel of the first transistor 19-1 from reaching the second impurity diffusion region 28 (drain region) of the second transistor 19-2.

By doing this, because electrons e$^-$ induced in the channel of the first transistor 19-1 do not change the high information stored in the lower electrode 57 that is electrically connected to the second transistor 19-2 by changing it to the low state, it is possible to suppress the occurrence of a disturbance failure, in which the operating state of one neighboring cell changes the stored state in another cell.

Also, even in a DRAM having a spacing between two gate electrodes 22 disposed so as to be neighboring to one another that is 50 nm or smaller, it is possible to suppress of the occurrence of the above-noted disturbance failure.

In the first embodiment, although the cases in which a silicon oxide film (SiO$_2$ film) is used as the buried insulating film 24, and also a silicon nitride film (SiN film) is used as the mask insulating film 26 have been described as being examples, a silicon nitride film (SiN film) may be used as the buried insulating film 24 and a silicon oxide film (SiO$_2$ film) may be used as the mask insulating film 26.

By doing this, in the process step shown in FIG. 17, when forming the contact hole 41, because a silicon nitride film (SiN film) that will serve as the buried insulating film 24 functions as an etching stopper, the contact hole 41 does not expose the upper surface 22a of the gate electrode 22, it is possible to prevent the capacitor contact pad 44 and the gate electrode 22 from electrically connecting via the capacitor contact plug 42 that is formed in the contact hole 41.

Also, in the first embodiment, when forming the second impurity diffusion region 28 (refer to FIG. 12), although the case of formation of the impurity diffusion region 71 that will become a part of the third impurity diffusion region 29 is described as an example, in the process step shown in FIG. 12, the second impurity diffusion region 28 may be formed by ion implanting an n-type impurity selectively into only the semiconductor substrate 13 corresponding to the formation region of the second impurity diffusion region 28, after which, in the process step shown in FIG. 13, the third impurity diffusion region 29 may be formed by ion implanting an n-type impurity selectively into only the semiconductor substrate 13 corresponding to the formation region of the third impurity diffusion region 29.

Also, the semiconductor device 60 that is a variation example of the first embodiment (refer to FIG. 4), in the already-described process step shown in FIG. 14, with the exception of forming the bottom part 29A of the third impurity diffusion region 29 to cause it to protrude further than the bottom part 27A of the first impurity diffusion region 27 toward the rear surface 13b of the semiconductor substrate 13, and forming the step 62 between the bottom part 27A of the first impurity diffusion region 27 and the bottom 29A of the third impurity diffusion region 29, can be manufactured in the same manner as the method for manufacturing the semiconductor device 10 of the first embodiment.

Second Embodiment

Figure 19:
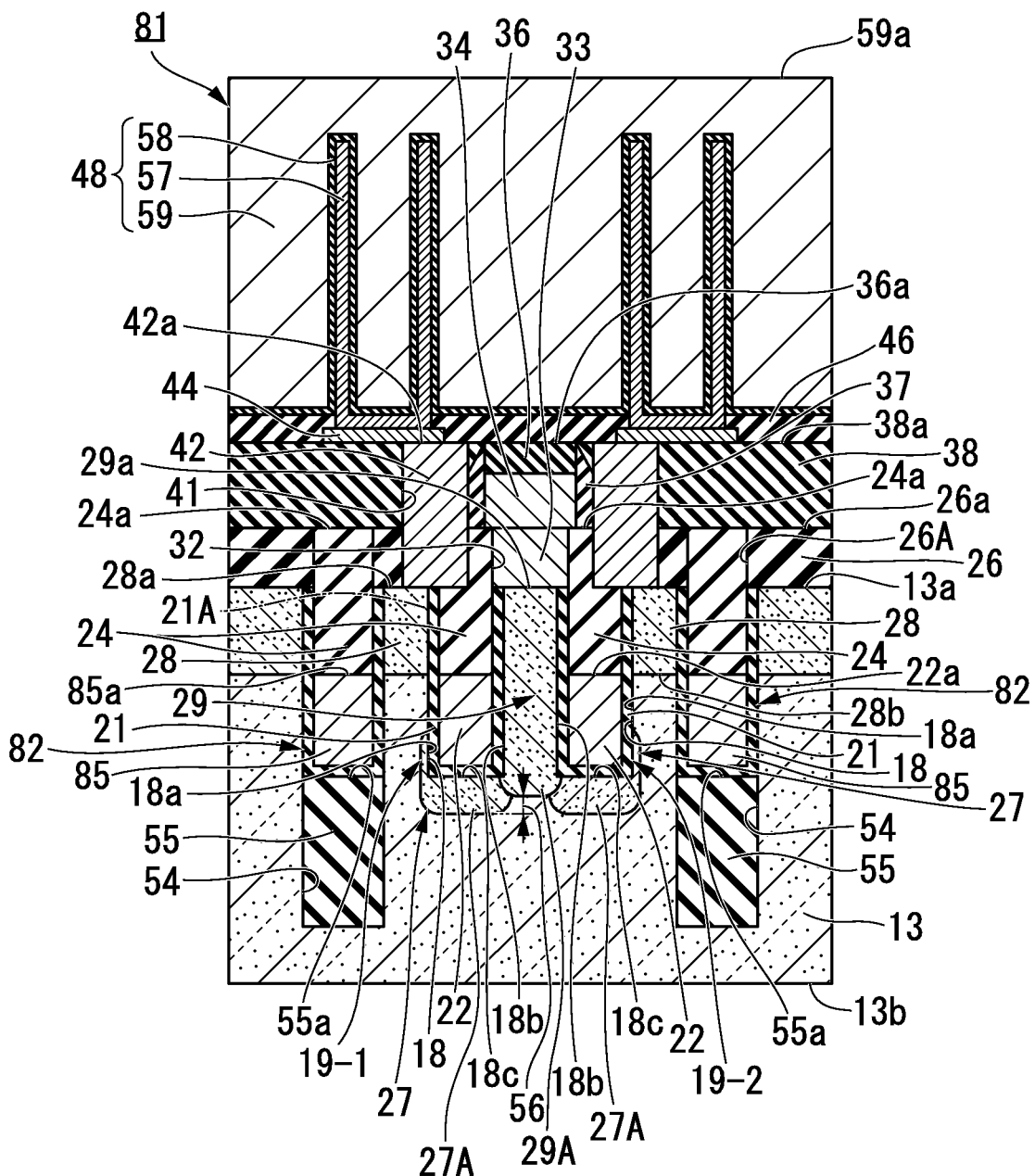
FIG. 19 is a fragmentary cross sectional elevation view of a memory cell array of a semiconductor device in accordance with other embodiments of the present invention.

FIG. 19 is a cross-sectional view of a memory cell array provided in a semiconductor device according to the second embodiment of the present invention, corresponding to the cross-section along the direction of line A-A in FIG. 1.

In FIG. 19, a DRAM is given as an example of a semiconductor device 80 according to the second embodiment and, in FIG. 19, the bit line 34 that actually extends in the X direction shown in FIG. 1 is shown in schematic form. Additionally, constituent elements in FIG. 19 that are the same as those in the semiconductor device 10 of the first embodiment shown in FIG. 2 are assigned the same reference symbols and the descriptions thereof are omitted herein.

Referring to FIG. 19, the semiconductor device 80 according to the second embodiment, in place of the memory cell array 11 provided in the semiconductor device 10 of the first embodiment, has a memory cell array 81, with other aspects of its constitution being the same as in the semiconductor device 10.

The memory cell array 81, rather than having the second element separation region 17 that is provided in the memory cell array 11 described with regard to first embodiment, has a second element separation region 82, with other aspects of its constitution being the same as in the memory cell array 11.

The second element separation region 82 is constituted by the second element separation trench 54, a second element separation insulating film 55, the gate insulating film 21, a dummy gate electrode 85, and the buried insulating film 24.

The second element separation insulating film 55 is provided so as to bury the lower part of the second element separation trench 54. The upper surface 55a of the second element separation insulating film 55 is made to be substantially flush with respect to the bottom surface 18c of the gate electrode trench 18.

The gate insulating film 21 is provided so as to cover the upper side surface of the second element separation trench 54 and the upper surface 55a of the second element separation insulating film 55.

The dummy gate electrode 85 is provided in the second element separation trench 54 positioned over the second element separation insulating film 55, with the gate insulating film 21 intervening therebetween. The dummy gate electrode 85 has the same structure as the gate electrode 22.

Specifically, the dummy gate electrode 85 can be made to have a laminated structure of, for example, the successive lamination of a titanium nitride film and a tungsten film. The upper surface 85a of the dummy gate electrode 85 is made to be substantially flush with respect to the upper surface 22a of the gate electrode 22. The dummy gate electrode 85 is an electrode that is driven independently of the gate electrode 22.

The buried insulating film 24 is provided so as to bury the second element separation trench 54 positioned over the dummy gate electrode 85, with an intervening gate insulating film 21 therebetween, and also so as to bury the aperture part 26A.

By doing this, the buried insulating film 24 covers the upper surface 85a of the dummy gate electrode 85 and protrudes from the surface 13a of the semiconductor substrate 13.

The upper surface 24a of the buried insulating film 24 is made a flat surface, and is made to be substantially flush with respect to the upper surface 26a of the mask insulating film 26.

According to the semiconductor device of the second embodiment, by providing the dummy gate electrode 85 that can have its potential changed independently form the gate electrode 22, taking the first and second transistors 19-1 and 19-2 formed in the element formation region R and the first and second transistors 19-1 and 19-2 formed in the element formation region R disposed at a position that is neighboring to the above-noted element formation region R as a part of constitution of the second element separation regions 17 that separates in the second direction, it is possible to reduce the difference in potential between the second impurity diffusion region 28 and the dummy gate electrode 85 and to reduce the junction leakage current.

By doing this, in the case in which the semiconductor device 80 is a DRAM, it is possible to improve the DRAM storage characteristics.

The semiconductor device 80 of the second embodiment constituted as noted above can achieve the same effect as that of the semiconductor device 10 of the first embodiment.

Specifically, in the case in which the placement pitch of the gate electrode trenches 18 is made narrow, when operating one of the first and second transistors 19-1 and 19-2, because the operating state thereof does not interfere with the other neighboring transistor, it is possible to operate the first and second transistors 19-1 and 19-2 independently, and possible to suppress the occurrence of a disturbance failure in which the operating state of one neighboring cell causes the stored state in the other cell to change.

Figure 20:
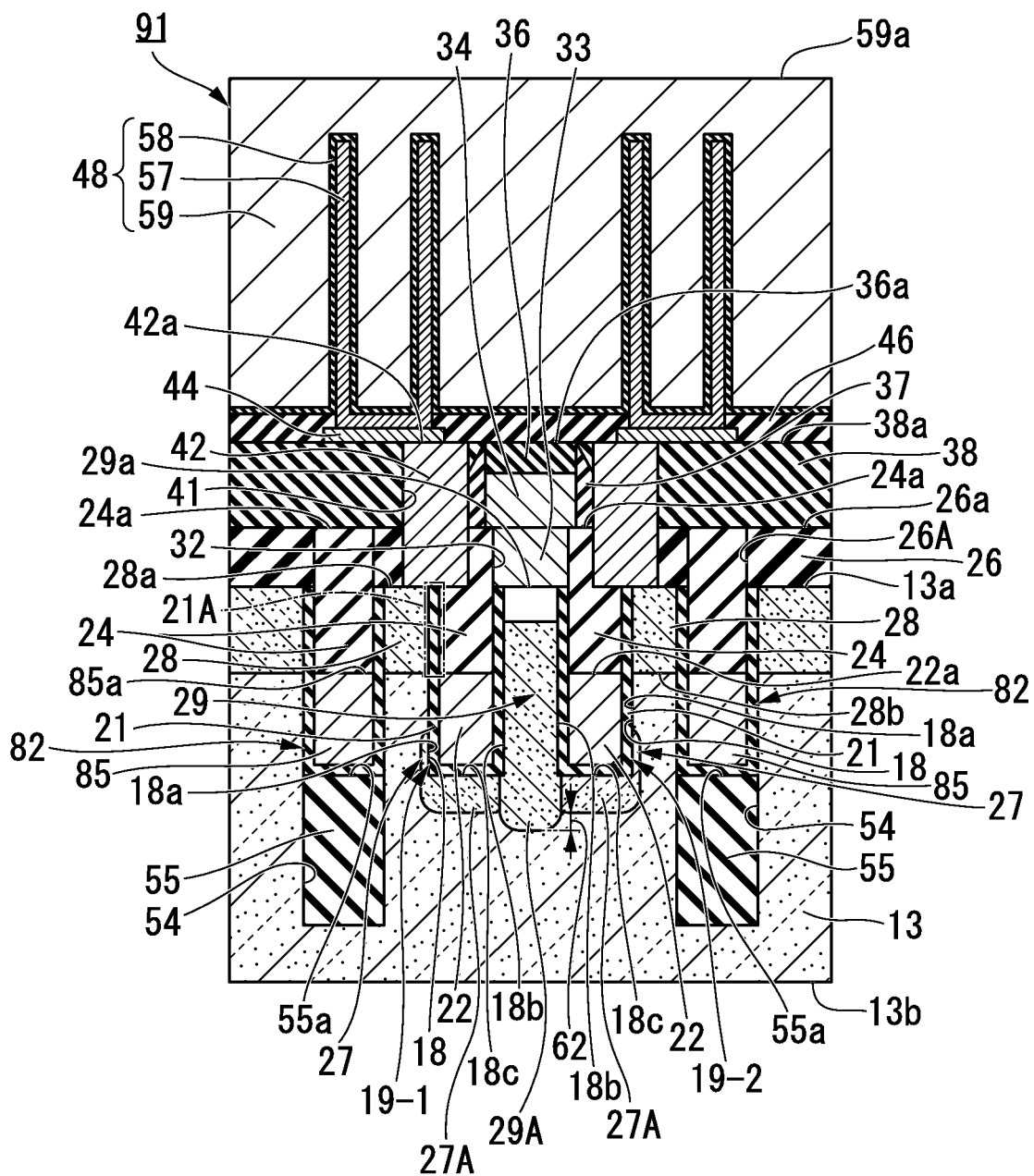
FIG. 20 is a fragmentary cross sectional elevation view of a memory cell array of the semiconductor device in accordance with a further modified embodiment to the other embodiments of the present invention.

FIG. 20 is a cross-sectional view showing the general constitution of a memory cell array provided in a semiconductor device that is a variation example of the second embodiment of the present invention. The cross-section shown in FIG. 20 corresponds to the cross-section of the memory cell array shown in FIG. 19. In FIG. 20, constituent parts that are the same as in the semiconductor device 80 of the second embodiment shown in FIG. 19 are assigned the same reference symbols. In FIG. 20, a DRAM is given as an example of the semiconductor device 90 that is a variation example of the second embodiment.

Referring to FIG. 20, a memory cell array 91 that is provided in the semiconductor device 90 that is a variation example of the second embodiment, with the exception of causing the bottom part 29A of the third impurity diffusion region 29 provided in memory cell array 81 of the already-described the semiconductor device 80 of the second embodiment to protrude further from the bottom part 27A of the first impurity diffusion region 27 toward the rear surface 13b of the semiconductor substrate 13, thereby providing a step 62 between the bottom part 27A of the first impurity diffusion region 27 and the bottom 29A of the third impurity diffusion region 29, is constituted the same as the memory cell array 81.

According to the semiconductor device of the variation example of the second embodiment, by having a third impurity diffusion region 29 that is joined to the first impurity diffusion region 27 and that protrudes from the bottom part 27A of the first impurity diffusion region 27 toward the rear surface 13b side of the semiconductor substrate 13, when the condition is created in which low is stored at the lower electrode 57 that is electrically connected to the first transistor 19-1 and high is stored at the lower electrode 57 that is electrically connected to the second transistor 19-2, and in this condition if on/off of the gate electrode 22 (word line) corresponding to the first transistor 19-1 is repeated, electrons e⁻ (not shown) that are induced in the channel of the first transistor 19-1 and that are not trapped by the first impurity diffusion region 27 can be trapped at the bottom part 29A of the third impurity diffusion region 29.

That is, compared with the constitution of the semiconductor device 10 of the first embodiment; it is possible to improve the probability of trapping electrons e⁻ (not shown) induced in the channel of the first transistor 19-1.

By doing this, because electrons e⁻ that are induced in the channel of the first transistor 19-1 do not destroy the high information stored at the lower electrode 57 that is electrically connected to the second transistor 19-2 by changing it to the low state, it is possible to accurately suppress the occurrence of a disturbance failure, in which the operating state of one neighboring cell changes the stored state in another cell.

The semiconductor device 90 that is a variation example of the second embodiment can achieve the same effect as the semiconductor device 80 of the second embodiment.

Specifically, by providing as part of the constitution of the second element separation region 17 the dummy gate electrode 85 that can have its potential changed independently from the gate electrode 22, it is possible to reduce the difference in potential between the second impurity diffusion region 28 and the dummy gate electrode 85 and to reduce the junction leakage current, thereby improving the DRAM storage characteristics in the case in which the semiconductor device 80 is a DRAM.

The above-noted semiconductor device semiconductor device 90 of the variation example of the second embodiment can achieve the same effect as the semiconductor device 10 of the first embodiment.

Specifically, in the case in which the placement pitch of the gate electrode trench 18 is made narrow, when one of the transistors of the first and second transistors 19-1 and 19-2 is operated, because the operating state thereof does not interfere with the other, neighboring transistor, it is possible to operate the first and second transistors 19-1 and 19-2 independently.

FIG. 21A to FIG. 21C, FIG. 22A to FIG. 22C, FIG. 23A to FIG. 23C, and FIG. 24 are drawings that show the process steps for manufacturing a memory cell array provided in the semiconductor device according to the second embodiment of the present invention.

Figure 21A:
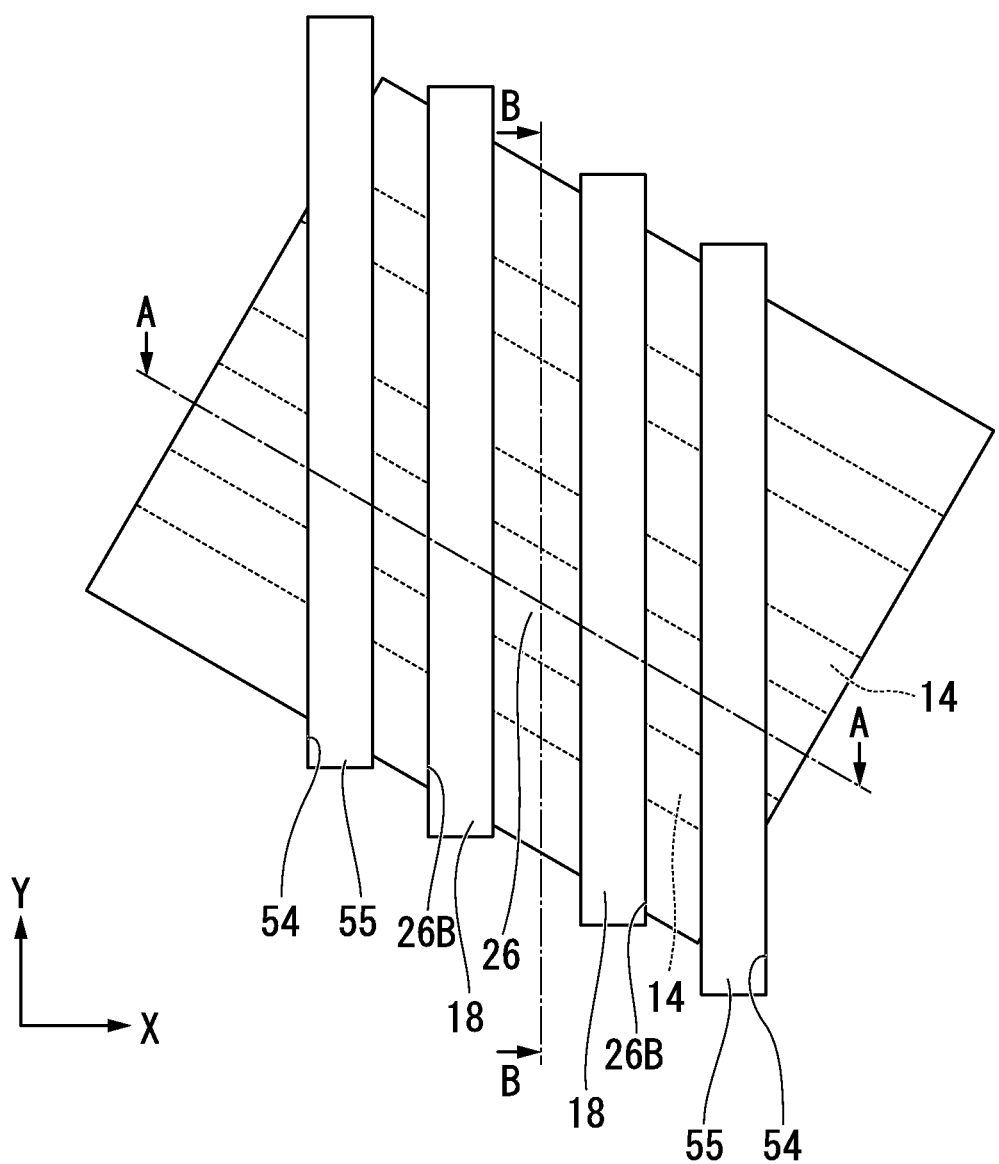
FIG. 21A is a fragmentary plan view of a step involved in a method of forming the semiconductor device of FIG. 20 in accordance with the other embodiments of the present invention.
Figure 22A:
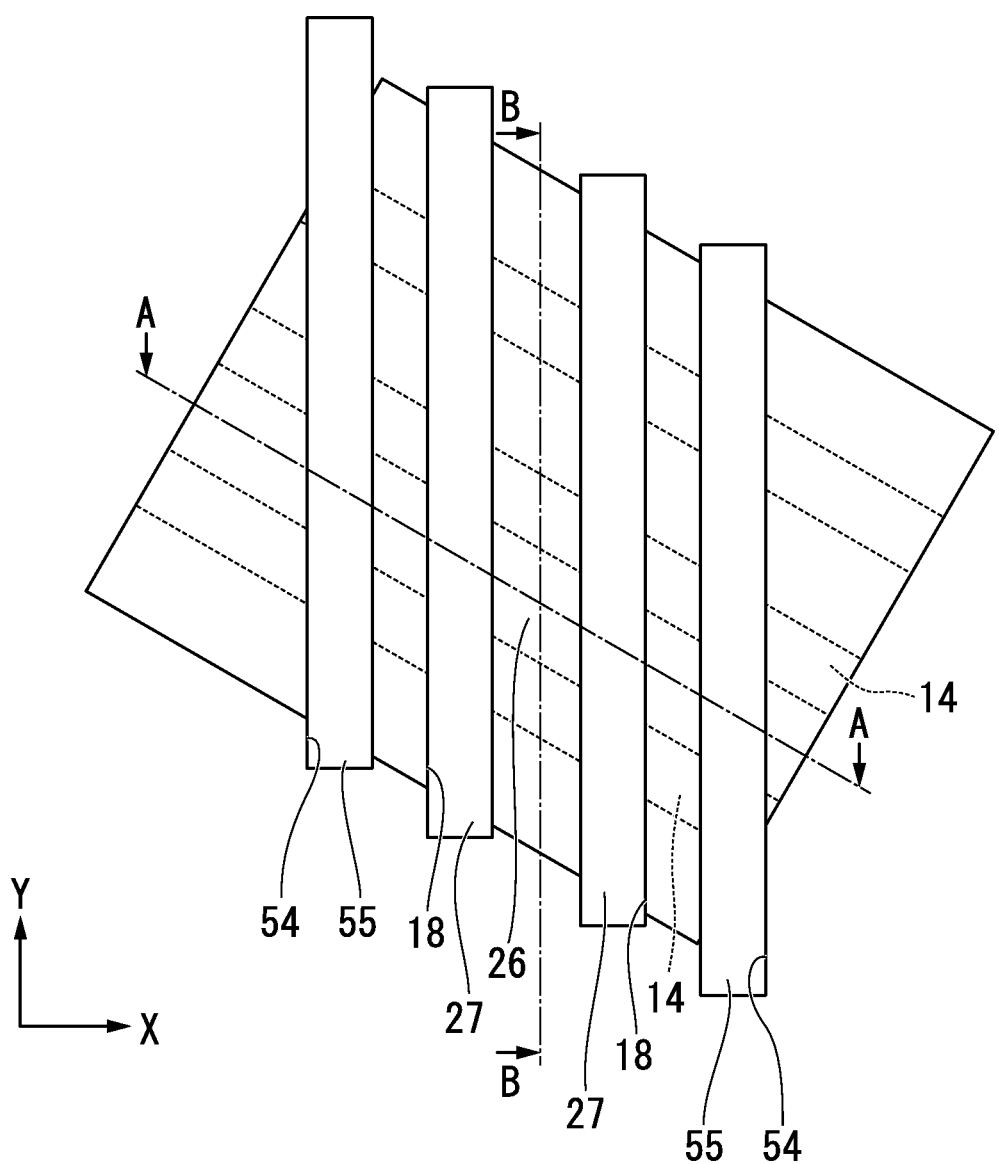
FIG. 22A is a fragmentary plan view of a step, subsequent to the step of FIGS. 21A, 21B and 21C, involved in a method of forming the semiconductor device of FIG. 20 in accordance with the other embodiments of the present invention.
Figure 23A:
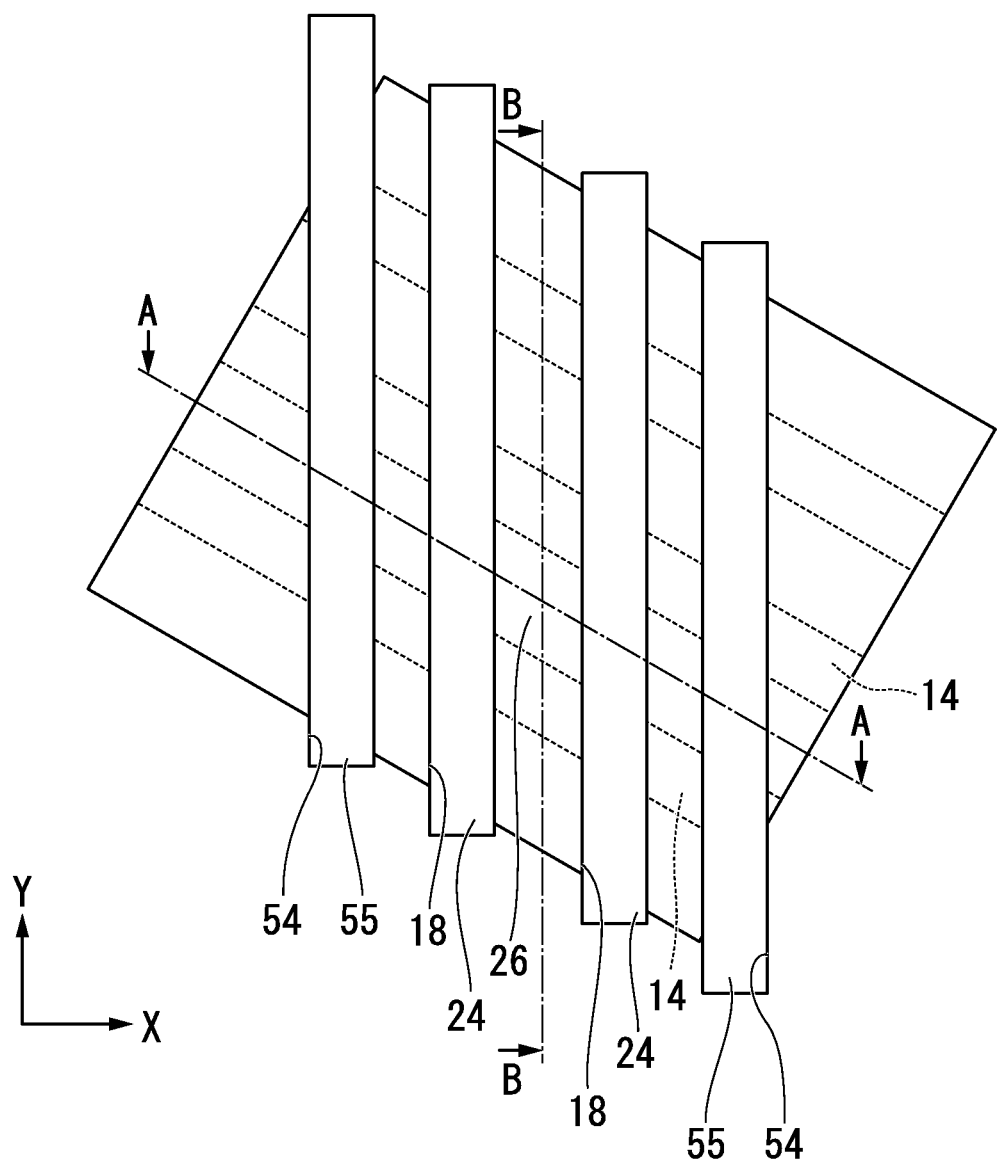
FIG. 23A is a fragmentary plan view of a step subsequent to the step of FIGS. 22A, 22B and 22C, involved in a method of forming the semiconductor device of FIG. 20 in accordance with the other embodiments of the present invention.
Figure 24:
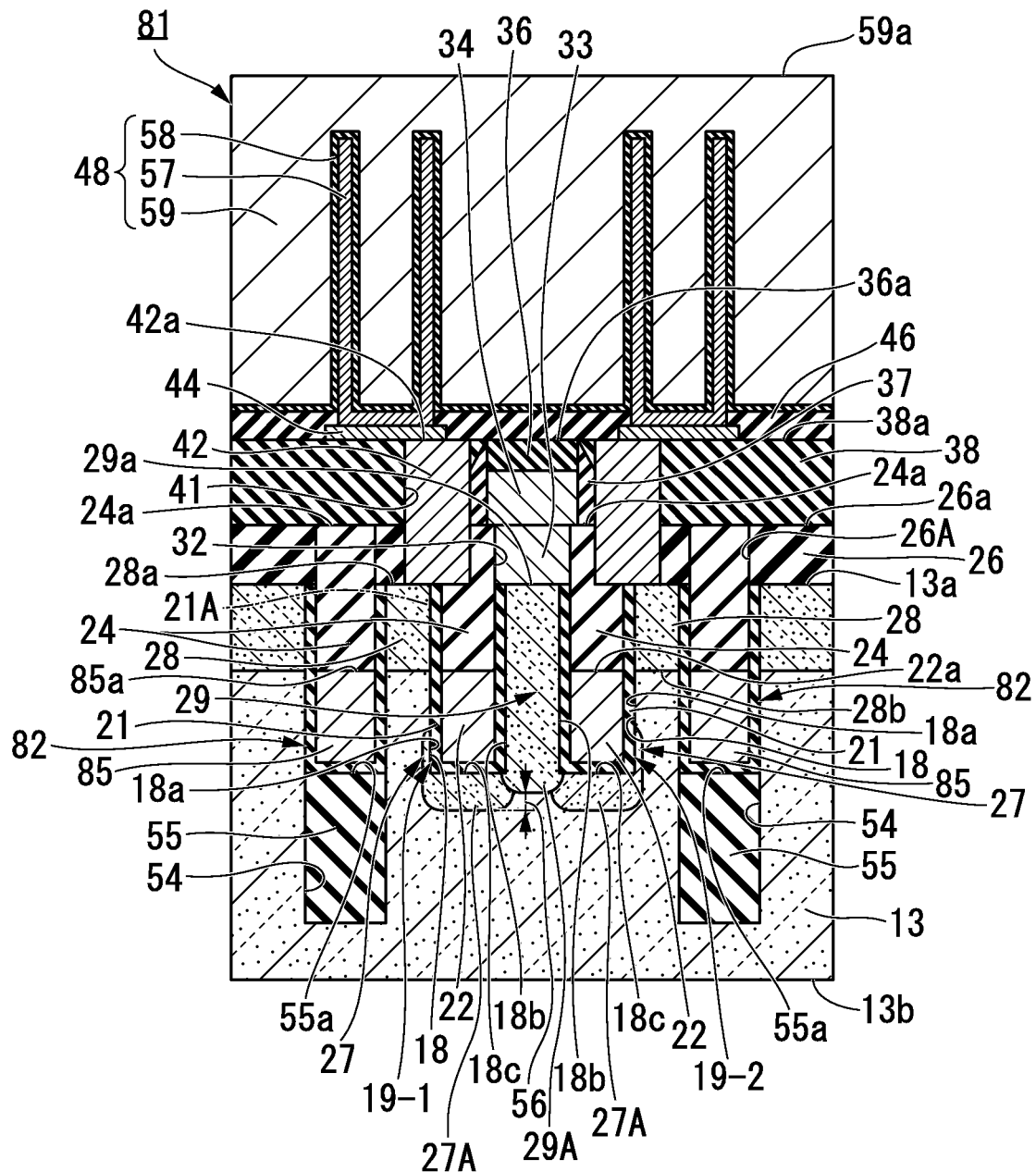
FIG. 24 is a fragmentary cross sectional elevation view of a step, subsequent to the step of FIGS. 23A, 23B and 23C, taken along the same sectioned line as of FIG. 19, involved in the method of forming the semiconductor device of FIG. 20, in accordance with the other embodiments of the present invention.

The lines A-A shown in FIG. 21A, FIG. 22A, and FIG. 23A corresponds to the line A-A shown in FIG. 1. FIG. 24 is a cross-sectional view that corresponds to the cross-section of the semiconductor device 80 shown in FIG. 80.

The method for manufacturing the semiconductor device 80 of the second embodiment (specifically, the memory cell array 81) will be described, referring mainly to FIG. 21A to FIG. 21C, FIG. 22A to FIG. 22C, FIG. 23A to FIG. 23C, and FIG. 24.

First, by performing processing that is the same as the process steps from FIG. 5A to FIG. 5C to the process steps of FIG. 9A to FIG. 9C described with regard to the first embodiment, a structure similar to that shown in FIG. 9A to FIG. 9C is formed (specifically, the structure shown in FIG. 9A and FIG. 9B with the element of reference symbol 17 (the second element separation region 17) removed).

Figure 21B:
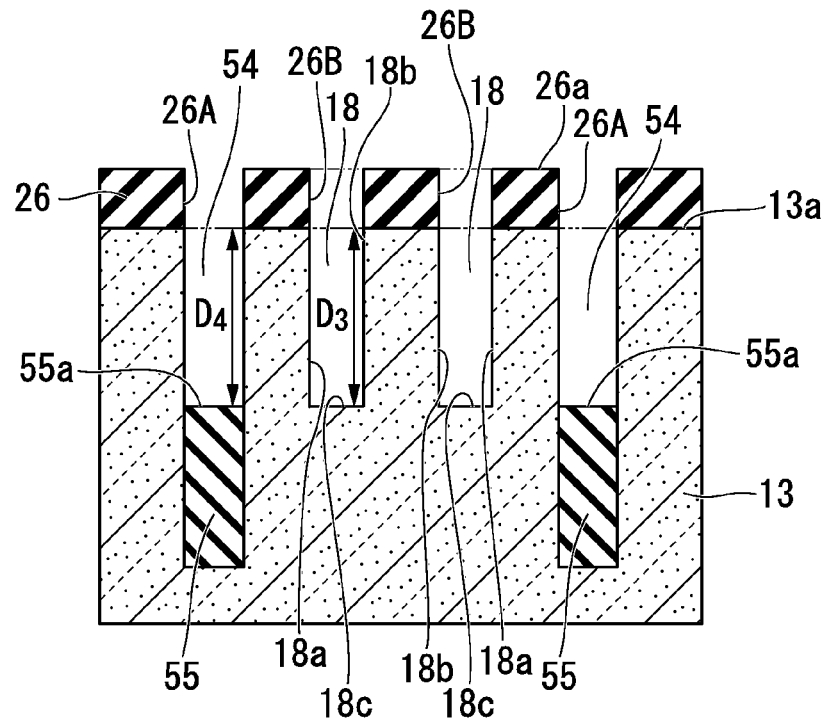
FIG. 21B is a fragmentary cross sectional elevation view of a step, taken along an A-A line of FIG. 21A, involved in the method of forming the semiconductor device of FIG. 20, in accordance with the other embodiments of the present invention.
Figure 21C:
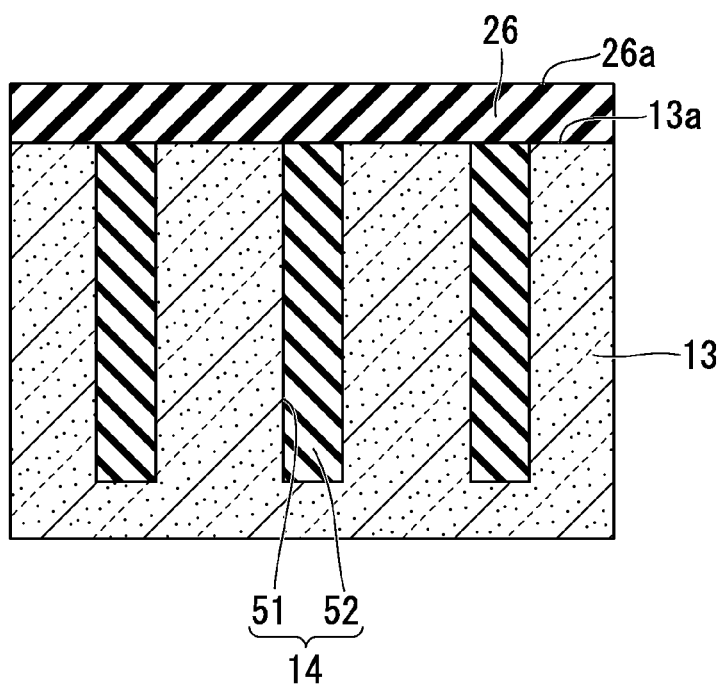
FIG. 21C is a fragmentary cross sectional elevation view of a step, taken along a B-B line of FIG. 21A, involved in the method of forming the semiconductor device of FIG. 20, in accordance with the other embodiments of the present invention.

Next, in the process step shown in FIG. 21A to FIG. 21C, the upper surface 55a of the second element separation insulating film 55 after etching back is made to be substantially flush with respect to the bottom surface 18c of the gate electrode trench 18 by selectively etching back the second element separation insulating film 55 shown in FIG. 9B. By doing this, the second element separation insulating film 55 that buries the lower part of the gate electrode trench 18 is formed.

The depth $D_4$ of the upper surface 55a of the second element separation insulating film 55 after etching back, referenced to the surface 13a of the semiconductor substrate 13, is substantially equal to the depth $D_3$ of the gate electrode trench 18.

Figure 22B:
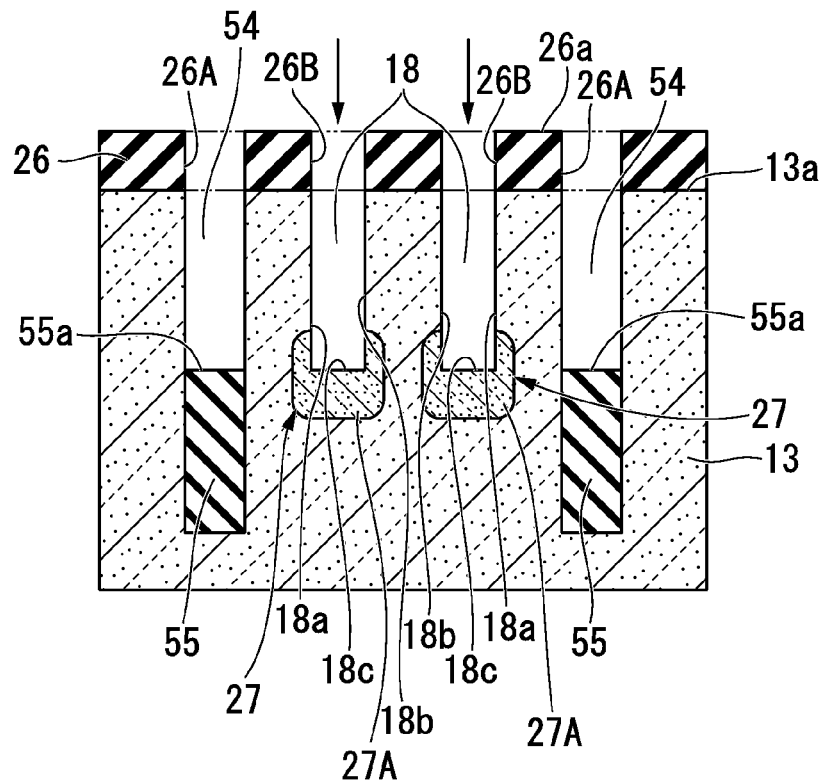
FIG. 22B is a fragmentary cross sectional elevation view of a step, taken along an A-A line of FIG. 22A, involved in the method of forming the semiconductor device of FIG. 20, in accordance with the other embodiments of the present invention.
Figure 22C:
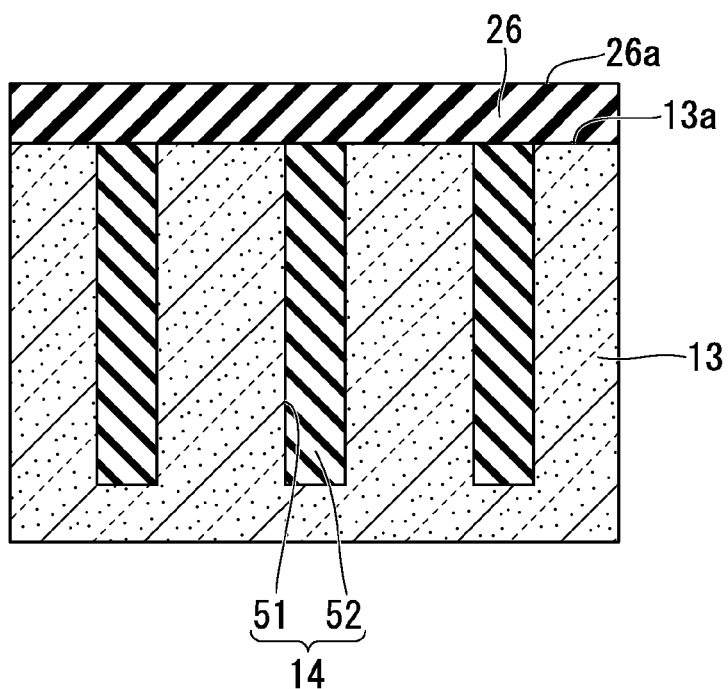
FIG. 22C is a fragmentary cross sectional elevation view of a step, taken along a B-B line of FIG. 22A, involved in the method of forming the semiconductor device of FIG. 20, in accordance with the other embodiments of the present invention.

Next, in the process step shown in FIG. 22A to FIG. 22C, photoresist (not shown) is formed so as to bury the second element separation trench 54, so that n-type ion implantation is not done to the semiconductor substrate 13 exposed at the top part of the second element separation trench 54.

Next, using a method that is similar to the process step shown in FIG. 10A to FIG. 10C described with regard to the first embodiment, a first impurity diffusion region 27 is formed at the bottom part of each of the gate electrode trenches 18, after which the photoresist (not shown) is removed.

Figure 23B:
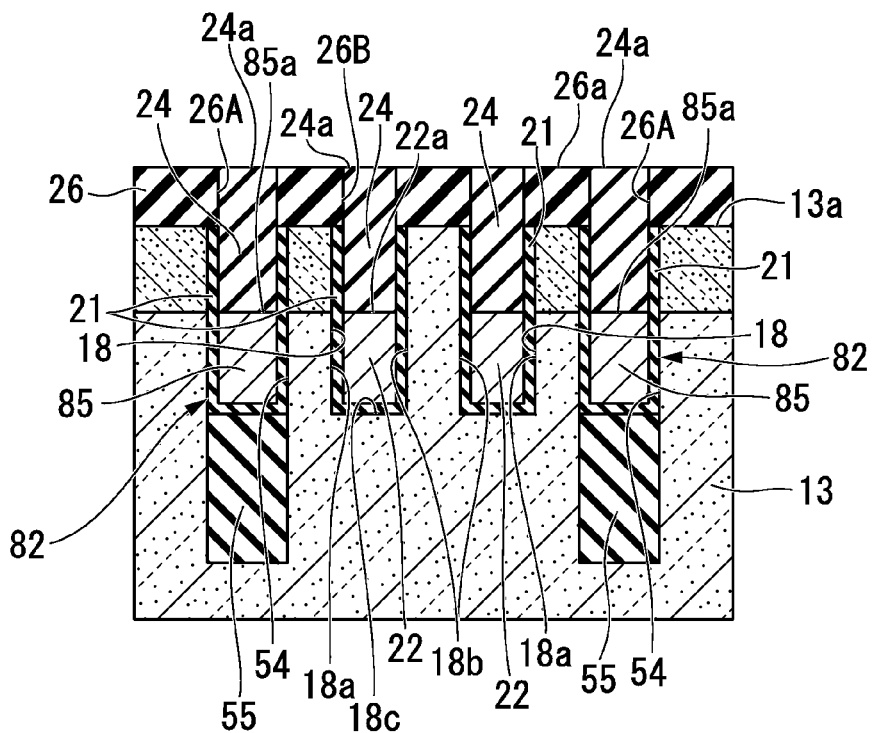
FIG. 23B is a fragmentary cross sectional elevation view of a step, taken along an A-A line of FIG. 23A, involved in the method of forming the semiconductor device of FIG. 20, in accordance with the other embodiments of the present invention.
Figure 23C:
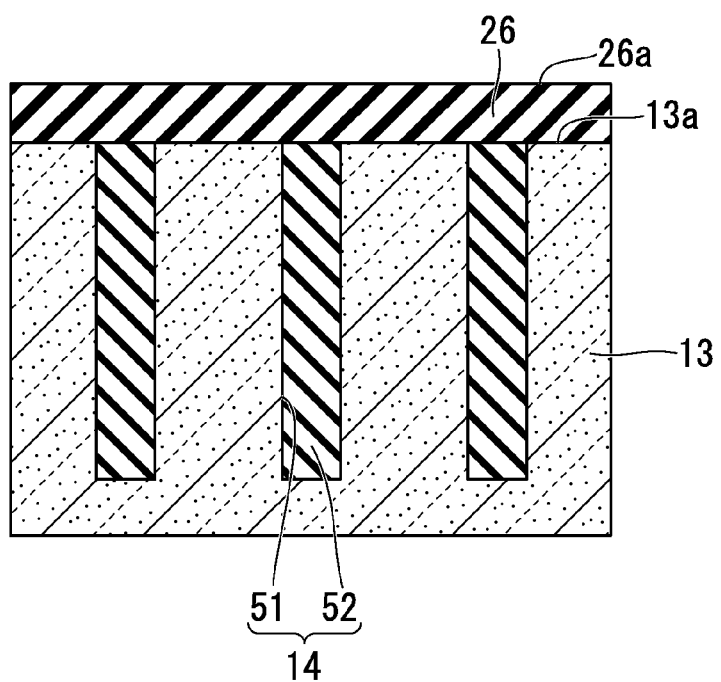
FIG. 23C is a fragmentary cross sectional elevation view of a step, taken along a B-B line of FIG. 23A, involved in the method of forming the semiconductor device of FIG. 20, in accordance with the other embodiments of the present invention.

Next, in the process step shown in FIG. 23A to FIG. 23C, the gate insulating film 21 is formed so as to cover the first and second side surfaces 18a and 18b and the bottom surface 18c of each gate electrode trench 18, and the top inner surface of the second element separation trench 54 (including the upper surface 55a of the second element separation insulating film 55).

Next, a conductive film that will serve as the base material for the gate electrode 22 and the dummy gate electrode 85 is formed so as to bury the gate electrode trench 18 and the second element separation trench 54 formed in the gate insulating film 21, after which, by etching back the conductive film so that the upper surfaces 22a and 85a are lower than the surface 13a of the semiconductor substrate 13, the gate electrode 22 that is disposed in the gate electrode trench 18 and the dummy gate electrode 85 that is disposed in the second element separation trench 54 are formed at one time.

A TiN/W laminated film formed by the successive lamination of a titanium nitride film and a tungsten film can be, for example, used as the conductive film that serves as the base material for the gate electrode 22 and the dummy gate electrode 85. Each of the gate electrodes 22 constitutes a word line of the memory cell.

Next, the buried insulating film 24 that covers the upper surface 22a of the gate electrode 22 and the upper surface 85a of the dummy gate electrode 85, and that also buries the gate electrode trench 18, the second element separation trench 54, and the trench-shaped aperture parts 26A and 26B is formed.

Specifically, the top part of the gate electrode trench 18, the top part of the second element separation trench 54, and the aperture parts 26A and 26B are buried with an insulating film (for example, a silicon oxide film (SiO₂ film)) formed by HDP CVD or an insulating film (for example, a silicon oxide film (SiO₂ film)) formed by coating using the SOG method.

Next, the insulating film deposited above the upper surface 26a of the mask insulating film 26 is removed using CMP. By doing this, the buried insulating film 24 that is constituted by a insulating film (for example a silicon oxide film (SiO₂ film) that buries the gate electrode trench 18, the second element separation trench 54, and the aperture parts 26A and 26B, and that also has an upper surface 24a that is made to be substantially flush with respect to the upper surface 26a of the mask insulating film 26 is formed.

Next, as shown in FIG. 24, the semiconductor device 80 of the second embodiment that has the memory cell array 81 is formed by sequentially performing the processing steps shown in FIG. 12A to FIG. 12C, FIG. 13A to FIG. 13C, FIG. 14A to FIG. 14C, FIG. 15A to FIG. 15C, FIG. 16, FIG. 17, and FIG. 18, where were described with regard to the first embodiment.

According to the method for manufacturing a semiconductor device of the second embodiment, with the first and second transistors 19-1 and 19-2 formed in the element formation region R and the first and second transistors 19-1 and 19-2 formed in an element formation region R that is disposed in a position neighboring to the above-noted element formation region R as a part of the constitution of the second element separation region 17 that separates in the second direction, by forming the dummy gate electrode 85, the potential on which can be varied independently with respect to the gate electrode 22, it is possible to reduce the potential difference between the second impurity diffusion region 28 and the dummy gate electrode 85, and to reduce the junction leakage current.

By doing this, in the case in which the semiconductor device 80 is a DRAM, it is possible to improve the DRAM storage characteristics.

By doing this, the method for manufacturing the semiconductor device 80 of the above-noted second embodiment can achieve the same effect as the method for manufacturing the semiconductor device 10 of the first embodiment.

Although preferred embodiments of the present invention have been described in detail above, the present invention is not limited to the specific embodiments, and various modifications and changes are possible, within the spirit of the present invention described in the claims.

Figure 25:
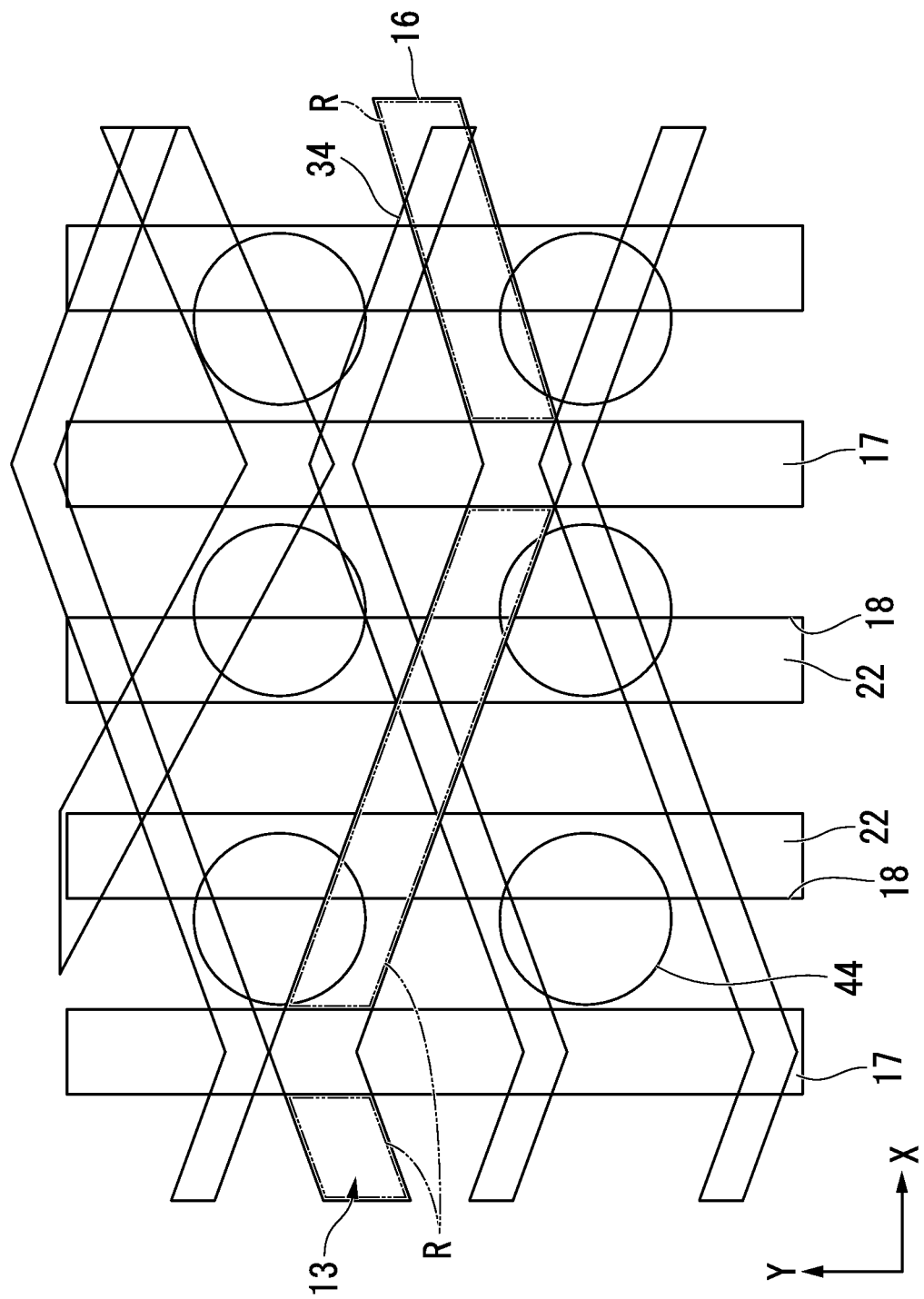
FIG. 25 is a fragmentary plan view of another layout of a memory cell array applicable to the semiconductor devices in accordance with the embodiments of the present invention.

In FIG. 25 constituent elements that are the same as in the structure shown in FIG. 1 are assigned the same reference symbols.

The semiconductor devices 10, 60, 80, and 90 described with regard to the first and second embodiments can be applied also to the zig-zag shaped layout of the active regions 16 and the bit lines 34 shown in FIG. 25.

The present embodiments can be applied to a semiconductor device and to a method for manufacturing the semiconductor device.

As used herein, the following directional terms "forward, rearward, above, downward, vertical, horizontal, below, and transverse" as well as any other similar directional terms refer to those directions of an apparatus equipped with the present embodiments. Accordingly, these terms, as utilized to describe the present embodiment should be interpreted relative to an apparatus equipped with the present embodiment.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a semiconductor substrate of having a first gate groove having first and second sides opposite to each other;
a first diffusion region in the semiconductor substrate underneath the first gate groove;
a second diffusion region in the semiconductor substrate, the second diffusion region covering an upper portion of the first side of the first gate groove; and
a third diffusion region in the semiconductor substrate, the third diffusion region covering the second side of the first gate groove, the third diffusion region being continuous to the first diffusion region and separated from the second diffusion region so that a lower portion of the first side of the first gate groove serves as a first channel region, the third diffusion region having a bottom which is deeper than a bottom of the first gate groove, and the bottom of the third diffusion region being different in level from the bottom of the first diffusion region,
wherein each of the semiconductor substrate and the first channel region is of a first conductivity type and each of the first, second, and third diffusion regions is of a second conductivity type so that each of the first and third diffusion regions forms a PN junction with the semiconductor substrate and each of the second diffusion region and first diffusion region forms a PN junction with the first channel region.

2. The semiconductor device according to claim 1, wherein the bottom of the first diffusion region is deeper than the bottom of the third diffusion region.

3. The semiconductor device according to claim 1, wherein the bottom of the first diffusion region is shallower than the bottom of the third diffusion region.

4. The semiconductor device according to claim 1, wherein the first diffusion region includes a first side diffusion portion which extends along a lower portion of the first side of the first groove, the first side diffusion portion is separate from the second diffusion region.

5. The semiconductor device according to claim 1, further comprising:
a first gate insulator covering inside walls of the first gate groove;
a first gate electrode in a lower portion of the first gate groove and on the first gate insulator; and a first buried insulator filling an upper portion of the first gate groove, and being positioned over the first gate electrode.

6. The semiconductor device according to claim 1, wherein the semiconductor substrate has a second gate groove having third and fourth sides opposite to each other, and
the third diffusion region is disposed between the first and second gate grooves.

7. The semiconductor device according to claim 6, further comprising:
a fourth diffusion region in the semiconductor substrate underneath the second gate groove; and
a fifth diffusion region in the semiconductor substrate, the fifth diffusion region covering an upper portion of the fourth side of the second gate groove,
wherein the third diffusion region covers the third side of the second gate groove, the third diffusion region is continuous to the fourth diffusion region and separated from the fifth diffusion region so that a lower portion of the fourth side of the second gate groove serves as a second channel region, the bottom of the third diffusion region is deeper than a bottom of the second gate groove, the bottom of the third diffusion region is different in level from a bottom of the fourth diffusion region and each of the semiconductor substrate and the second channel region is of a first conductivity type and each of the third, fourth and fifth diffusion regions is of a second conductivity type so that each of the fourth and third diffusion regions forms a PN junction with the semiconductor substrate and each of the fifth diffusion region and fourth diffusion region forms a PN junction with the second channel region.

8. The semiconductor device according to claim 7, wherein the bottom of the fourth diffusion region is deeper than the bottom of the third diffusion region.

9. The semiconductor device according to claim 7, wherein the bottom of the fourth diffusion region is shallower than the bottom of the third diffusion region.

10. The semiconductor device according to claim 7, wherein the fourth diffusion region includes a second side diffusion portion which extends along a lower portion of the fourth side of the second gate groove, the second side diffusion portion is separate from the fifth diffusion region.

11. The semiconductor device according to claim 6, further comprising:
a second gate insulator covering inside surfaces of the second gate groove;
a second gate electrode in a lower portion of the second gate groove and on the second gate insulator; and
a second buried insulator filling an upper portion of the second gate groove and being positioned over the second gate electrode.

12. The semiconductor device according to claim 1, further comprising:
a plurality of first isolation regions in the semiconductor substrate, each of the first isolation region extending to a first direction, at least two first isolation regions defining an active region so that the active region is disposed between the first isolation regions; and
a plurality of second isolation regions in the semiconductor substrate, each of the second isolation region extending to the second direction intersecting the first direction, at least two second isolation regions defining a device formation region of the active region so that the device formation region is disposed between the second isolation regions.

13. The semiconductor device according to claim 12, wherein bottoms of the first and third diffusion regions are shallower than bottoms of the first and second isolation regions.

14. The semiconductor device according to claim 12, wherein the first and second isolation regions comprise an insulator filling first and second isolation grooves in the semiconductor substrate.

15. The semiconductor device according to claim 12, wherein the first and second isolation regions comprise:
an insulator filing a first isolation groove and partially filling a lower portion of a second isolation groove;
an insulating layer covering inside walls of an upper portions of the second isolation groove; and
a conductor being formed in an upper portion of the second isolation groove with the insulating layer therebetween.

16. The semiconductor device according to claim 1, further comprising:
a bit line coupled to the third diffusion region;
a contact plug coupled to the second diffusion region; and
a capacitor coupled to the contact plug.

17. A semiconductor device comprising:
a semiconductor substrate of having a first gate groove having first and second sides opposite to each other;
a first diffusion region in the semiconductor substrate, the first diffusion region covering an upper portion of the first side of the first gate groove; and
a second diffusion region in the semiconductor substrate, the second diffusion region continuously extending from an upper portion of the second side to a bottom of the first side to cover at least the second side and a bottom of the first gate groove, the second diffusion region being separated from the first diffusion region so that a lower portion of the first side of the first gate groove serves as a first channel region,
wherein each of the semiconductor substrate and the first channel region is of a first conductivity type and each of the first and second diffusion regions is of a second conductivity type so that the second diffusion regions forms a PN junction with the semiconductor substrate and each of the first diffusion region and second diffusion region forms a PN junction with the first channel region.

18. The semiconductor device according to claim 17, wherein the second diffusion region includes a first side diffusion portion which extends along a lower portion of the first side of the first gate groove, the first side diffusion portion is separate from the first diffusion region.

19. The semiconductor device according to claim 18, further comprising:
a second gate groove having third and fourth sides opposite to each other; and
a third diffusion region in the semiconductor substrate, the third diffusion region covering an upper portion of the fourth side of the second gate groove,
wherein the second diffusion region is disposed between the first and second gate grooves, the second diffusion region continuously extends from an upper portion of the third side to a bottom of the fourth side to cover at least the third side and a bottom of the second gate groove, the second diffusion region is separated from the third diffusion region so that a lower portion of the fourth side of the second gate groove serves as a second channel region, and each of the semiconductor substrate and the second channel region is of a first conductivity type and each of the second and third diffusion regions is of a second conductivity type so that each of the third diffusion region and second diffusion region forms a PN junction with the second channel region.

20. The semiconductor device according to claim 19, wherein the second diffusion region includes a second side diffusion portion which extends along a lower portion of the fourth side of the second gate groove, and the second side diffusion portion is separate from the third diffusion region.

* * * * *